United States Patent [19]
Ueda

[11] Patent Number: 6,122,009
[45] Date of Patent: Sep. 19, 2000

[54] IMAGE PICKUP APPARATUS FABRICATION METHOD THEREOF IMAGE PICKUP ADAPTOR APPARATUS SIGNAL PROCESSING APPARATUS SIGNAL PROCESSING METHOD THEREOF INFORMATION PROCESSING APPARATUS AND INFORMATION PROCESSING METHOD

[75] Inventor: Kazuhiko Ueda, Kanagawa, Japan

[73] Assignee: Sony Corporation, Tokyo, Japan

[21] Appl. No.: 08/765,196

[22] PCT Filed: May 30, 1996

[86] PCT No.: PCT/JP96/01461

§ 371 Date: Jan. 3, 1997

§ 102(e) Date: Jan. 3, 1997

[87] PCT Pub. No.: WO96/38980

PCT Pub. Date: Dec. 5, 1996

[30] Foreign Application Priority Data

May 31, 1995 [JP] Japan .................................. 7-133763
Feb. 15, 1996 [JP] Japan .................................. 8-027548

[51] Int. Cl.$^7$ .................................................. H04N 5/225
[52] U.S. Cl. .......................... 348/335; 348/373; 348/374
[58] Field of Search .................................. 359/362, 363, 359/637, 820, 64; 348/340, 373, 374, 376, 552

[56] References Cited

U.S. PATENT DOCUMENTS 4,896,217  1/1990  Miyazawa et al. ..................... 340/340
5,463,496  10/1995  Ise ............................................ 359/497
5,568,197  10/1996  Hamano .................................. 348/342
5,570,145  10/1996  Soneda .................................... 396/547
5,576,895  11/1996  Ikeda ........................................ 359/811
5,673,083  9/1997  Izumi et al. ............................ 348/340
5,710,667  1/1998  Goto ........................................ 359/569
5,754,227  5/1998  Fukuoka .................................. 348/232

FOREIGN PATENT DOCUMENTS 60-74879    4/1985   Japan .
61-134186   6/1986   Japan .
61-134187   6/1986   Japan .
62-42558    2/1987   Japan .
63-313858   12/1988  Japan .
2-106847    8/1990   Japan .
5-500147    1/1993   Japan .
7-121147    5/1995   Japan .
8-9215      1/1996   Japan .

*Primary Examiner*—Wendy Garber
*Assistant Examiner*—Mitchell White
*Attorney, Agent, or Firm*—Ronald P. Kananen; Rader, Fishman & Grauer

[57] ABSTRACT

A CCD bare chip 12 is disposed on a substrate 1. The CCD bare chip 12 converts condensed light by an image forming lens 4 disposed on a holder 2 into an electric signal and outputs an image signal. The image forming lens 4 is disposed on the holder 2. A housing of the holder 2 is a package 2A that has a diaphragm effect for shielding peripheral rays of light and that shield outer light. The package 2A has a circular hole 3 for allowing light emitted from an object to be entered. The holder 2 is disposed on the substrate 1. In such a structure, an image pickup apparatus is accomplished.

26 Claims, 36 Drawing Sheets

4 IMAGE FORMING LENS

→ INTENSITY

4 IMAGE FORMING LENS

→ INTENSITY

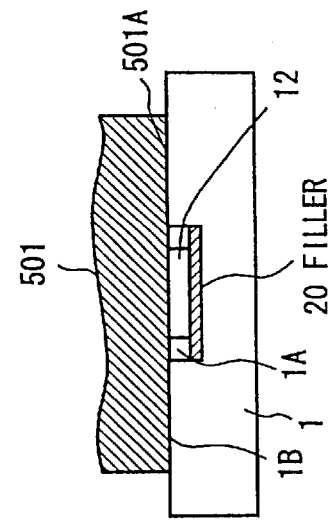
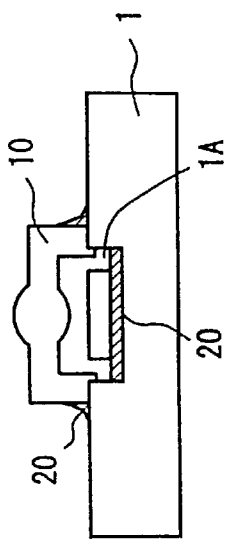
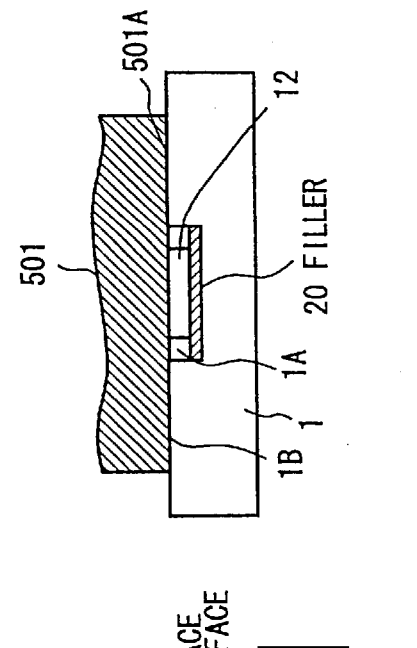
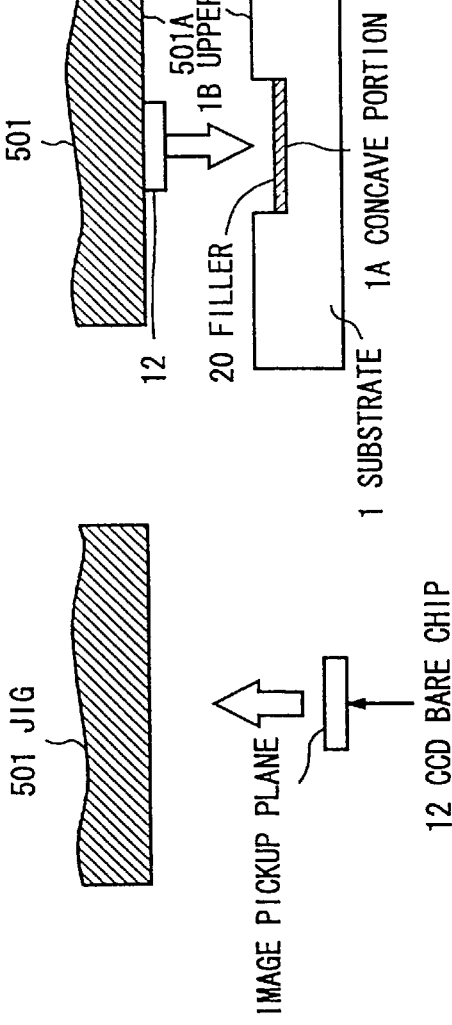
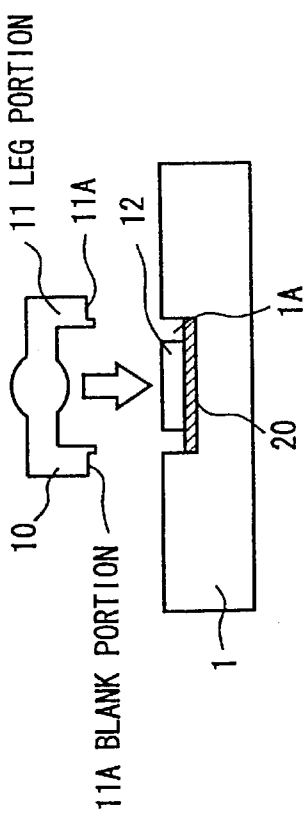

IMAGE PICKUP APPARATUS 100

IMAGE PICKUP APPARATUS FABRICATION METHOD THEREOF IMAGE PICKUP ADAPTOR APPARATUS SIGNAL PROCESSING APPARATUS SIGNAL PROCESSING METHOD THEREOF INFORMATION PROCESSING APPARATUS AND INFORMATION PROCESSING METHOD

TECHNICAL FIELD

The present invention relates to an image pickup apparatus, a fabrication method thereof, an image pickup adaptor apparatus, a signal processing apparatus, a signal processing method thereof, an information processing apparatus, and an information processing method. In particular, the present invention relates to an image pickup apparatus that allows the size, weight, and cost of for example a video camera for capturing an image to be reduced, a fabrication method thereof, an image pickup adaptor apparatus thereof, a signal processing apparatus thereof, a signal processing method thereof, an information processing apparatus, and an information processing method.

BACKGROUND ART

FIG. 1 is a schematic diagram showing a structure of a conventional video camera. The video camera is composed of a lens module 101 and a camera main body 111. The lens module 101 is composed of an image forming lens 102 and an iris adjusting mechanism 103. The image forming lens 102 includes a focus lens 104. The camera main body 111 is composed of an optical LPF (low pass filter) 112, an image sensor 113, and a camera processing circuit 114.

Light of an object is entered into the image forming lens 102 and emitted to the image sensor 113 through the iris adjusting mechanism 103 and the optical LPF 112. Thus, an image of the object is formed on a light receiving plane of the image sensor 113. The image sensor 113 is composed of for example a charge coupled device (hereinafter abbreviated as CCD). The image sensor 113 photoelectrically converts the image of the object received on the light receiving plane into an electric signal. The resultant electric signal corresponding to the image of the object is supplied to the camera processing circuit 114. The camera processing circuit 114 performs a predetermined signal process for the image signal received from the image sensor 113. Thereafter, the image signal is recorded on a record medium such as a video tape. Alternatively, the image signal may be output to for example a monitor and displayed thereon. In addition, the image signal may be supplied to a computer so as to perform a predetermined process for the image signal.

The image sensor 113 receives a drive signal from the camera processing circuit 114. The image sensor 113 performs a predetermined process such as an image signal output process corresponding to the drive signal. The iris adjusting mechanism 103 adjusts the brightness of the image formed on the image sensor 113. In addition, the iris adjusting mechanism 103 shields unnecessary peripheral rays that are emitted from the image forming lens 102. The focus lens 104 adjusts the focus of the image formed on the image sensor 113. The optical LPF 112 is an optical device whose refractive index varies depending on the plane of polarization of the entered light. The optical LPF 112 is composed of for example a rock crystal with optical anisotropy. The optical LPF 112 limits high spatial frequency components of light emitted from the focus lens 104 so as to decrease loop-back distortion that takes place in the image sensor 113.

When a video camera is used as an image capturing device for a computer, a car monitoring device, a TV telephone, a TV conference system, and so forth, high image quality is not strictly required. In other words, in these applications, easy mounting and handling of the video camera are more important than high image quality.

However, to easily mount and handle the video camera, it should be optically adjusted in the fabrication stage. Thus, in addition to complicated fabrication steps of the video camera, the size and cost thereof increase.

In addition, the conventional video camera limits the optical spatial frequencies of light entered into the image sensor 113. Thus, as shown in FIG. 1, the optical LPF 112 is required. The thickness d of the optical LPF 112 should be proportional to the pitches of pixels of the image sensor 113. Consequently, when the pitches of pixels of the image sensor 113 are small, the cost thereof increases. When the pitches of pixels of the image sensor 113 are large, the thickness d of the optical LPF 112 becomes large.

As a small, low-cost video camera, a structure as shown in FIG. 2 is known. In this example, a CCD image pickup device 403 is secured on a substrate 404. In addition, one image forming lens 401 is secured to a lens barrel 402. The lens barrel 402 is secured to the substrate 404. Various parts 405 are mounted on the rear surface of the substrate 404.

In FIG. 2, the structure of a light amount adjusting mechanism and so forth is omitted.

The CCD image pickup device 403 is structured as shown in FIG. 3. In other words, the CCD image pickup device 403 has a CCD bare chip 403A that converts the entered light into an electric signal. The CCD bare chip 403A has color filters (not shown) that pass rays with predetermined wavelengths of R, G, and B (or complementary colors thereof). The CCD bare chip 403A is housed in a package 403B composed of plastics or the like. A cover glass 403C is disposed at the top of the package 403B.

However, in the structure shown in FIG. 2, the distance from the upper edge of the image forming lens 401 to the upper surface of the CCD image pickup device 403 is around 30 mm. The thickness of the CCD image pickup device 403 is 5 mm. The distance from the upper surface of the substrate 404 to the lower edge of the part 405 is around 15 mm. Thus, the total thickness becomes around 50 mm.

Thus, the structure as shown in FIG. 2 cannot be mounted to for example a PC card for use with a portable personal computer or the like.

DISCLOSURE OF THE INVENTION

The present invention is made from the above-described point of view. An object of the present invention is to provide an apparatus that can be easily mounted and handled and whose weight and cost can be reduced.

An image pickup apparatus according to claim 1 of the present invention comprises an outer holder having at least one image forming lens for condensing light and having a diaphragm function for shielding peripheral rays of light and outer light and a substrate having a photoelectric converting device for converting the condensed light into an electric signal and for outputting an image signal, wherein the holder and the substrate are integrally formed.

A fabrication method for an image pickup apparatus according to claim 15 of the present invention comprises the steps of disposing a photoelectric converting device for converting entered light into an electric signal and outputting an image signal, forming a portion for insulating peripheral rays of light against the image forming lens on the photoelectric converting device, and integrally forming the image forming lens and the substrate.

An image pickup apparatus according to claim 16 of the present invention comprises an image forming lens for condensing light and a substrate having a photoelectric converting device for converting the condensed light of the image forming lens into an electric signal and outputting an image signal, wherein the pitches of effective pixels of the photoelectric converting device are set to a value larger than 1/(200 F) of the effective image pickup region, where F is the F number defined by the diameter D of the image forming lens and the focal length f.

An image pickup apparatus according to claim 17 of the present invention comprises an image forming lens for condensing light and a photoelectric converting device for converting the condensed light of the image forming lens into an electric signal and outputting an image signal, wherein part of the image forming lens directly contacts the photoelectric converting device.

An image pickup apparatus according to claim 21 of the present invention comprises a photographic converting device for converting light entered into a light receiving plane into an electric signal and outputting an image signal and an A/D converter for converting the image signal that is output from the photoelectric converting device as analog signal into a digital signal, wherein the photoelectric converting device and the A/D converter are housed in a package.

A signal processing apparatus for processing digital image data converted from an analog image signal that is output from a charge coupled device, the analog image data being converted into the digital image signal corresponding to a clock signal with the half period of the analog image signal according to claim 26 of the present invention comprises delaying means for delaying the image data for one clock period, calculating means for calculating the difference between the image data and output data of the delaying means, and output means for outputting every second data of the difference that is output from the calculation means.

A signal processing method for processing digital image data converted from an analog image signal that is output from a charge coupled device, the analog image data being converted into the digital image signal corresponding to a clock signal with the half period of the analog image signal, according to the present invention comprises the steps of delaying the image data for one clock period, calculating the difference between the image data and image data that has been delayed for one clock period, and outputting every second data of the difference.

An image pickup adaptor apparatus according to the present invention comprises a housing detachably disposed to an information processing unit, an image pickup unit housed in the housing, wherein the image pickup unit includes an outer holder having at least one image forming lens for condensing light and having a diaphragm function for shielding peripheral rays of light and outer light, and a substrate having a photoelectric converting device for converting the condensed light into an electric signal and for outputting an image signal, the holder and the substrate being integrally formed.

An information processing apparatus having an image pickup unit housed in a housing, the image pickup unit having an outer holder having at least one image forming lens for condensing light and having a diaphragm function for shielding peripheral rays of light and outer light and a substrate having a photoelectric converting device for converting the condensed light into an electric signal and for outputting an image signal, the holder and the substrate being integrally formed, the apparatus according to the present invention comprises capturing means for capturing an image signal from the image pickup unit and processing means for processing the image signal captured by the capture means.

An information processing method for an information processing apparatus having an image pickup unit housed in a housing, the image pickup unit having an outer holder having at least one image forming lens for condensing light and having a diaphragm function for shielding peripheral rays of light and outer light and a substrate having a photoelectric converting device for converting the condensed light into an electric signal and for outputting an image signal, the holder and the substrate being integrally formed, the method according to the present invention comprises the steps of capturing an image signal from the image pickup unit and processing the image signal being captured.

An image pickup apparatus according to claim 1 comprises an outer holder having at least one image forming lens for condensing light and having a diaphragm function for shielding peripheral rays of light and outer light and a substrate having a photoelectric converting device for converting the condensed light into an electric signal and for outputting an image signal, wherein the holder and the substrate are integrally formed.

A fabrication method for an image pickup apparatus comprises the steps of disposing a photoelectric converting device for converting entered light into an electric signal and outputting an image signal, forming a portion for insulating peripheral rays of light against the image forming lens on the photoelectric converting device, and integrally forming the image forming lens and the substrate.

In an image pickup apparatus, the pitches of effective pixels of the photoelectric converting device are set to a value larger than 1/(200 F) of the effective image pickup region.

An image pickup apparatus comprises an image forming lens for condensing light and a photoelectric converting device for converting the condensed light of the image forming lens into an electric signal and outputting an image signal, wherein part of the image forming lens directly contacts the photoelectric converting device.

An image pickup apparatus comprises a photographic converting device for converting light entered into a light receiving plane into an electric signal and outputting an image signal, and an A/D converter for converting the image signal that is output from the photoelectric converting device as analog signal into a digital signal, wherein the photoelectric converting device and the A/D converter are housed in a package.

In a signal processing apparatus and a signal processing method the image data is delayed for one clock period. The difference between the image data and image data being delayed is calculated. Every second data of the difference is output.

In an image pickup adaptor apparatus, an image pickup apparatus is housed in a housing. In the image pickup apparatus, a holder having an image forming lens and a holder with a diaphragm is integrally formed with a substrate having a photoelectric converting device.

In an information processing apparatus and an information processing method, an image signal is captured from an image pickup unit of a image pickup adapter unit and processed.

BRIEF DESCRIPTION OF DRAWINGS

FIG. 12, comprising

FIG. 33, comprising

FIG. 35, comprising FIGS. 35A to 35E is a schematic diagram showing assembling steps of the embodiment shown in FIG. 34;

FIGS. 49A to 49J, is a timing chart for explaining the operation of the video camera shown in FIG. 48;

BEST MODES FOR CARRYING OUT THE INVENTION

Next, with reference to the accompanying drawings, embodiments of the present invention will be described.

[First Embodiment]

Figure 4:
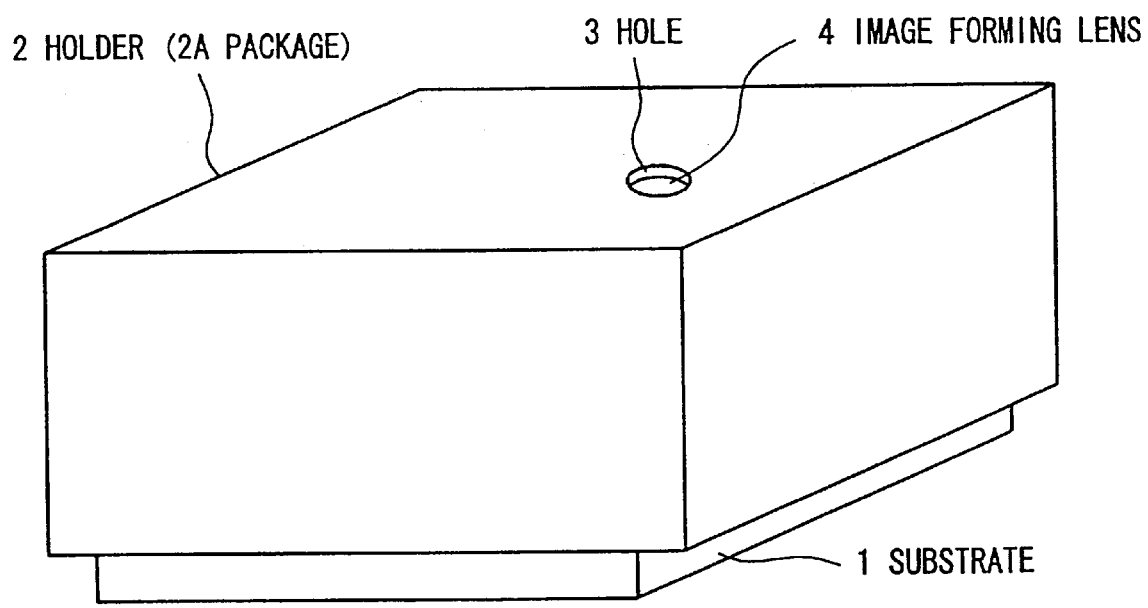
FIG. 4 is a perspective view showing the structure of an image pickup apparatus according to an embodiment of the present invention.

FIG. 4 is a perspective view showing the structure of an image pickup apparatus according to a first embodiment of the present invention. In the image pickup apparatus, a holder 2 is mounted (fitted) to a substrate 1. Thus, the holder 2 and the substrate 1 are integrally formed.

As will be described with reference to FIG. 6, a photoelectric converting device such as a CCD bare chip 12 is disposed on the substrate 1. The CCD bare chip 12 converts light formed by an image forming lens 4 disposed on the holder 2 into an electric signal as an image signal. The holder 2 has one image forming lens 4 that causes light to be formed as an image. The housing of the holder 2 is a package 2A that has a diaphragm effect for shielding peripheral light and outer light against the image forming lens 4. The package 2A has a circular hole (diaphragm) 3 that allows light emitted from an object to enter. In this embodiment, the hole 3 is disposed nearly at the center on the upper surface of the package 2A. The hole 3 functions as a fixed iris.

Figure 5:
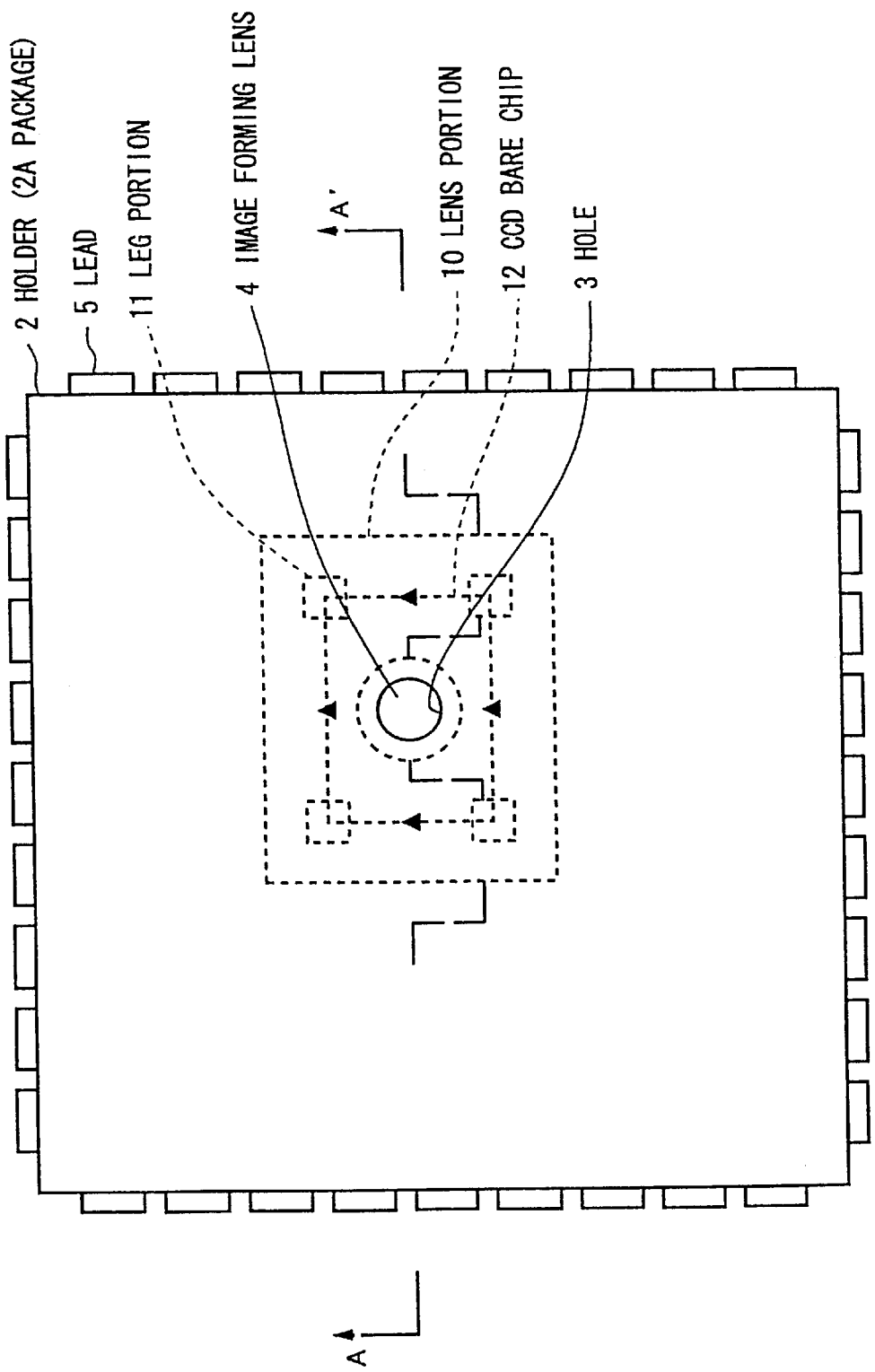
FIG. 5 is a plan view showing the image pickup apparatus shown in FIG. 4.

FIG. 5 is a plan view showing the image pickup apparatus shown in FIG. 4. FIG. 6 is a sectional view taken along line A–A' of FIG. 5. As described above, the CCD bare chip 12 is disposed on the substrate 1. In addition, a driver 13, an A/D converter 14, and other necessary chips are disposed on the substrate 1. The driver 13 drives the CCD bare chip 12. The A/D converter 14 converts the output signal of the CCD bare chip 12 into a digital signal. (The details about the devices disposed on the substrate 1 will be described later with reference to FIG. 21.) The CCD bare chip 12 is disposed in such a manner that when the holder 2 is mounted on the substrate 1, the CCD bare chip 12 faces the hole 3 formed on the holder 2. However, in the case that the position of the CCD bare chip 12 is restricted by the structure of the substrate 1, after the position of the CCD bare chip 12 is determined, the hole 3 may be formed at the position where the CCD bare chip 12 faces the hole 3.

Leads 5 are disposed on the side surfaces of the substrate 1. The leads 5 output or input signals to/from the outside of the substrate 1. For example, the leads 5 are used to output an image signal that has been output from the CCD bare chip 12 and processed in a predetermined manner and to supply powers to individual chips on the substrate 1. In FIG. 4, the leads 5 are now shown. When necessary, individual chips disposed on the substrate 1 are connected to connection wires. FIG. 6 shows only a connection wire 13A that extends from the driver 13. However, for simplicity, other connection wires that extend from other chips are omitted.

Figure 7:
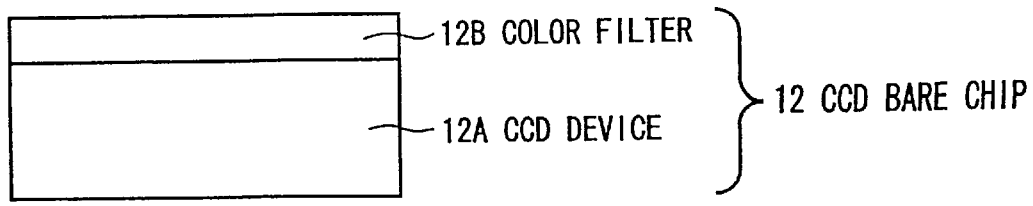
FIG. 7 is a schematic diagram showing an example of the structure of a CCD bare chip 12 shown in FIG. 6.

FIG. 7 shows an example of the structure of the CCD bare chip 12. In this embodiment, the CCD bare chip 12 is composed of a CCD device (charge coupled device) 12A and a color filter 12B. The CCD device 12A outputs an electric signal corresponding to light being entered. The color filter 12B is disposed on the CCD device 12A. The color filter 12B passes light with predetermined wavelengths such as R, G, and B (or complementary colors thereof). Occasionally, the color filter 12B may be omitted.

Figure 3:
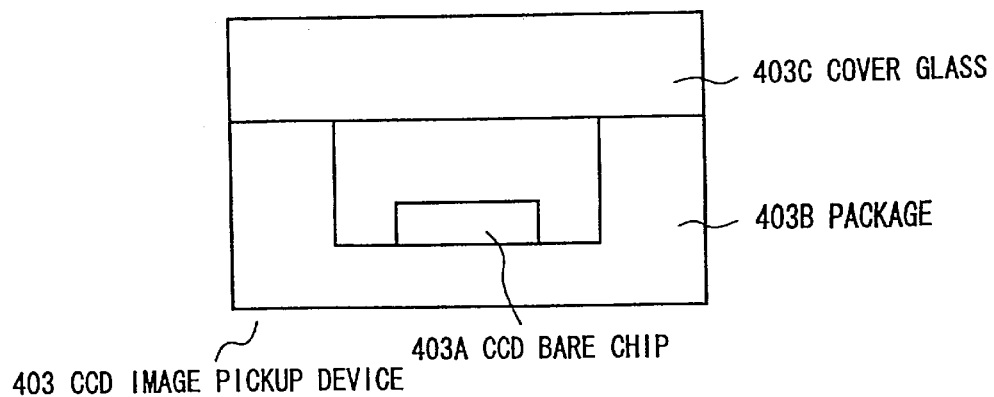
FIG. 3 is a schematic diagram showing an example of the structure of a CCD image pickup device shown in FIG. 2.

As is clear from the comparison of the CCD bare chip shown in FIG. 7 and the CCD image pickup device 403 shown in FIG. 3, in the CCD bare chip 12 shown in FIG. 7, the package 403B composed of ceramics or plastics shown in FIG. 3 is omitted. Thus, the size of the CCD bare chip 12 shown in FIG. 7 is smaller than the size of the CCD image pickup device 403 shown in FIG. 3.

Figure 8:
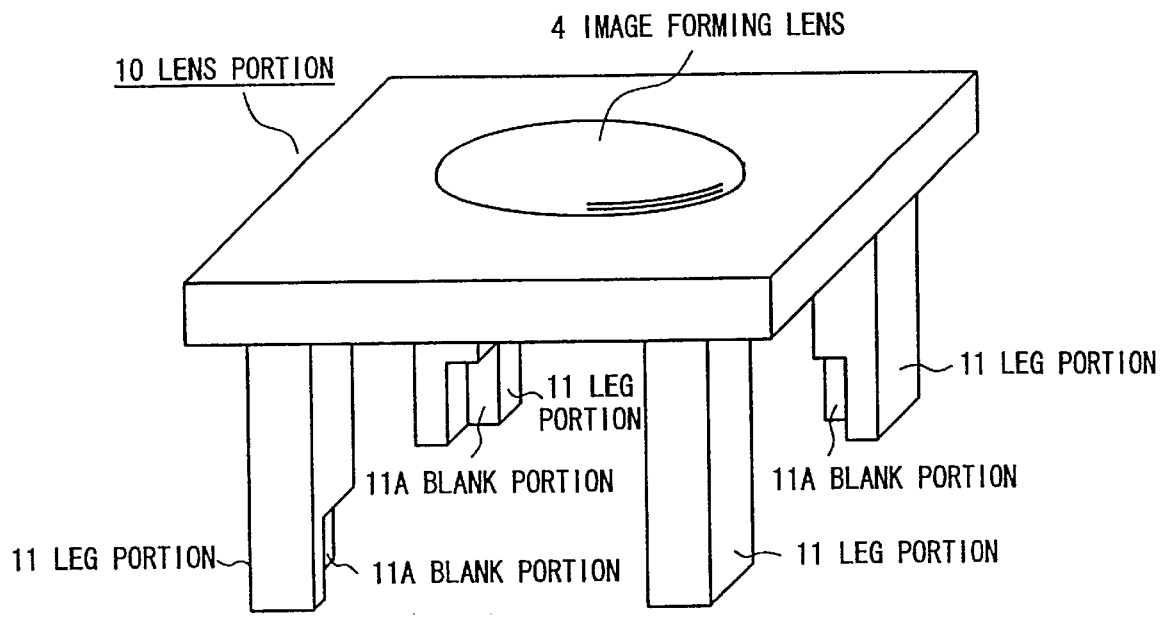
FIG. 8 is a perspective view showing the structure of a lens portion 10.

The image forming leans 4 and leg portions 11 compose a lens portion 10. FIG. 8 is a perspective view showing the structure of the lens portion 10 in detail. The lens portions 10 are composed of a transparent material such as transparent plastics (for example, PMMA) and formed in a table shape having a flat plate and four legs. In other words, an image forming lens 4 as a single element lens is disposed at the center portion of the flat plate. Four prism shaped leg portions 11 are disposed at four corners of the flat plate in such a manner that the leg portions 11 extend in parallel with the optical axis of the image forming lens 4. The horizontal section of each of the leg portions 11 is rectangular. Lower angular portions of the leg portions 11 that face the optical axis of the image forming lens 4 are blanked in a prism shape. Thus, blank portions 11A are formed. Two of four side surfaces of each of the four leg portions 11 face the optical axis of the image forming lens 4.

The top surface (image pickup plane) of the CCD bare chip 12 is formed in for example a rectangular shape. The four blank portions 11A accurately fit the four corners of the CCD bare chip 12.

The lens portion 10 is composed by molding for example plastics (thus, the image forming lens 4 is a plastic mold single element lens). Consequently, the relative accuracy of the size of each portion of the lens portion 10 against the principal point of the image forming lens 4 is satisfactorily high.

Figure 6:
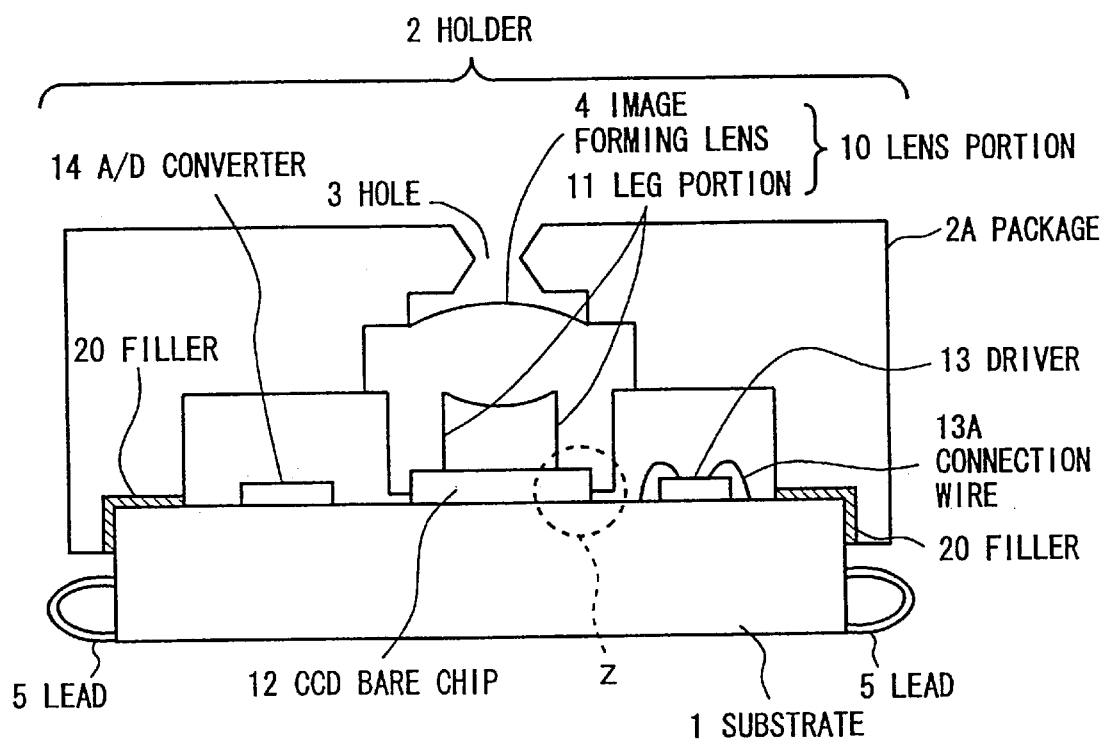
FIG. 6 is a sectional view taken along line A–A' of the image pickup apparatus shown in FIG. 5.

As shown in FIGS. 5 and 6, the lens portion 10 fits the lid shaped package 2A that composes the housing of the holder 2 in such a manner that the optical axis of the image forming lens 4 passes through the center of the hole 3. Since the blank portions 11A fit the four corners of the CCD bare chip 12, the four leg portions 11 of the lens portion 10 directly contact the CCD bare chip 12.

The package 2A, which structures the housing of the holder 2, is composed of for example polycarbonate resin as a light insulating material. The package 2A is bonded to the substrate 1 with a light insulating filler (bonding agent). Thus, the substrate 1 and the holder are integrally formed.

Figure 9:
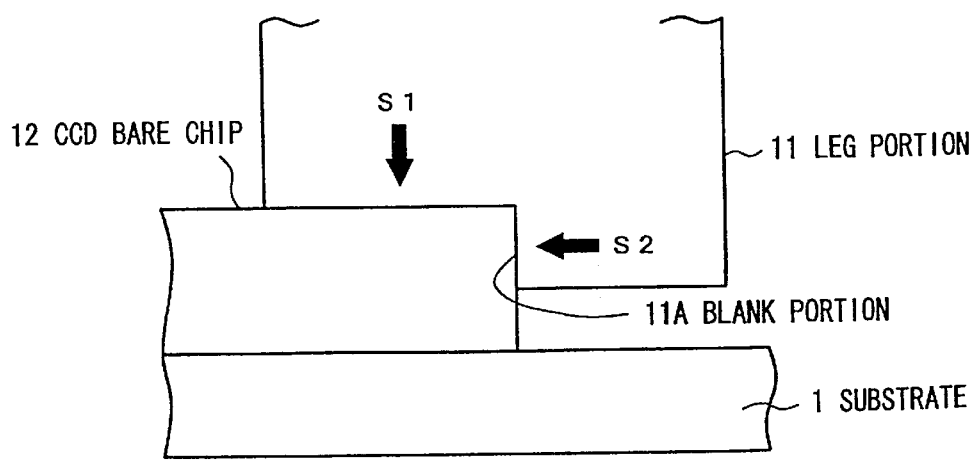
FIG. 9 is an enlarged view showing a portion denoted by Z shown in FIG. 6.

FIG. 9 is an enlarged view showing the portion of which one of the leg portions 11 contacts the CCD bare chip 12 (namely, an enlarged view of a portion Z surrounded by dotted lines of FIG. 6). As shown in FIG. 9, the lower edge of the leg portion 11 is slightly spaced apart from the substrate 1. The bottom surface and the side surfaces of the blank portion 11A directly contact the light receiving plane (denoted by S1 in FIG. 9) of the CCD bare chip 12 and the side surfaces (denoted by S2 in FIG. 9) thereof with a pressure (thus, the leg portions 1 stand on the CCD bare chip 12). This pressure takes place by fitting the holder 2 to the substrate 1 and filling the filler 20 therein.

The size of the portion of which the holder 2 is fitted to the substrate 1 is slightly larger than the outer size of the substrate 1. Thus, the substrate 1 and the holder 2 are bonded in such a manner that the accuracy with which the leg portions 11 contact the CCD bare chip 12 is improved.

As described above, since the substrate 1, on which at least the CCD bare chip 12 has been disposed, and the holder 2 as the housing (package 2A), which has the diaphragm effect, are integrally formed, when the image pickup apparatus is applied for such as a TV conference system, the optical adjustments of the image forming lens 4 and the CCD bare chip 12 are not required. Thus, the image pickup apparatus can be easily mounted and handled. Consequently, the fabrication cost of the image pickup apparatus can be decreased.

In addition, as described above, the relative accuracy of the size of each portion of the lens portion 10 against the principal point of the image forming lens 4 is satisfactorily high. Moreover, the leg portions 11 (blank portions 11A) of the lens portion 10 directly stand on the light receiving plane of the CCD bare chip 12. Thus, the image forming lens 4 is accurately disposed on the CCD bare chip 12 in such a manner that the principal point of the image forming lens 4 satisfies a predetermined relation between the positions of the principal point of the image forming lens 4 and the light receiving plane of the CCD bare chip 12. In other words, the image forming lens 4 can be accurately mounted at low cost. In this case, since the adjusting mechanism for accurately mounting the image forming lens 4 is not required, the size and weight of the image pickup apparatus can be decreased.

Figure 10:
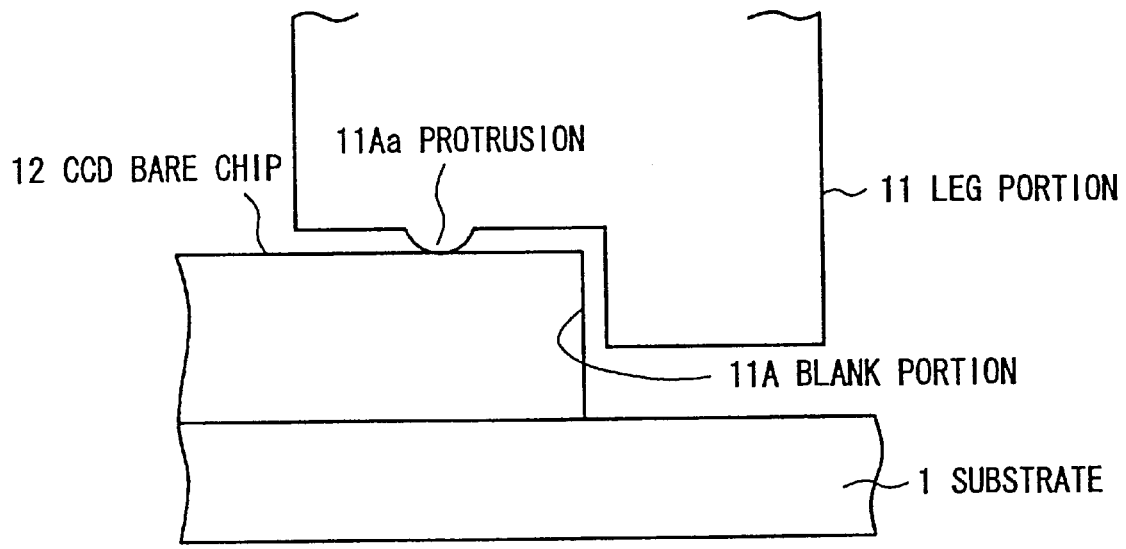
FIG. 10 is a schematic diagram showing another example of the structure of the embodiment shown in FIG. 9.

Alternatively, as shown in FIG. 10, protrusions 11A*a* may be formed on the blank portions 11A of the leg portions 11 that press the image pickup plane of the CCD bare chip 12 so that the protrusions 11A*a* press the CCD bare chip 12. When the protrusions 11A*a* are formed in a semi-sphere shape or a cylinder shape, logically, the CCD bare chip 12 point- or linear-contacts the leg portions 11. Thus, regardless of the accuracy of the surfaces of the CCD bare chip 12 and the leg portions 11, the CCD bare chip 12 can be securely pressed.

Figure 11:
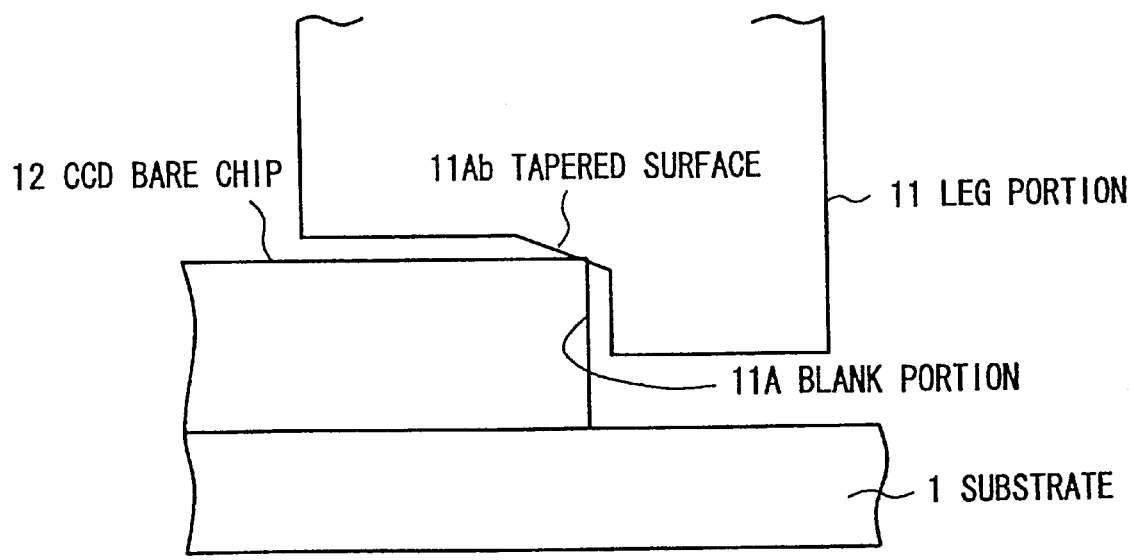
FIG. 11 is a schematic diagram showing a further other example of the structure of the embodiment shown in FIG. 9.

In addition, as shown in FIG. 11, a tapered surface 11A*b* may be formed on the blank portion 11A of each of the leg portions 11. With the tapered surface 11A*b*, the upper edge portion of the CCD bare chip 12 may be pressed. In this case, regardless of deviation of the shape of the CCD bare chip 12, it can be securely pressed.

Figure 12A:
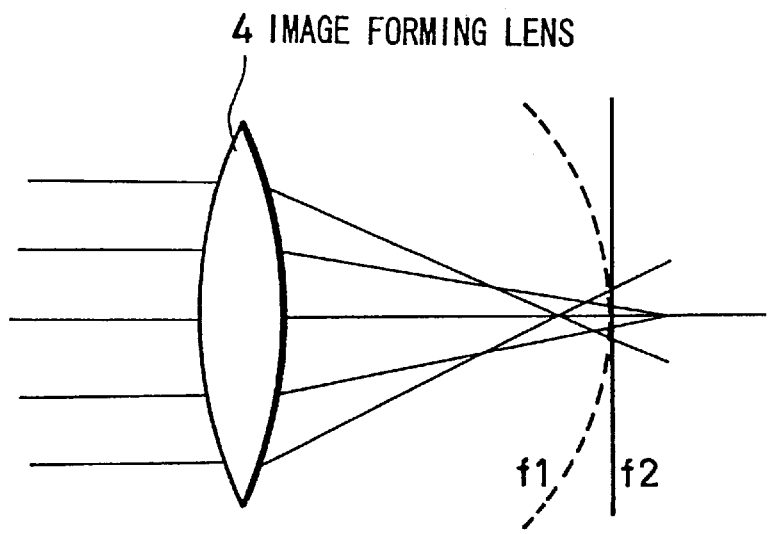
FIGS. 12A to 12D is a schematic diagram for explaining optical characteristics of an image forming lens 4 and the size (length) of a leg portion 11.

Next, with reference to FIGS. 12 and 13, the optical characteristics of the image forming lens 4 and the size (length) of the leg portions 11 will be described. As shown in FIG. 12A, an in-focus position (image formed plane) of the image forming lens 4 is curved as denoted by dotted lines. The light receiving plane (image pickup plane) of the CCD bare chip 12 is placed at a position on an ideal image plane f2 (flat plane f2 that contacts the image formed plane f1 on the optical axis of the image forming lens 4 (to satisfy this relation, the length of each of the leg portions 11 is set).

However, in this situation, although an image is focused nearly at the center of the image pickup plane (in the vicinity of the point where the image formed plane f1 contacts the ideal image plane f2), the defocus amount increases in proportion to the distance from the center of the image pickup plane (as the distance from the point where the image formed plane f1 contacts the ideal image plane f2 increases). In other words, although an image is clearly focused at the center portion on the image pickup plane, an out-of-focus image takes place on the periphery of the image pickup plane.

To solve this problem, the image forming lens 4 is designed so that the equal defocus amount is obtained on the entire image pickup plane (namely, a spherical aberration takes place on the optical axis of the image forming lens 4). Thus, as shown in FIG. 12A, light that focuses in the vicinity of the contact point of the image formed plane f1 and the ideal image plane f2 (unless the spherical aberration takes place) focuses at a farther position than the contact point. Thus, the image at the center portion of the image pickup plane becomes out-of-focus state to some extent. Consequently, an image of almost in-focus state can be obtained on the entire image pickup plane.

Figure 12B:
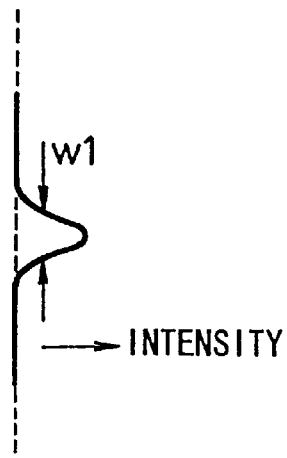
Figure 12C:
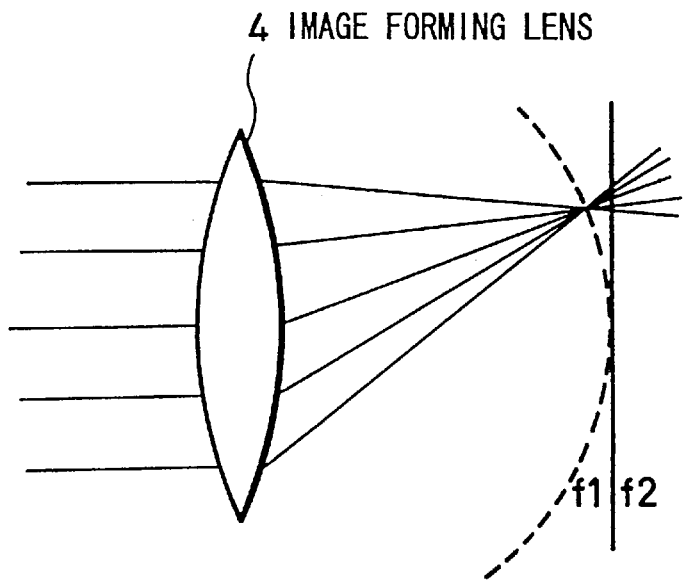
Figure 12D:
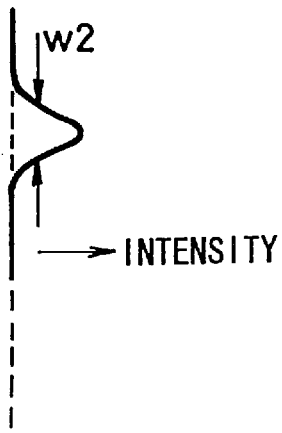

In other words, as shown in FIGS. 12B and 12D, the half value width of the emitted light of the image forming lens 4 against a point light source is constant at the center portion (see FIG. 12B) on the light receiving plane of the CCD bare chip 12 and the peripheral portion (see FIG. 12D). In addition, the half value width is larger than the pitches of pixels of the CCD bare chip 12.

FIGS. 12A and 12C show the states that parallel rays are focused at the center portion and the peripheral portion of the CCD bare chip 12, respectively. FIGS. 12B and 12D show the intensities of rays on the light receiving plane of the CCD bare chip 12 in the cases shown in FIGS. 12A and 12C (namely, rays emitted from light sources placed at infinite positions), respectively. In this embodiment, each of the half value widths w1 and w2 of the emitted light against light sources at the center portion and the peripheral portion of the CCD bare chip 12 is nearly twice the pitches of pixels of the CCD bare chip 12 (preferably, for example in the range from 1.8 times to 3 times the pitches of pixels of the CCD bare chip 12). (This applies to other positions of the light receiving plane of the CCD bare chip 12.) Thus, as the CCD bare chip 12, a low quantity type device with a total of around 170,000 pixels composed of 360 pixels wide×480 pixels high can be used.

Figure 1:
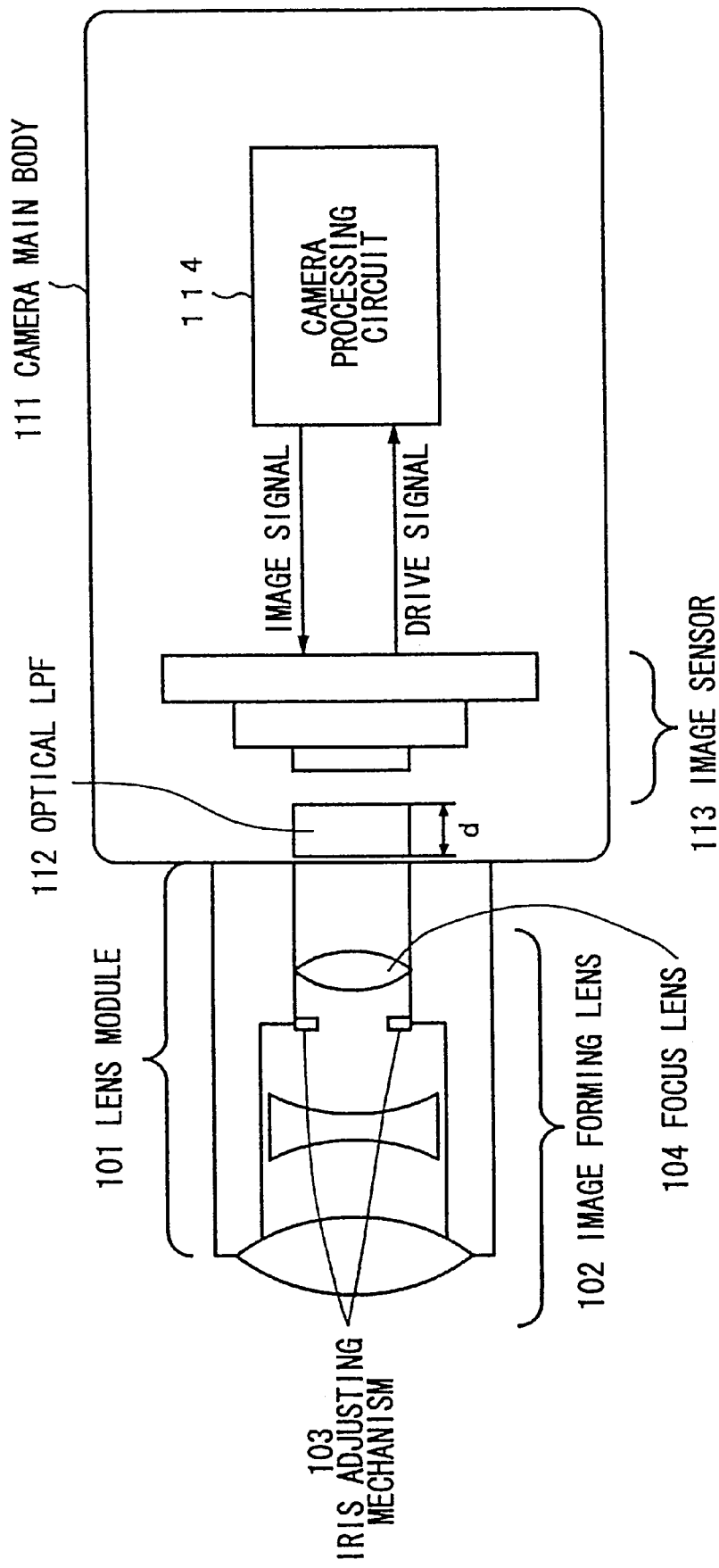
FIG. 1 is a schematic diagram showing an example of the structure of a conventional video camera.
Figure 2:
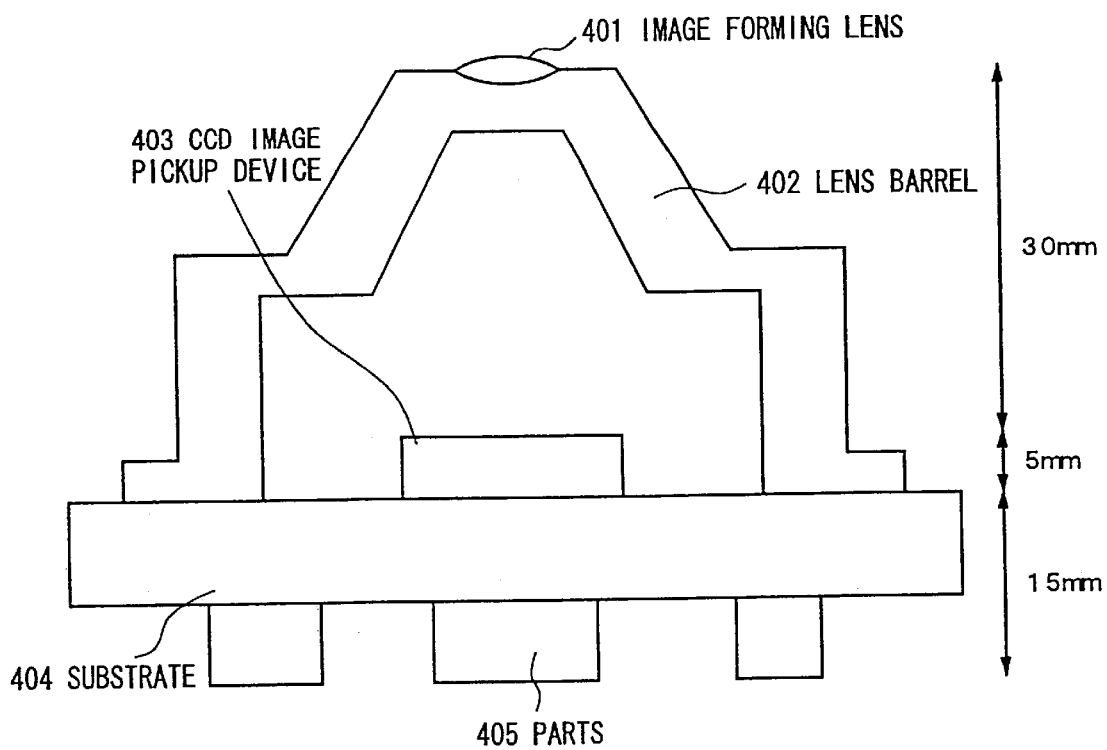
FIG. 2 is a schematic diagram showing an example of the structure of a conventional image pickup apparatus.
Figure 13:
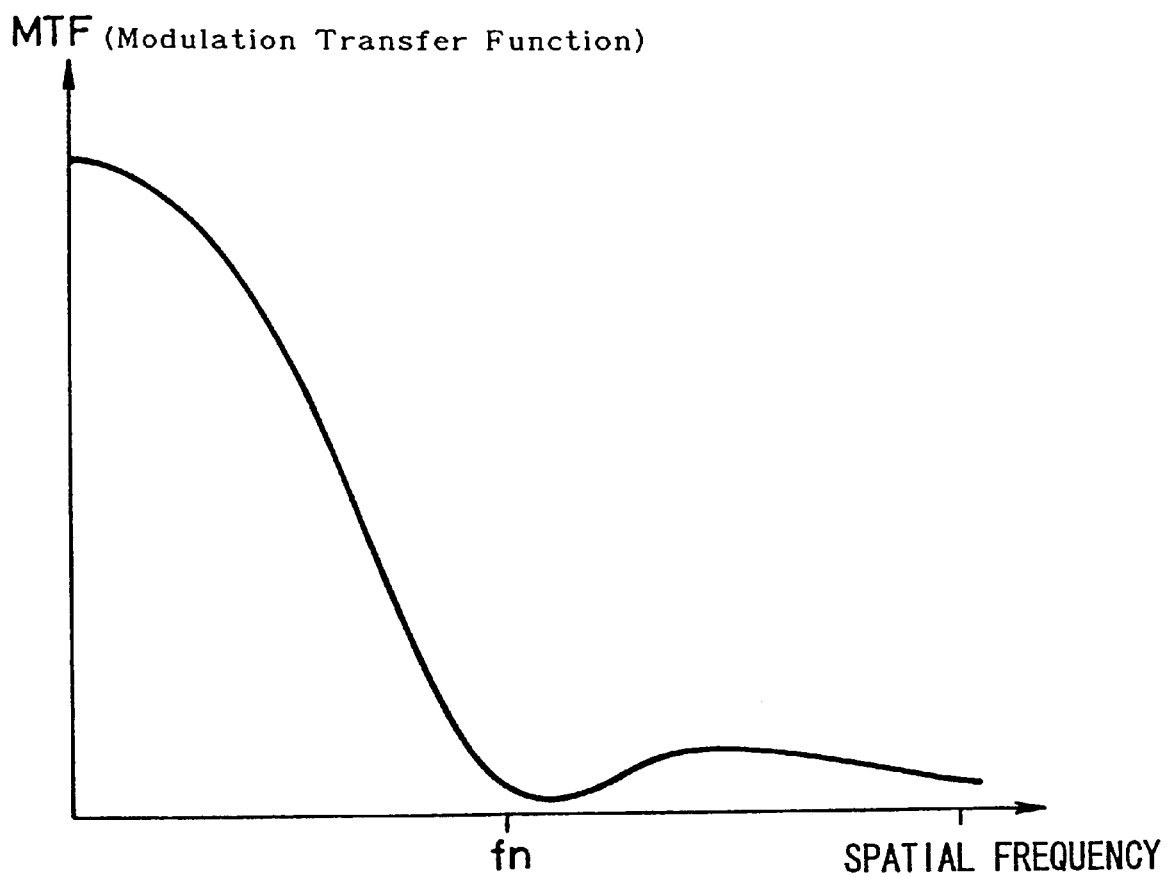
FIG. 13 is a graph showing spatial frequency response characteristics of the image forming lens 4.

When the half value width of the emitted light against the light source is twice the pitches of pixels of the CCD bare chip 12, the spatial frequency response characteristics of the image forming lens 4 allow incident components that exceed the spatial Nyquist frequency fn of the CCD bare chip 12 to be satisfactorily suppressed as shown in FIG. 13. Thus, conventionally, as described in FIG. 1, the optical LPF 112 that decreases the loop-back distortion is required. However, in the image pickup apparatus as shown in FIG. 4, the loop-back distortion can be decreased without need to provide such an optical device. Thus, the size, weight, and cost of the apparatus can be decreased.

In FIG. 12, light in the vicinity of the optical axis is focused at an outside position spaced apart from the image formed plane f1 (ideal image plane f2) of the image forming lens 4 by a predetermined distance. However, by contraries, the light may be focused at an inside position spaced apart from the image formed plane f1 (ideal image plane) of the image forming lens 4 by a predetermined distance.

In this embodiment, the focal length of the image forming lens 4 is short (for example, around 4 mm). In addition, the diameter of the hole 3, which functions as a diaphragm, is small (for example, around 1.2 mm). Thus, the depth of field of the image pickup apparatus becomes large. Even if the distance to the object varies, the defocus amount decreases. Moreover, since the image pickup apparatus does not require so-called auto focus mechanism, the size, weight, and cost of the apparatus can be decreased. When the image pickup apparatus used for a teleimage pickup apparatus, the focal length of the image forming lens 4 is increased and the diameter of the hole 3 is decreased.

Figure 14:
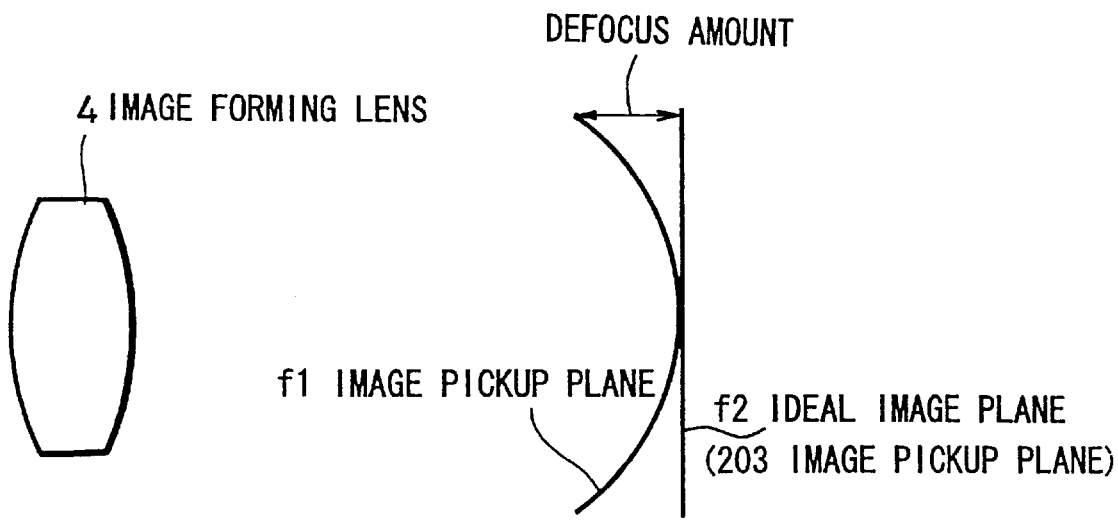
FIG. 14 is a schematic diagram for explaining the position of an image pickup plane.

The relation between the image formed plane and the image pickup plane is summarized as shown in FIG. 14. In other words, the image formed plane f1 of the image forming lens 4 is curved against the ideal image plane f2. In the embodiment, however, the image pickup plane 203 of the CCD bare chip 12 is disposed on the ideal image plane f2.

However, in such a structure, since the defocus amount at the peripheral portion of the image pickup plane 203 is larger than the defocus amount at the center portion thereof, with a spherical aberration at the center portion, the entire image on the image pickup plane 203 can be equally focused.

However, in this embodiment, the defocus amount at the peripheral portion tends to be larger than the defocus amount at the center portion.

Figure 15:
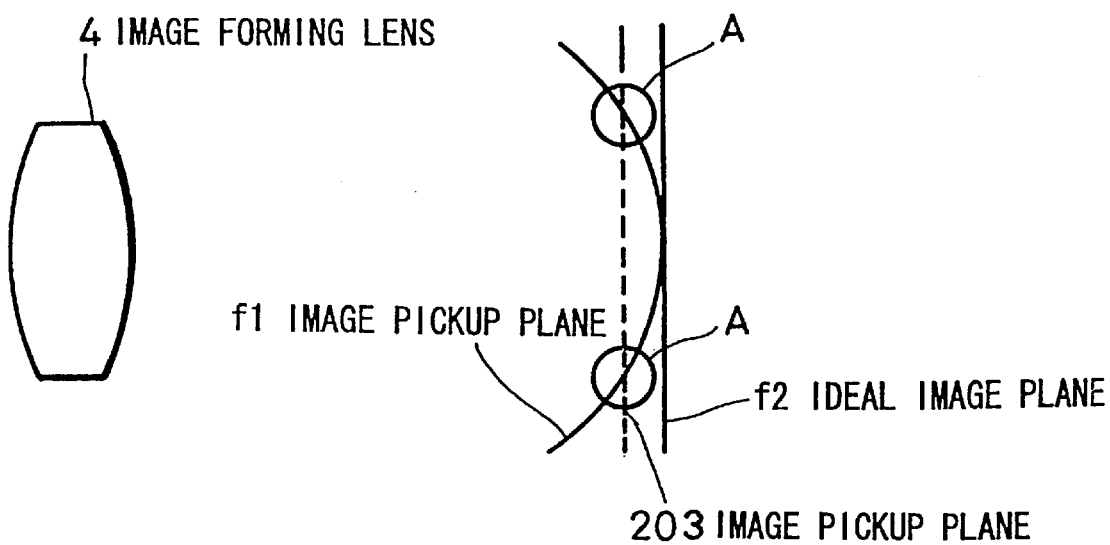
FIG. 15 is a schematic diagram showing another position of the image pickup plane.

To solve this problem, as shown in FIG. 15, the image pickup plane 203 of the CCD bare chip 12 may be disposed nearly at the center position (the center position in the horizontal direction of FIG. 15) of the image formed plane f1 of the image forming lens 4. Thus, although the direction of the defocus amount at the peripheral portion is the reverse of the direction of the defocus amount at the center portion, the absolute value of the former is almost the same as the absolute value of the latter. However, in this case, the focus state in the vicinity of the point A at which the image pickup plane 203 and the image formed plane f1 intersect is superior to the focus state at any other position. Thus, the image forming lens 4 can be designed so that much aberration takes place in the vicinity of the point A. Consequently, an image in almost equal focus state can be accomplished on the entire image pickup plane 203.

Next, with reference to FIG. 15, conditions for obtaining an image that is equal on the entire image pickup plane 203 will be described in detail.

Figure 16:
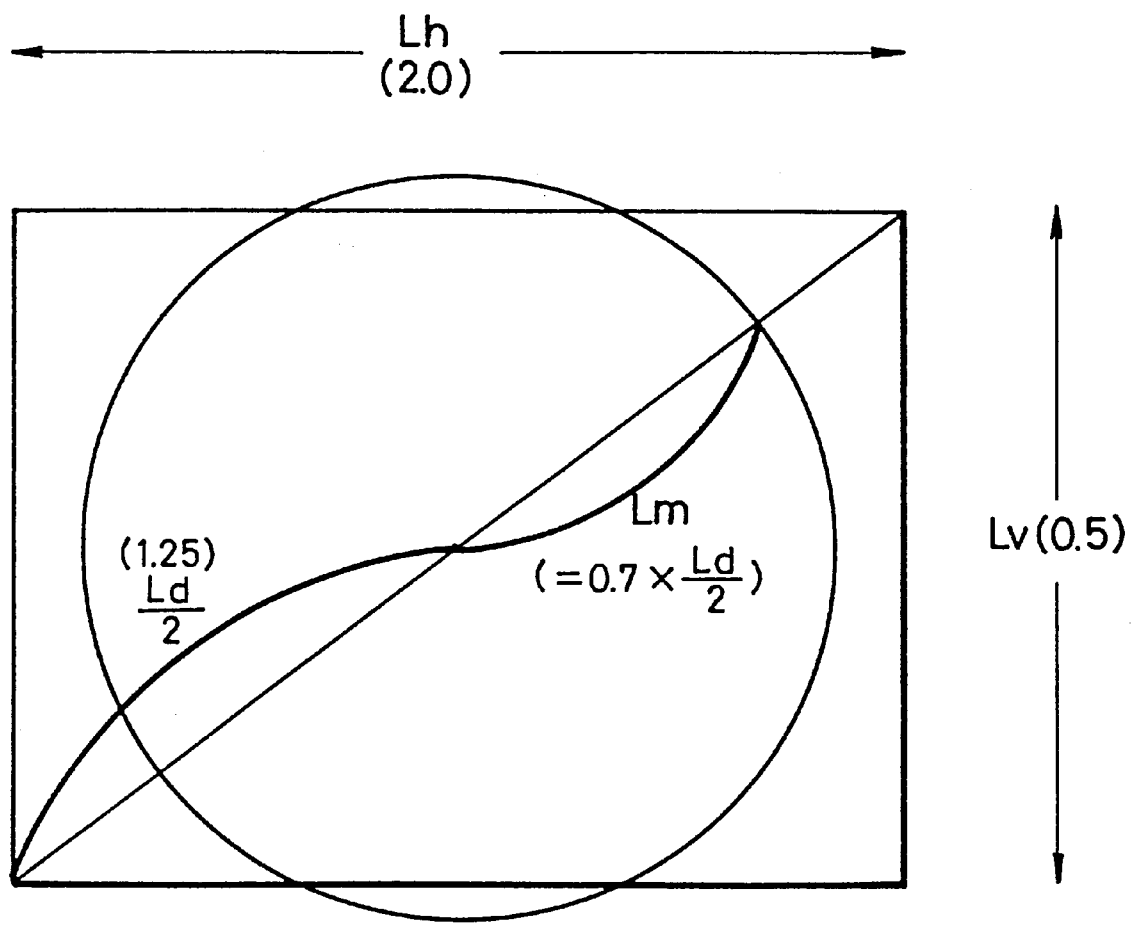
FIG. 16 is a schematic diagram for explaining a range in which an image is equalized.

As shown in FIG. 16, assuming that the horizontal length (the length of the longer side) Lh of the effective pixel region of the CCD bare chip 12 is 2.0 mm and that the vertical length (the length of the shorter side) Lv thereof is 1.5 mm, the diagonal length thereof becomes around 2.5 mm.

Assuming that the focal length f of the image forming lens 4 is 4.0 mm, the angle of view on the longer side becomes around 28 degrees as expressed by the following formula.

Angle of view on longer side=2×atan (2.0/(2×4.0))

where atan is an arc tangent.

In this case, the F number (=f/D) is 2.8 where f is the focal length of the image forming lens 4 and D is the pupil diameter.

The radius R of the curved image formed plane f1 is the inverse number of the Petzval sum P. The Petzval sum P can be expressed by the following formula.

$P=\Sigma 1/(nf)$ where n is the refractive index of the image forming lens 4.

In this case, since the number of image forming lenses 4 is one, assuming that the refractive index n is 1.5, the radius R of the image plane 201 can be obtained by the following formula.

$R=1/P=n\times f=1.5\times 4.0=6.0$

Now, as shown in FIG. 16, consider that the range from the center of the effective pixel region to 70% of the half of the diagonal length Ld is equalized. The length Lm from the center of the effective pixel region to 70% of the half of the diagonal length Ld can be obtained by the following formula.

$Lm=0.7\times Ld/2=0.4375\times Lh=0.875$ mm

Figure 17:
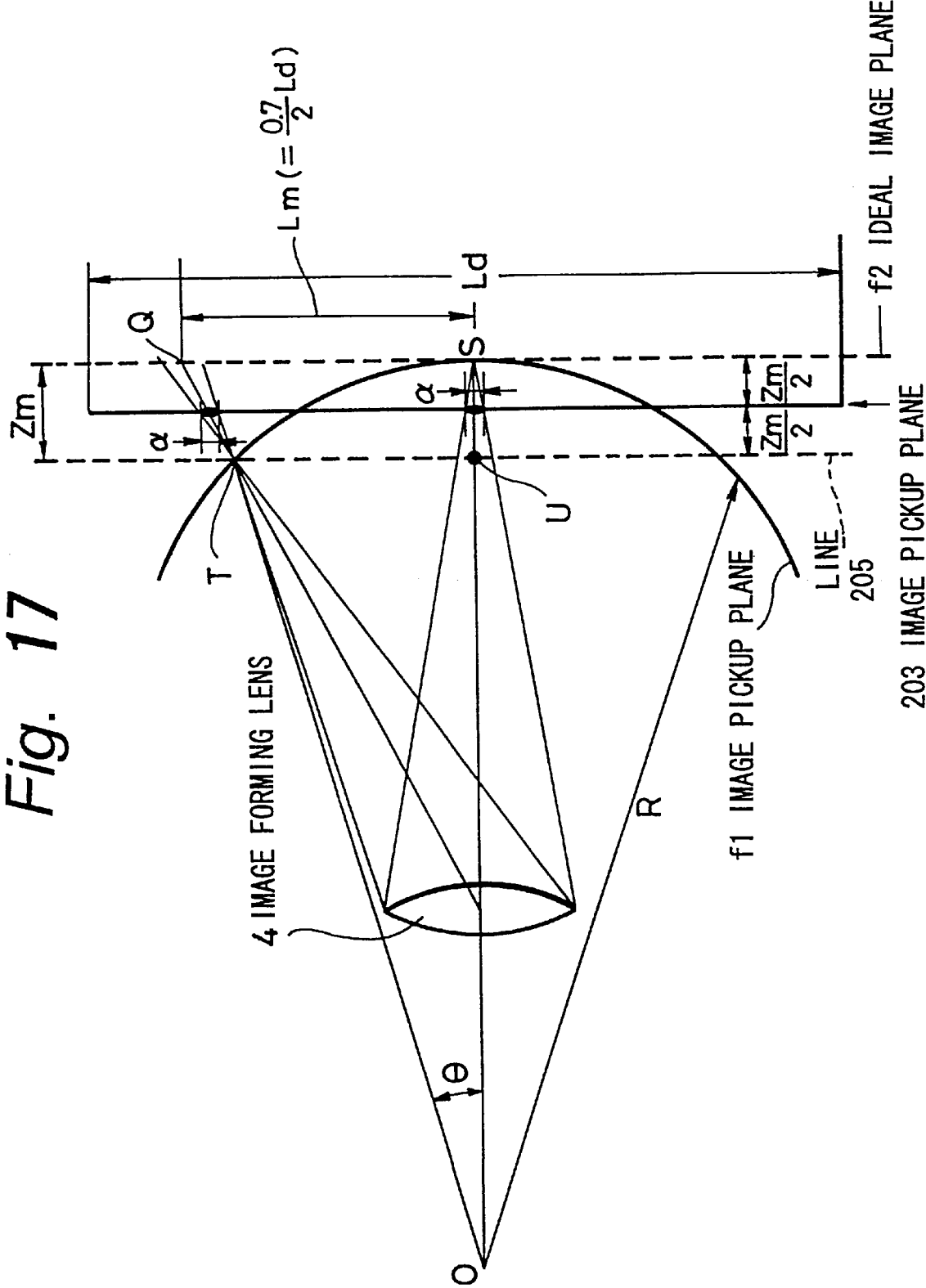
FIG. 17 is a schematic diagram for explaining the curvature of the image pickup plane.

As shown in FIG. 17, assuming that the center of the image formed plane f1 is denoted by O, the intersection of the optical axis of the image forming lens 4 and the ideal image plane f2 is denoted by S, the point on the ideal image plane f2 spaced apart from the point S by the length Lm is denoted by Q, the intersection of the image formed plane f1 and the line 205 spaced apart from the ideal image plane f2 by the length Zm in the direction of the image forming lens 4 is denoted by T, and the intersection of the line 205 and the optical axis is U, the angle θ formed of the points T, O, and U can be nearly approximated by atan (Lm/R). Thus, the length between the point O and the point U can be obtained by the following formula.

$R\times\cos\{\text{atan }(Lm/R)\}$ where R is the radius of the image formed plane f1 (the length between the point O and the point T is equal to the length between the point O and the point S).

Thus, assuming that R is 0.6 mm and Lm is 0.875, the curved amount Zm measured from the image formed plane f1 to the ideal image plane f1 at the point Q of which the length measured from the point S on the optical axis of the ideal image plane f2 is denoted by Lm (namely, the image height is denoted by Lm) can be obtained by the following formula.

$Zm=R\times(1-\cos\{\text{atan }(Lm/R)\})=0.0628$ mm

Now, assuming that the image pickup plane 203 is placed at the position of Zm/2 spaced apart from the ideal image plane f2 in the direction of the image forming lens 4, a focal deviation for Zm/2 takes place in the vicinity of each edge portion of the screen (at the position of the image height Lm) and the center portion of the screen. The diameter α of the circle of confusion resulting from the focal deviation can be obtained by the following formula.

$\alpha=(Zm/2)/F=0.0314/F$ mm where F=f/D=(Zm/2)/α

In addition, the MTF of the circular opening can be obtained by the following formula.

$M(\omega)=[J_1\{\pi\alpha(k/Lh)\}]/\{\pi\alpha(k/Lh)\}$ where $J_1$ is a Bessel function of first type, k/Lh is a spacial frequency in the horizontal direction. Thus, k accords with the number of portions of which the horizontal length Lh is divided. Since the resolution characteristics in the vertical direction depend on the number of scanning lines of the TV system, only the spacial frequency in the horizontal direction will be considered in this embodiment.

When the Bessel function of first type becomes 0, πα (k/Lh) becomes 3.83 as expressed by the following formula.

$\pi\alpha(k/Lh)=3.83$

Thus, with this formula, the trap point fn (=k/Lh) of the MTF shown in FIG. 13 can be expressed by the following formula.

$(k/Lh)=3.83/(\pi\alpha)=38.8$ F

Thus, k can be obtained by the following formula.

$k=38.8\times F\times Lh=38.8\times 2\times F=77.6$ F

Consequently, the minimum number G of pixels necessary for obtaining the above-described spatial frequency can be calculated by the following formula corresponding to the theorem of sampling.

$G=2k=2\times 77.6$ F=155 F

The above calculation was made assuming that the refractive index of the image forming lens 4 is 1.5. However, when the refractive index of the image forming lens 4 is a larger value (for example, 1.9), the following formula can be obtained.

$G=2\ k=200$ F

In other words, as a condition for obtaining an equal image, the pitches of effective pixels of the CCD bare chip 12 should be larger than 1/(200 F) of the longer side of the effective region. In other words, the number of effective pixels in the horizontal direction is less than 200 F.

In FIG. 17, the diameter α of the circle of confusion can be obtained as the length of the point of which the line that connects the edge portion of the opening of the image forming lens 4 and the point T intersects with the image pickup plane 203.

Figure 18:
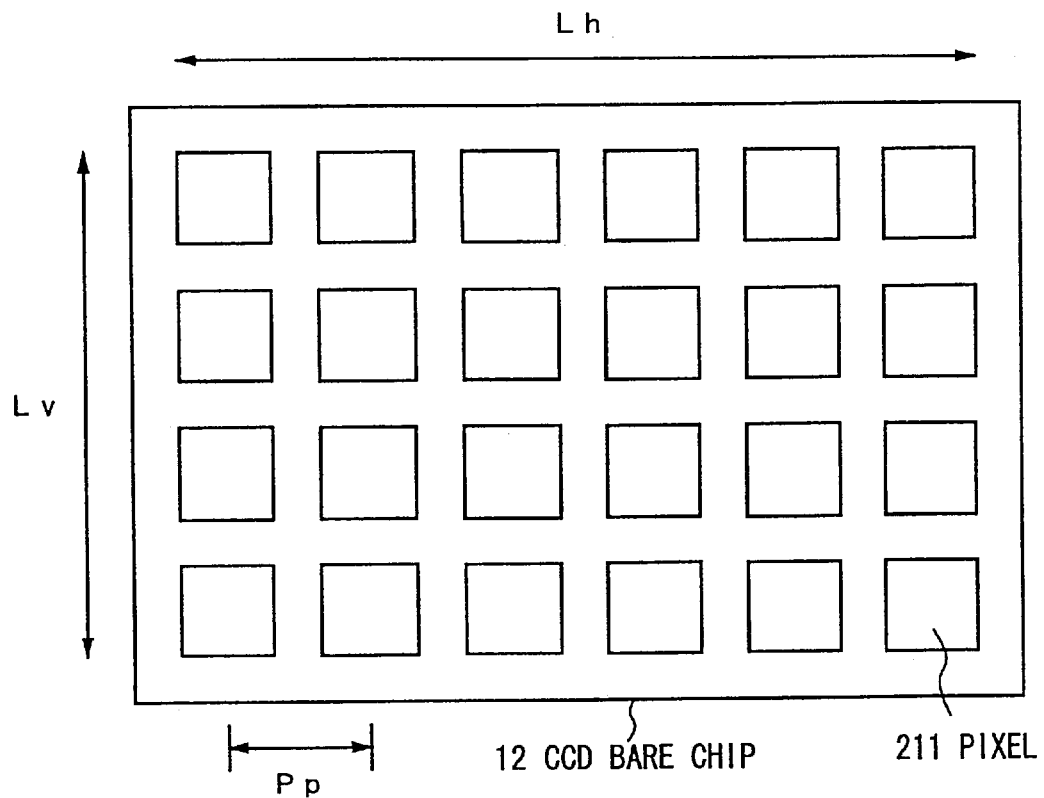
FIG. 18 is a schematic diagram for explaining pixels on the CCD pair chip.
Figure 19:
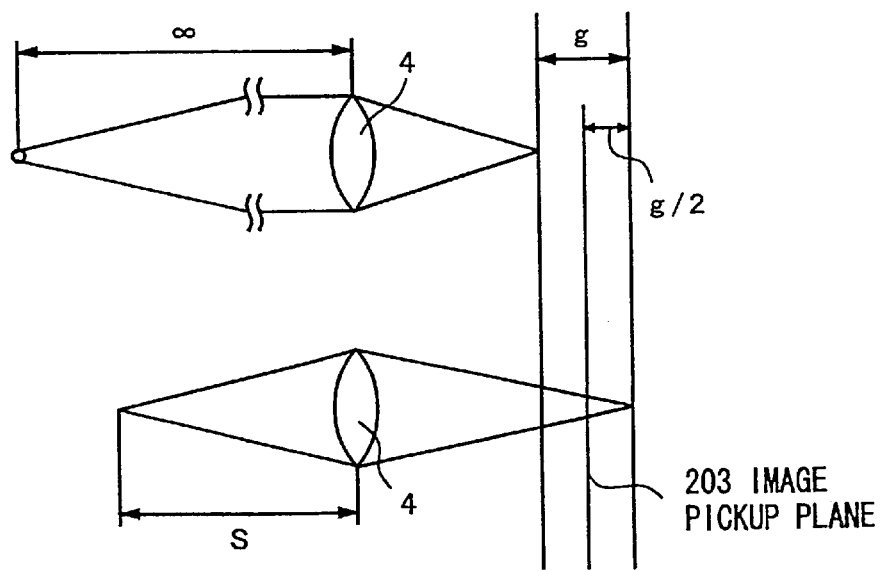
FIG. 19 is a schematic diagram for explaining a variation of an image formed position.

Thus, as shown in FIG. 18, the pitches PP of the pixels 211 on the image pickup plane of the CCD bare chip 12 shown in FIG. 6 are determined so that the above-described condition is satisfied.

Next, the condition of the focal length f of the image forming lens 4 at which an object in the range from the shortest length S to the infinite length (∞) is formed with the minimum defocus amount will be described. Assuming that the amount of deviation between the image formed position of the image forming lens 4 for the object at the infinite position and the image formed position of the image forming lens 4 for the object at the shortest position S is denoted by g, the following formula is satisfied by the image forming formula.

$$g \times (S-f) = f^2$$

Since the length S is sufficiently larger than the focal length f, the above formula can be arranged as follows.

$$g = f^2/(S-f) = f^2/S$$

In the range of the amount of deviation, to decrease the amount of deviation of the focal point, the image pickup plane 203 of the CCD bare chip 12 is placed at the center position (g/2) of the amount of deviation g.

As with the case shown in FIG. 16, assuming that the length of the longer side of the screen of the image pickup device is denoted by Lh and the radius of the curvature of the image plane is denoted by R (=n×f), the amount of curvature Z on the image plane at the image height L can be obtained by the following formula.

$$Z = R \times (1 - R^2 - L^2)^{1/2}$$

Since $L^2/R^2$ is sufficiently smaller than 1, the above formula can be arranged as follows.

$$Z = R \times (1 - (1 - L^2/(2 \times R^2)))$$
$$= L^2/(2 \times R) = L^2/(2 \times n \times f)$$

Since there is no correlation between g/2 and Z, the square of the total amount of focal deviation D can be expressed as the sum of squares thereof as the following formula.

$$D^2 = (g/2)^2 + Z^2$$
$$= (f^2/2 \times S)^2 + (L^2/(2 \times n \times f))^2$$
$$= (f^4/4 \times S^2) + L^4/(4 \times n^2 \times f^2)$$

To obtain the minimum value of $D^2$, assuming that the expression of which $D^2$ is differentiated with respect to f is set to 0, the following formula can be obtained.

$$f^3/S^2 - L^4/(2 \times n^2 \times f^3) = 0$$

When this formula is solved with respect to f, the following formula can be obtained.

$$f = ((S^2 \times L^4)/(2 \times n^2))^{1/6}$$

In other words, the focal length f obtained by the above formula is accomplished by the image forming lens 4. However, the focal length f obtained by the above formula is not strictly required. Rather, the focal length f may have a range to some extent.

In other words, generally, the portion from the center of the screen to 70% of the half of the diagonal length of the screen is important. To prevent an out-of-focus state from taking place on the screen in such a range, the image height L is set to 0.35 to 0.5 times of the half of the diagonal length of the screen. Assuming that the aspect ratio of the screen is 4:3, the length of the half of the diagonal length is expressed by (⅝)×Lh. Thus, it is clear that the image height should be set to the following range.

$$0.35 \times (\tfrac{5}{8}) \times Lh = 0.219\ Lh < L < 0.5 \times (\tfrac{5}{8}) \times Lh = 0.312\ Lh$$

In consideration of the application of the apparatus for a TV conference system, the shortest distance S is in the range from 200 mm to 300 mm. The refractive index n of the image forming lens 4 is in the range from 1.4 to 1.9.

By substituting these conditions into the formula of the focal length f and arranging the resultant expression, the following formula can be obtained.

$$1.53 \times (Lh^{(2/3)}) < f < 2.46 \times Lh^{(2/3)}$$

In other words, when the focal length f of the image forming lens 4 is set in the range expressed by the above formula, an object ranging from the shortest distance S to the infinite distance can be imaged without out-of-focus state.

Figure 20:
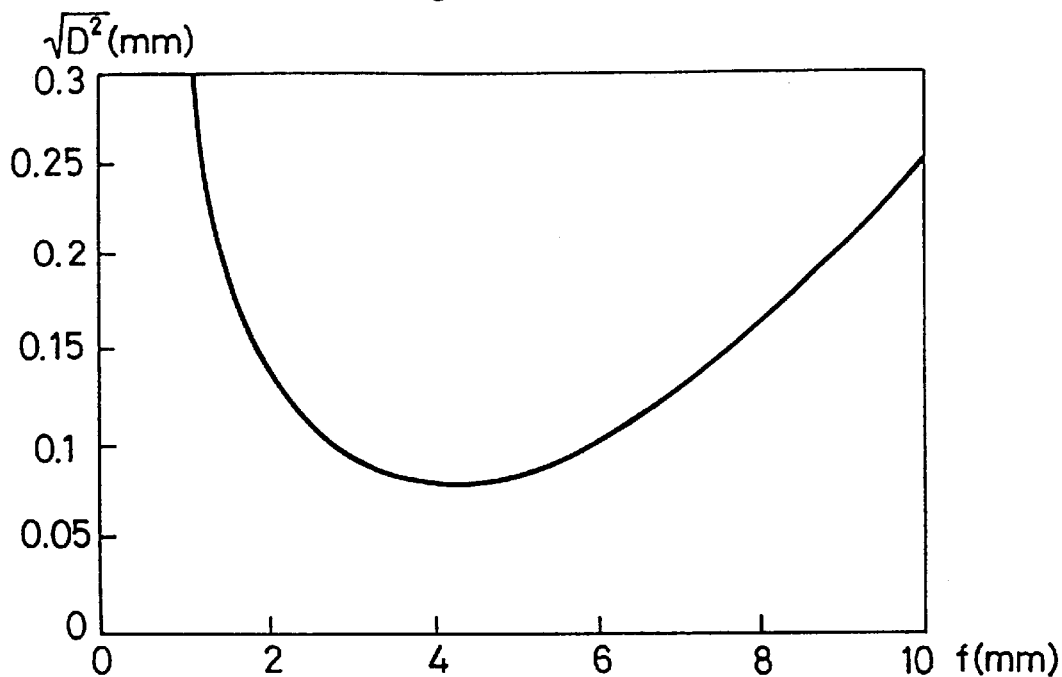
FIG. 20 is a graph showing the relation between the focal length and the amount of out-of-focus.

FIG. 20 shows the relation between the focal length f (on the horizontal axis) and the square root ($(D^2)^{1/2}$) of the total defocus deviation amount D (on the vertical axis). In this example, it is assumed that L is 0.63 mm, S is 200 mm, and n is 1.5.

In other words, FIG. 20 shows that when the focal length f is around 4 mm, the defocus amount becomes minimum.

Figure 21:
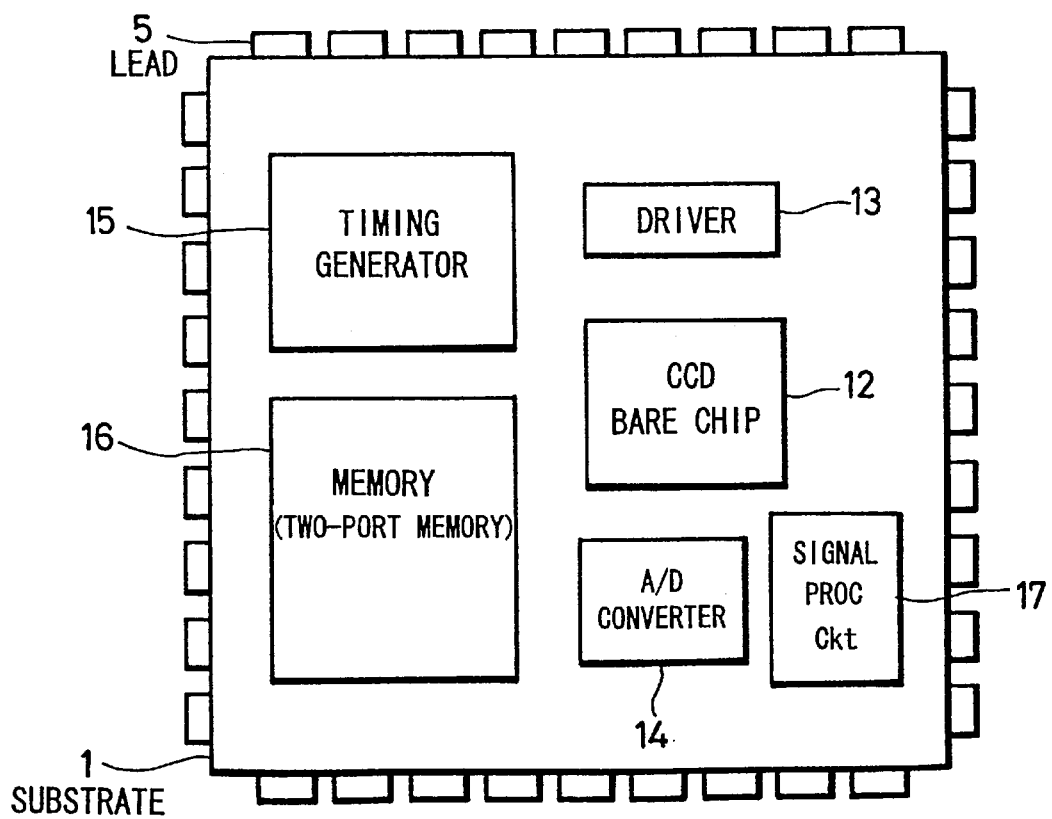
FIG. 21 is a schematic diagram for explaining a fabrication method of an image pickup apparatus shown in FIG. 4.

Next, with reference to FIGS. 21 and 22, the fabrication method of the image pickup apparatus shown in FIGS. 4 and 6 will be described. As shown in FIG. 21, the CCD bare chip 12 is disposed on the substrate 1. When necessary, other chips are disposed. In addition, when necessary, the CCD bare chip 12 and the other chips are electrically connected. In this embodiment, as the other chips, a driver 13, an A/D converter 14, a timing generator 15, a memory (two-port memory) 16, and a signal processing circuit 17 are mounted on the substrate 1. Required leads 5 are disposed on the substrate 1 and when necessary the leads are electrically connected to the chips on the substrate 1.

Figure 22:
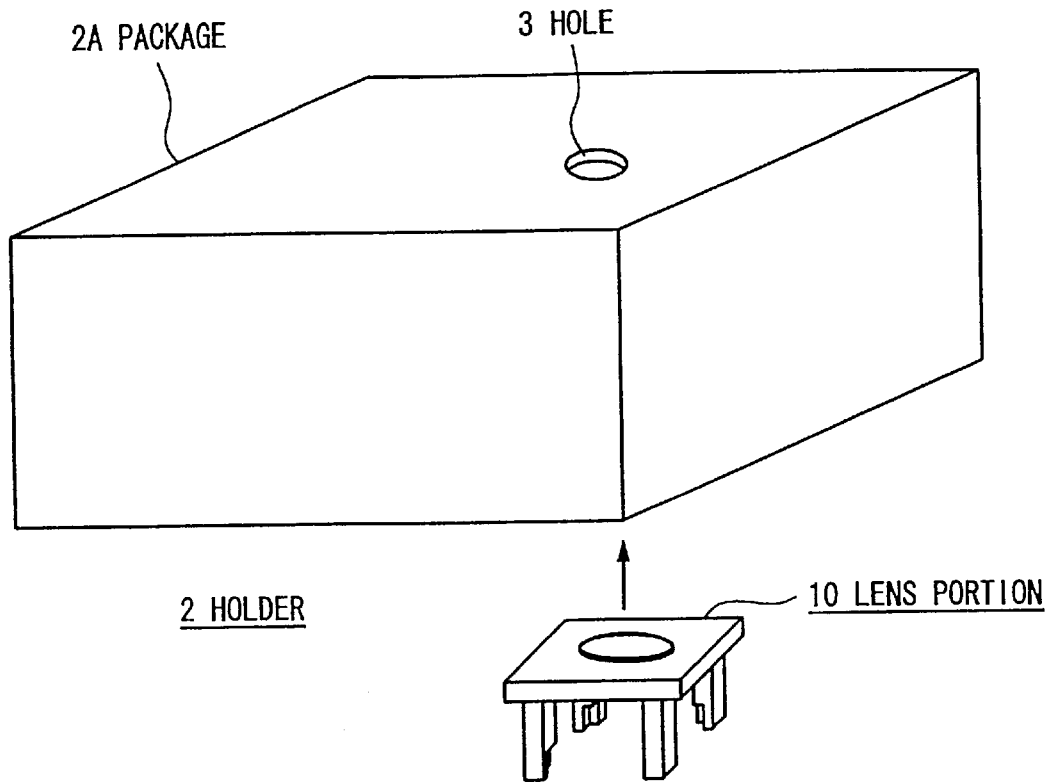
FIG. 22 is a schematic diagram for explaining a fabrication method of the image pickup apparatus shown in FIG. 4.

On the other hand, as shown in FIG. 22, the package 2A with the hole 3 and the lens portion 10 are molded. The lens portion 10 is fitted to the hole 3 of the package 2A so that the package 2A and the lens portion 10 are integrally formed. Thus, the holder 2 is obtained.

The substrate 1 and the holder 2 are integrally formed with the filler shown in FIG. 6 in such a manner that the leg portions 11 of the lens portion 10 stand on the CCD bare chip 12.

When the substrate 1 and the holder 2 are integrally formed, since no special adjustments are required, the image pickup apparatus can be easily fabricated at low cost.

Figure 23:
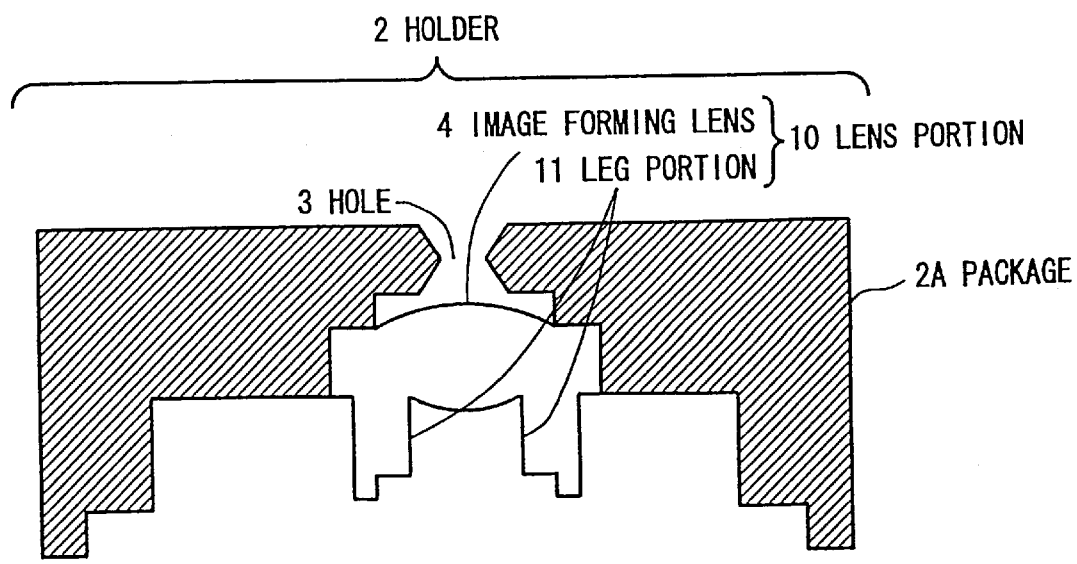
FIG. 23 is a schematic diagram showing a forming example of a holder.
Figure 24:
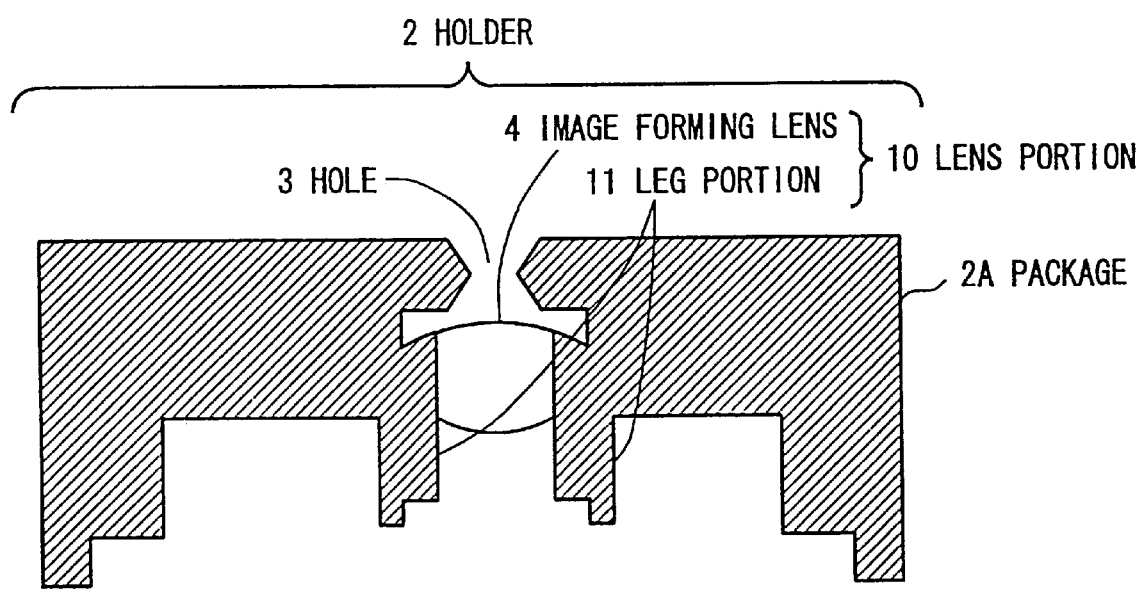
FIG. 24 is a schematic diagram showing another forming example of the holder.

In the above-described example, the package 2A and the lens portion 10 are independently molded and then unified. Alternatively, as shown in FIG. 23, the holder 2 may be fabricated by molding the package 2A and the lens portion 10 with a light insulating material and a transparent material at the same time. In this case, as shown in FIG. 24, the leg portions 11 of the lens portion 10 may be composed of a light insulating material rather than a transparent material. In this case, the leg portions 11 can prevent light from reflecting. Thus, the flaring of the leg portions 11 can be reduced.

Figure 25:
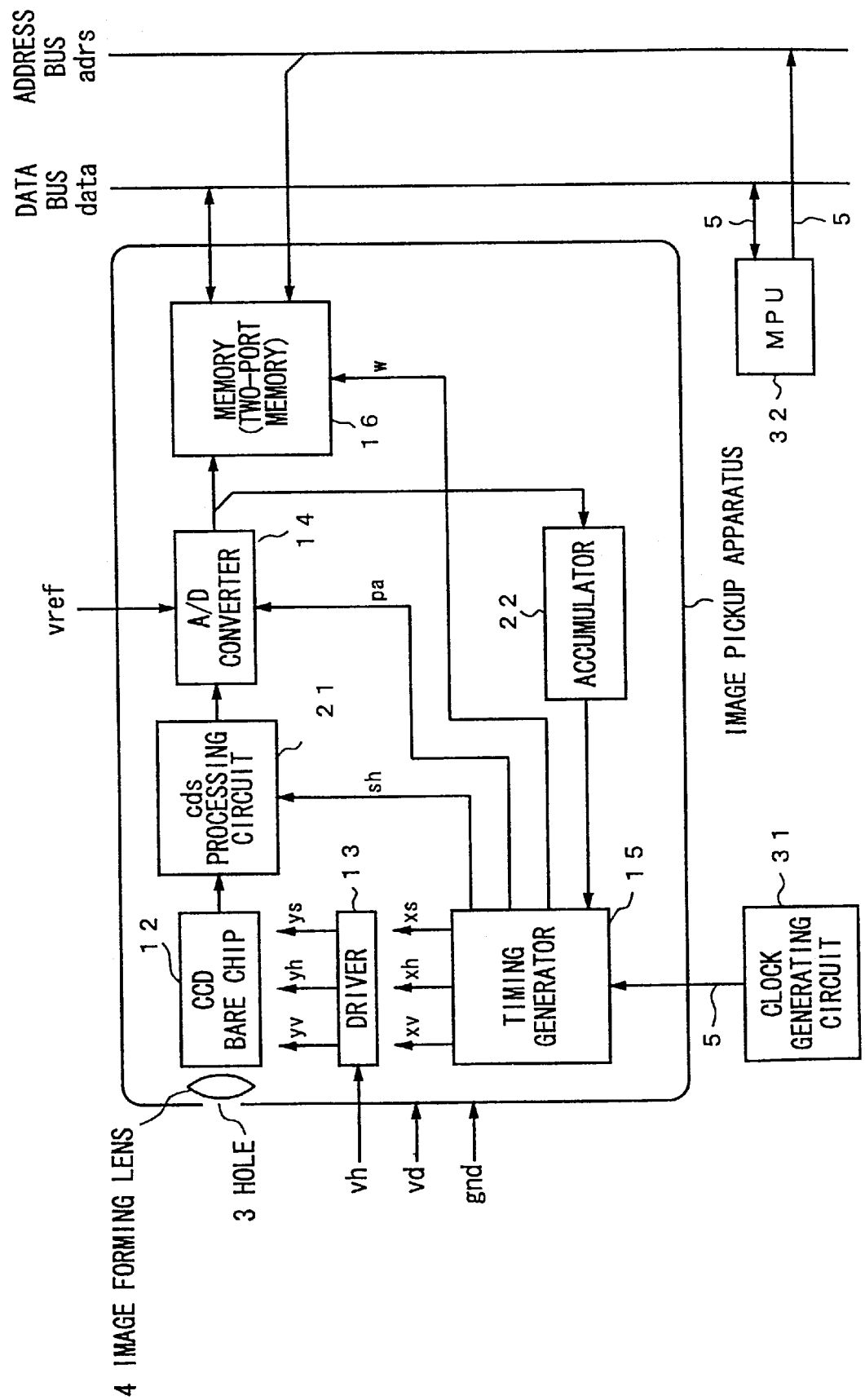
FIG. 25 is a block diagram showing an example of the structure of a video camera having the image pickup apparatus shown in FIG. 4.

FIG. 25 shows an example of the electric structure of a video camera for which the image pickup apparatus shown in FIG. 4 is applied. Light emitted from an object is entered to an image forming lens 4 through a hole 3. The image forming lens 4 forms an image of the light on a light receiving plane of a CCD bare chip 12. The CCD bare chip 12 operates corresponding to various timing signals yv, yh, and ys supplied from a driver 13. The CCD bare chip 12 converts the light formed by the image forming lens 4 into an electric signal. An image signal as the electric signal is output to a cds (correlative double sampling) processing circuit 21. The driver 13 converts the levels of timing signals xv, xh, and xs that are supplied from a timing generator 15, converts the impedances thereof, and outputs the resultant signals as the timing signals yv, yh, and ys. The driver 13 supplies the timing signals yv, yh, and ys to the CCD bare chip 12 so as to drive the CCD bare chip 12. An A/D converter 14 samples an image signal supplied from the cds processing circuit 21 corresponding to a sampling clock signal pa supplied from the timing generator 15 and outputs the resultant image signal as digital image data to a memory 16 and an accumulator 22. The A/D converter 14 determines bits assigned to sample values with reference to a reference voltage vref supplied from the outside of the apparatus. The timing generator 15 generates various timing signals corresponding to a clock signal supplied from an external clock signal generating circuit 31. In other words, the timing generator 15 generates the timing signals xv, xh, xs, sh, pa, and w. The timing signals xv and xh are used to transfer electric charge generated in the CCD bare chip 12 in the vertical direction and the horizontal direction, respectively. The timing signal xs (so-called shutter pulse) is used to discharge the electric charge generated in the CCD bare chip 12 (namely, discharge the electric charges to the substrate of the CCD bare chip 12). The timing signal sh is used to operate the cds processing circuit 21. The sampling clock signal pa is used to provide a sampling timing of the A/D converter 14. The timing signal w is used to provide a writing timing of image data to the memory 16.

The memory 16 is a two-port memory that can read and write data at a time. The memory 16 stores image data supplied from the A/D converter 14 corresponding to the timing signal w supplied from the timing generator 15. The image data stored in the memory 16 is read by an external MPU (Micro Processor Unit) 32. The MPU 32 gives a predetermined address to the memory 16 through an address bus adrs so as to read image data from the memory 16. Thus, the image data stored at the address of the memory 16 is output to the data bus data. The MPU 32 obtains the image data on the data bus data.

The cds processing circuit 21 operates corresponding to the timing signal sh supplied from the timing generator 15. The cds processing circuit 21 performs a so-called correlative double sampling process and other required processes for the image signal supplied from the CCD bare chip 12, decreases (or removes) noise components contained in the image signal, and outputs the resultant signal to the A/D converter 14.

The accumulator 22 calculates the cumulated value of the major portion (for example, the center portion) of the light receiving plane of the CCD bare chip 12 for the image data that is supplied from the A/D converter 14 and supplies the calculated values to the timing generator 15. The timing generator 15 controls the timing signal (namely, the shutter pulse xs) for discharging the electric charge generated in the CCD bare chip 12 so as to prevent the cumulated value supplied from the accumulator 22 from largely deviating. Thus, the iris is electronically adjusted. In other words, when the cumulated value becomes large, the exposure time (charge storage time) is decreased. When the cumulated value becomes small, the exposure time is increased. The accumulator 22 is reset at every field interval (occasionally, at every frame interval). Thus, the cumulated value of the image data is output from the accumulator 22 for every field (or for every frame).

The clock signal generating circuit 31 is connected to a timing generator 15 through a lead 5. The clock signal generating circuit 31 generates a clock signal for operating the video camera and supplies the clock signal to the timing generator 15. The MPU 32 reads image data from the image pickup apparatus (memory 16) through the address bus adrs or the data bus data and a lead 5 and performs a predetermined signal process.

A voltage Vd of a power supply for each chip, a predetermined reference voltage gnd as a ground voltage, and a voltage Vh for driving the CCD bare chip 12 are supplied from the outside of the apparatus through leads.

The cds processing circuit 21 and the accumulator 22 are equivalent to the signal processing circuit 17 shown in FIG. 21.

Next, the operation of the apparatus will be described. Light emitted from an object is entered into an image forming lens 4 through a hole 3 that functions as a fixed diaphragm. The resultant light is imaged on the light receiving plane of the CCD bare chip 12 by the image forming lens 4.

Figure 26:
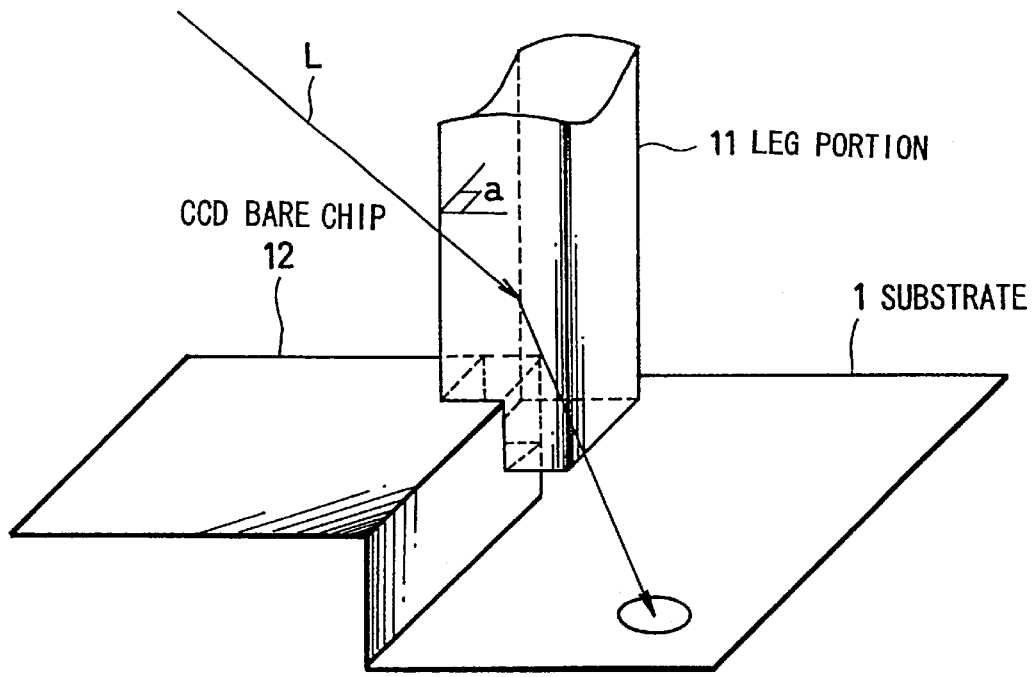
FIG. 26 is a schematic diagram showing the state that unnecessary light L that is emitted from the image forming lens 4 is reflected by a leg portion 11.

FIG. 26 shows the state that unnecessary light L emitted from the image forming lens 4 is reflected on the outer surface of a leg portion 11. As described earlier, two side surfaces of each leg portion 11 face the optical axis of the image forming lens 4. In addition, the horizontal section of each leg portion 11 is formed in a rectangular shape. Thus, the angle a of the corner formed by the two surfaces is a right angle. Consequently, as shown in FIG. 26, when unnecessary light L is reflected on a side surface of a leg portion 11, the reflected light does not reach the light receiving plane of the CCD bare chip 12. As a result, the leg portions 11 do not almost cause flare to increase.

The angle a may be an acute angle rather than the right angle. However, if the angle a is an obtuse angle, light reflected on the external surface of a leg portion 11 gradually enters the CCD bare chip 12, resulting in an undesired result.

In addition, a light insulating paint may be coated on the leg portions 11 so as to prevent entered light from reaching the CCD bare chip 12. Moreover, the sectional shape of each leg portion 11 may be square, triangular, or pentagonal other than rectangular. However, to prevent flare from increasing, at least one angle of adjacent side surfaces of each leg portion 11 should be a right angle or an acute angle. In addition, the angular portion should face the optical axis of the image forming lens 4.

Returning to FIG. 25, in the CCD bare chip 12, the received light is converted into an image signal corresponding thereto. The image signal is supplied to the cds processing circuit corresponding to a timing signal received from the driver 13. The cds processing circuit 21 performs the correlative double sampling process for the image signal supplied from the CCD bare chip 12 and outputs the resultant signal to the A/D converter 14. The A/D converter 14 samples the image signal supplied from the cds processing circuit 21 and supplies the resultant signal as digital image data to the accumulator 22. The accumulator 22 cumulates the above-described piece of the image data supplied from the A/D converter 14 and outputs the cumulated value to the timing generator 15. The timing generator 15 generates various timing signals corresponding to the clock signal received from the clock signal generating circuit 31. When the timing generator 15 receives the cumulated value from the accumulator 22, the timing generator 15 varies the generation timing of the shutter pulse xs so that the cumulated value does not largely deviate from a predetermined value.

In addition, the image data supplied from the A/D converter 14 is also supplied to the memory 16 as well as the accumulator 22. The memory 16 stores the image data. When necessary, the MPU 32 reads the image data from the memory 16 and performs a predetermined process for the image data.

The package as the image pickup apparatus has the CCD bare chip 12 (which converts light into an electric signal and outputs an image signal as the electric signal), the A/D converter 14 (which converts an output signal of the CCD bare chip 12 into a digital data), and the memory 16 (which stores the output signal of the A/D converter 14). Thus, when the image pickup apparatus is viewed from the MPU 32, the image pickup apparatus is equivalent to a memory. Thus, it is not necessary to consider the synchronization of the image pickup apparatus with external blocks. Consequently, when the image pickup apparatus is applied for the above-described video camera or another apparatus, the apparatus can be easily mounted and handled.

Alternatively, instead of the memory 16, a camera circuit such as an NTSC encoder may be disposed so as to convert image data into an NTSC video signal.

In this embodiment, as the photoelectric converting device that converts light emitted from the image forming lens 4 into an electric signal, the CCD bare chip is used. However, as the photoelectric converting device, a bare chip of destructive reading type image pickup devices (such as CMOS type image pickup devices) that read electric charge stored in a condenser as an image signal may be used. In addition, as the photoelectric converting device, a device other than the destructive reading type image pickup device may be used. When a photoelectric converting device other than a CCD is used, the cds processing circuit 21 can be omitted.

In this embodiment, the memory 16 is a two-port memory. However, instead of the two-port memory, a normal memory may be used. However, in this case, a circuit that adjusts the read operation of image data by the CPU 32 and the write operation of image data by the A/D converter 14 should be provided.

In this embodiment, the four leg portions 11 of the lens portion 10 directly contact the four corners of the CCD bare chip 12, respectively. However, the four leg portions 11 may be disposed in such a manner that they contact the four sides of the CCD bare chip 12 (portions denoted by ▲ in FIG. 5). However, in this case, reflected light on the leg portion 11 enters the CCD bare chip 12 and thereby flare takes place. In addition, the leg portions 11 prevent connection wires of the CCD bare chip 12 to route. Thus, as described in the embodiment, it is preferred to dispose the leg portions 11 so that they contacts the four corners of the CCD bare chip 12.

Figure 27:
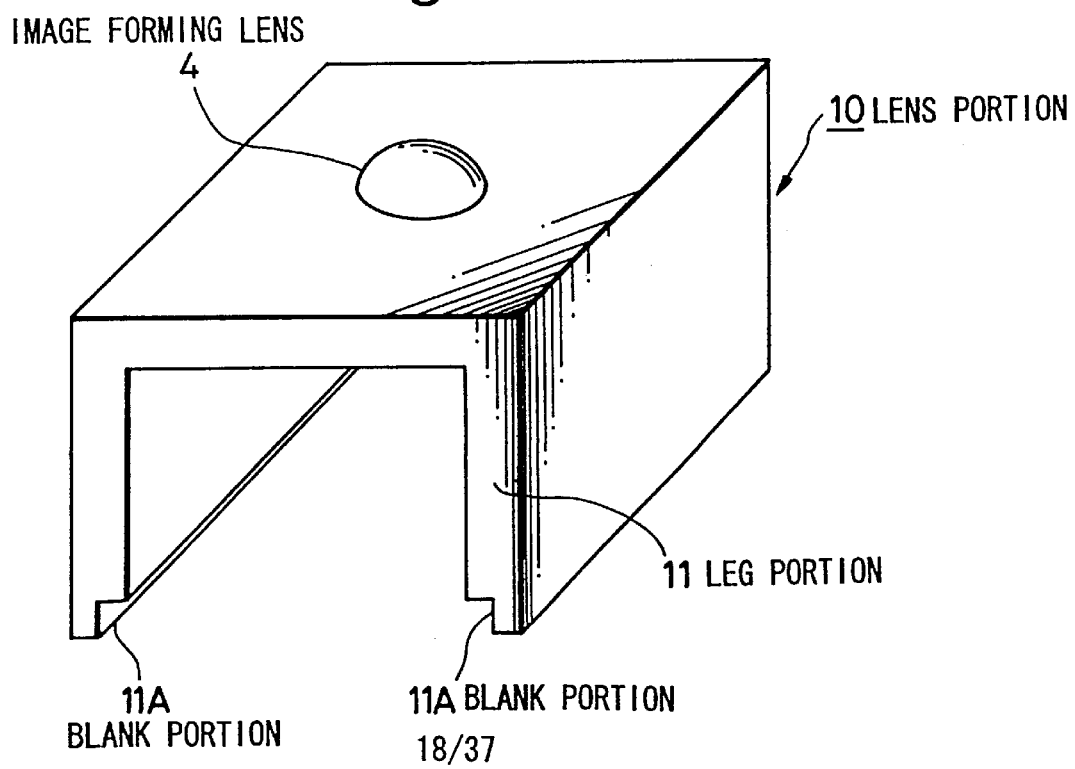
FIG. 27 is a schematic diagram showing another example of the structure of the lens portion.

Alternatively, as shown in FIG. 27, the lens portion 10 may have two leg portions 11 and the two opposite sides of the sides denoted by ▲ in FIG. 5 may be held by blank portions 11A. In this case, the protrusions 11A$a$ or the tapered surfaces 11A$b$ shown in FIGS. 10 or 11 may be formed, respectively.

Figure 28:
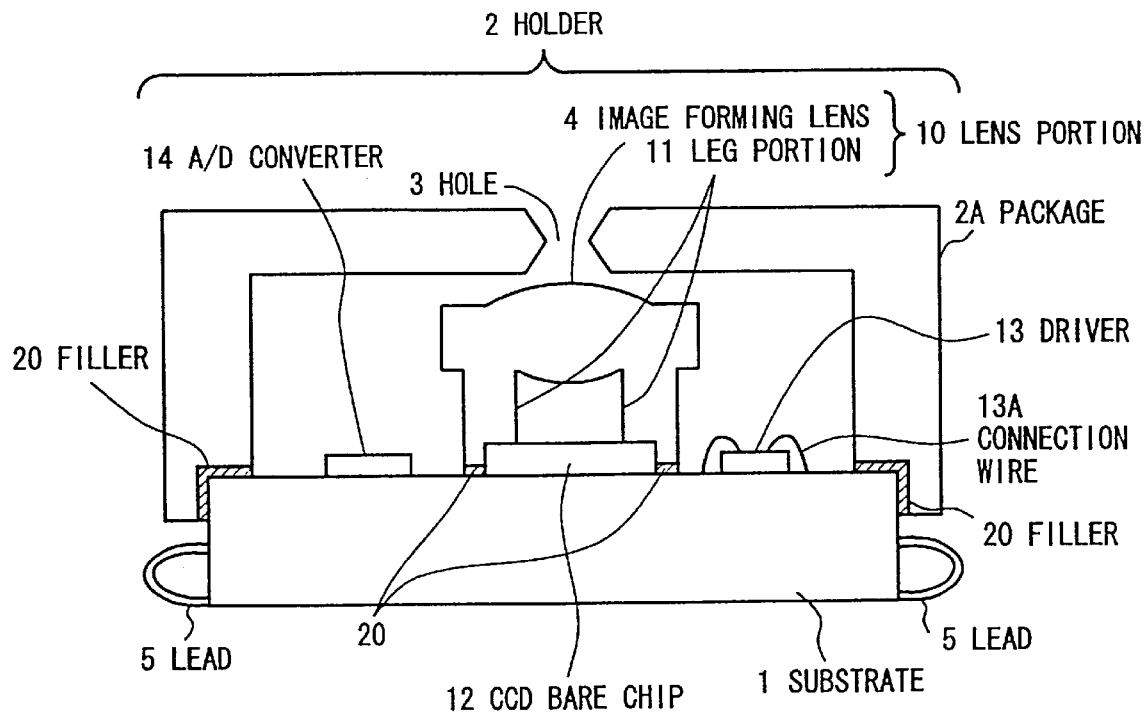
FIG. 28 is a schematic diagram showing another example of the structure of the image pickup apparatus.

In the embodiment shown in FIG. 6, the lens portion and the package 2A (holder 2) are integrally formed. However, as shown in FIG. 28, the lens portion 10 and the package 2A may be spaced apart. In this case, the lower edges of the leg portions 11 are bonded to the substrate 1 with the filler 20. In this structure, even if an external force is applied to the holder 2, the force is not directly transferred to the lens portion 10 due to the presence of the filler 20. Thus, the filler 20 prevents the lens portion 10 from being damaged. In this embodiment, the position of the hole 3 as the diaphragm is spaced apart from the image forming lens 4. However, the effect of the diaphragm is not too sensitive, there is no practical problem therewith.

Generally, the coefficient of thermal expansion of synthetic resin is 10 times larger than that of glass. In addition, the temperature change of the refractive index of synthetic resin is around 100 times higher than that of glass. Thus, in the case that the image forming lens 4 is composed of synthetic resin, when the temperature varies, the focal length of the image forming lens 4 changes. Consequently, the image forming lens cannot be used in a wide temperature range unless an adjusting mechanism thereof is provided. Thus, in this embodiment, the adjusting mechanism is substantially provided in the following manner.

Figure 29:
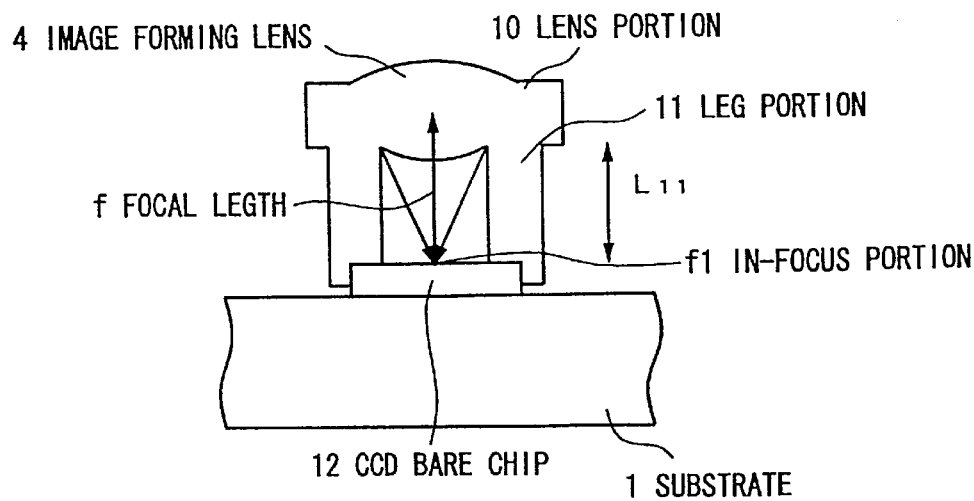
FIG. 29 is a schematic diagram for explaining the relation between the focal length of the lens portion and the leg portion.

As shown in FIG. 29, as the temperature rises, the length L11 of each leg portion 11 increases. In addition, the following formula can be satisfied between the refractive index n of a convex lens and the focal length f thereof.

$$f = K/(2(n-1))$$

where K is a coefficient with respect to the curvature of the sphere of the lens.

Thus, as the temperature rises, the focal length f of the image forming lens 4 shown in FIG. 29 varies.

Now, assume that the change of refractive index corresponding to a unit temperature change is denoted by a (/degree) and the linear expansion coefficient of each leg portion 11 is denoted by b (/degree). Normally, the value of a of the resin lens is negative and the order thereof is in the range from $10^{-5}$ to $10^{-4}$. On the other hand, the value of b is positive and the order thereof is in the range from $10^{-5}$ to $10^{-4}$.

Now, considering that the change of focal position in the case that the temperature rises by T (degrees) is denoted by $\Delta f$, the change of focal position $\Delta f$ can be expressed by the following formula.

$$\Delta f = K/(2(n-1+a \times T)) - R/(2(n-1))$$
$$= -a \times T \times K/(2(n-1+a \times T) \times (n-1))$$
$$= -a \times T \times f/(n-1+a \times T)$$

where R=2×(n−1)×f

Normally, the relation n−1>>a×T is satisfied, the above formula can be expressed as follows.

$$\Delta f = -a \times T \times f/(n-1)$$

When the temperature rises by T, the increase amount ΔL of the length L11 of each leg portion 11 can be expressed by the following formula.

$$\Delta L = b \times T \times L11$$

Thus, the moving amount Δh of the plane of the real focal length can be expressed by the following formula.

$$\Delta h = \Delta f - \Delta L$$

When the apparatus is designed so that Δh is in the depth of focus ΔZ (namely, the following formula is satisfied), even if the temperature varies, the in-focus position f1 can be placed on the light receiving plane of the CCD bare chip 12.

$$|-a \times f/(n-1) - b \times L11| < \Delta Z/T)$$

In the above embodiment, the spacial frequency of the incidental light image is limited by aberration of the lens or the like so as to decrease the loop-back distortion that takes place in the CCD bare chip 12. However, depending on the application of the camera, color moire that takes place on the single plate type color camera should be satisfactorily suppressed. In this case, only a predetermined spatial frequency should be sharply suppressed. However, in the above-described spatial frequency limiting method, it is difficult to sharply suppress only the predetermined spatial frequency.

Figure 30:
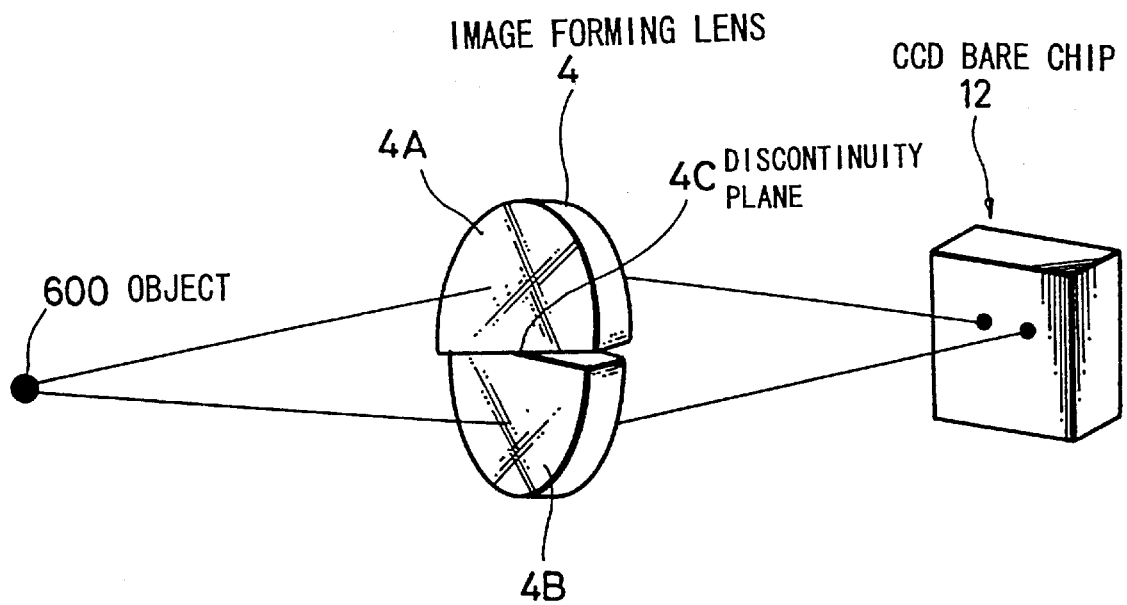
FIG. 30 is a schematic diagram showing the case that the image forming lens 4 has a discontinuity plane.
Figure 31:
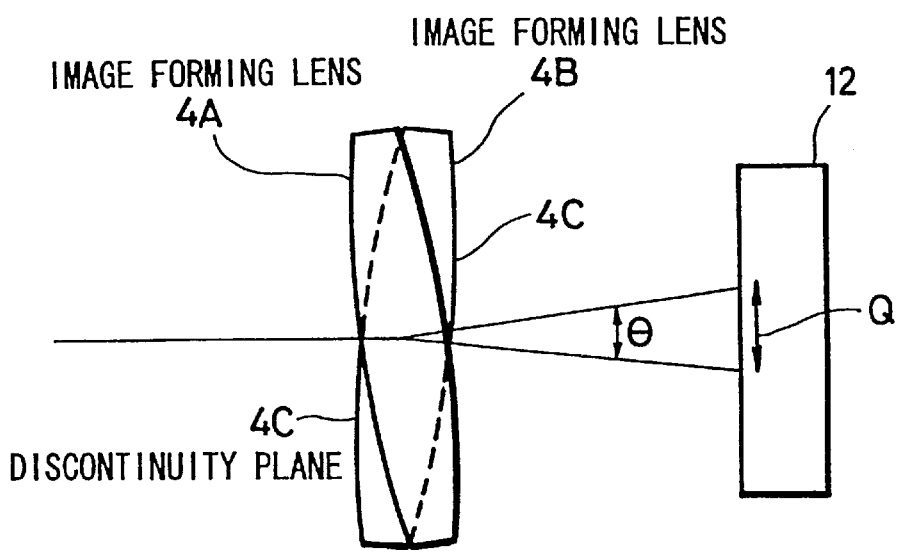
FIG. 31 is a schematic diagram showing the structure of the embodiment shown in FIG. 30 in the case that the structure is viewed from the top.

Thus, for example, as shown in FIG. 30, the image forming lens 4 is divided with respect to the horizontal plane that passes through the center thereof as image forming lens 4A and 4B. The image forming lens 4A is rotated by an angle θ in the horizontal direction against the image forming lens 4B. Thus, a lens with a discontinuity plane 4C can be used. FIG. 31 shows the top view of the image forming lens 4.

In this case, light that is emitted from the object and that is imaged on the CCD bare chip 12 through the upper image forming lens 4A is horizontally spaced apart from light that is emitted from the object and that is imaged on the CCD bare chip through the lower image forming lens 4B by a length Q. In other words, at this point, the following equation is satisfied.

$$\theta = 2 \times \operatorname{atan}(Q/2f)$$

Figure 32:
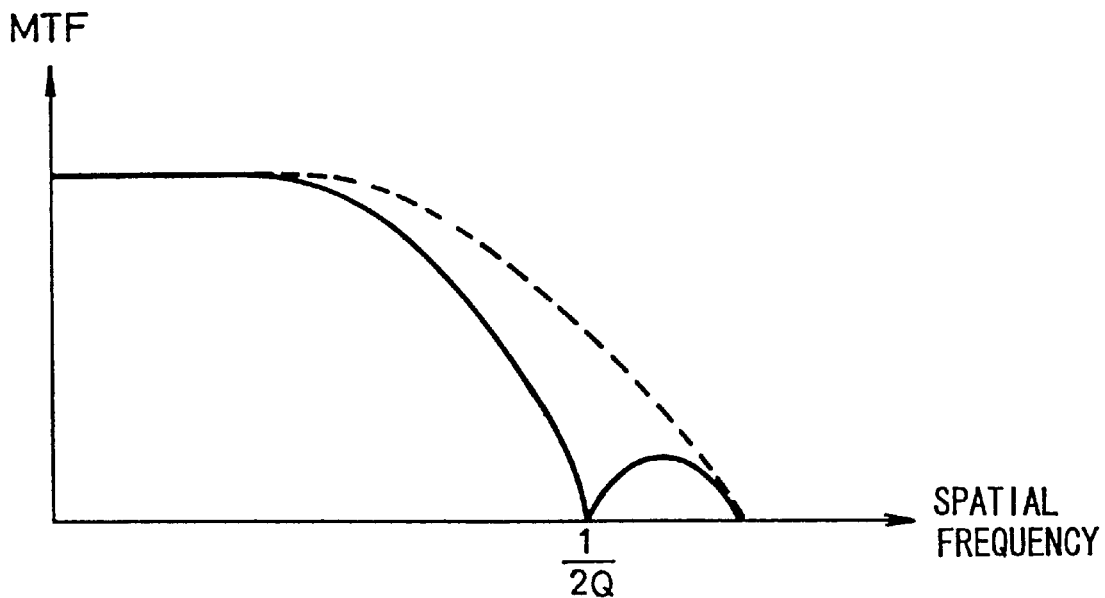
FIG. 32 is a graph showing MTF characteristics of the embodiment shown in FIG. 30.

Thus, the MTF of the image forming lens 4A and 4B is obtained as shown in FIG. 32. Namely, the MTF sharply decreases at a spacial frequency of $1/(2Q)$.

Figure 33A:
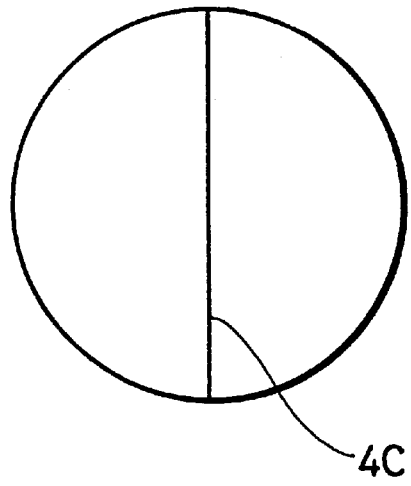
FIGS. 33A to 33B is a schematic diagram showing another forming example of the discontinuity plane of the image forming lens 4.
Figure 33B:
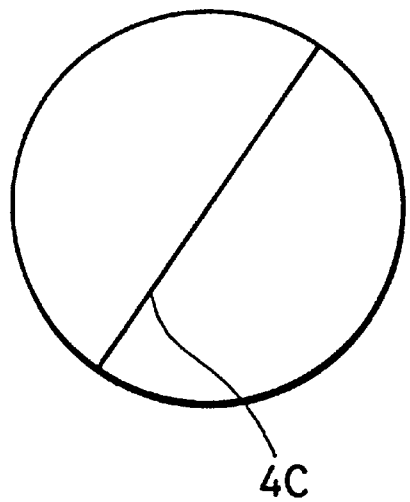

To obtain such characteristics, it is not always necessary to employ the structure of which the direction of the discontinuity plane of the image forming lens 4 is horizontal. In other words, as shown in FIG. 33, the direction of the discontinuity plane of the image forming lens 4 may be vertical (see FIG. 33A) or diagonal (see FIG. 33B).

Figure 34:
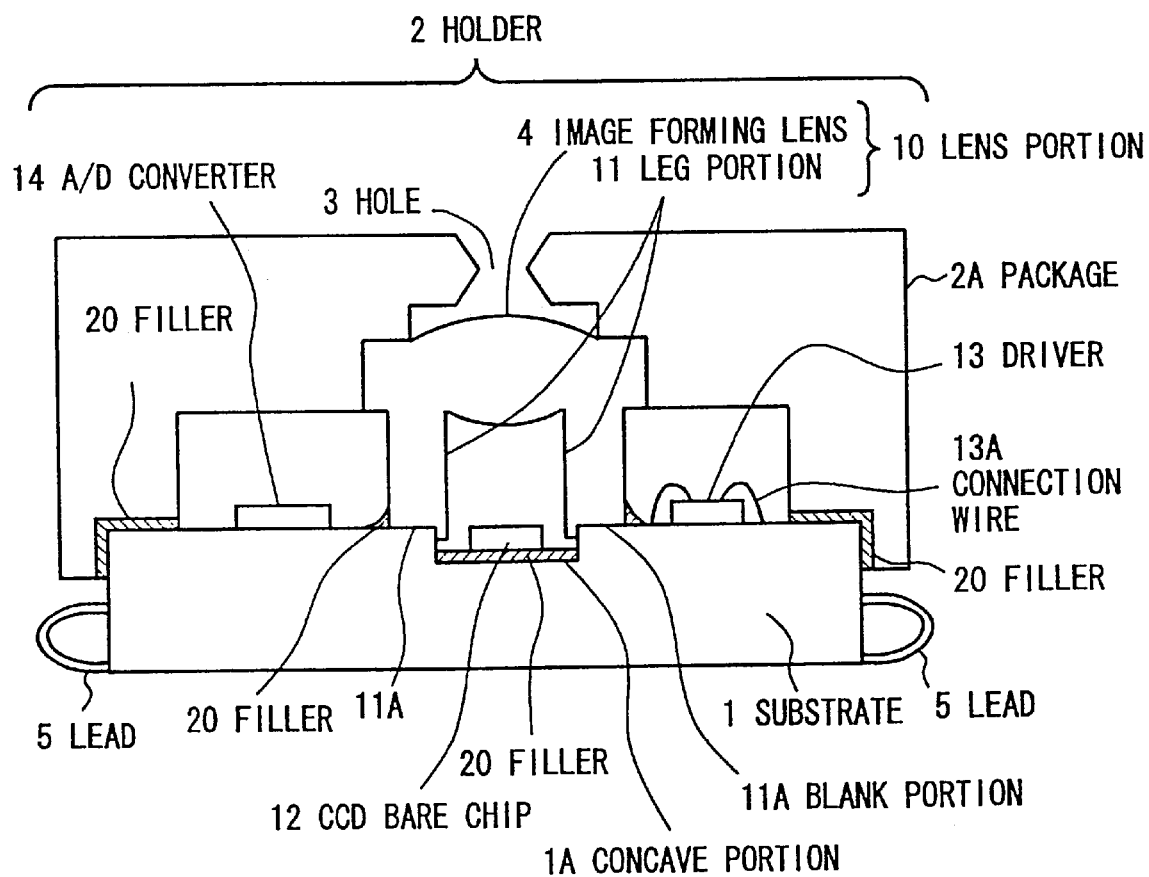
FIG. 34 is a schematic diagram showing another assembling example of the CCD bare chip and the lens portion against the substrate.

In addition, in the above embodiment, the leg portions 11 of the lens portion 10 directly contact the CCD bare chip 12. However, the leg portions 11 of the lens portion 10 may directly contact the substrate 1. FIG. 34 shows the structure in this case.

In other words, in the embodiment shown in FIG. 34, a concave portion 1A that is slightly larger than the CCD bare chip 12 is formed in the substrate 1. The CCD bare chip 12 is bonded to the concave portion 1A with the filler 20. The blank portions of the leg portions 11 of the lens portion 10 fit the corners of the concave portions 1A of the substrate 1. The outer periphery of each leg portion 11 is bonded to the substrate 1 with the filler 20. The other structure of this embodiment is the same as the structure shown in FIG. 6.

FIG. 35 shows steps for mounting the CCD bare chip 12 and the lens portion 10 to the substrate 1 according to the embodiment shown in FIG. 34.

As shown in FIG. 35A, the image pickup plane of the CCD bare chip 12 is sucked by a sucking type jig 501 that holds an IC chip. Next, as shown in FIG. 35B, the filler 20 is coated in the concave portion 1A of the substrate 1 beforehand. As shown in FIG. 35C, the CCD bare chip 12 held by the jig 501 is die-bonded in the concave portion 1A of the substrate 1. At this point, the upper surface 1B of the substrate 1 contacts a surface 501A of the jig 501. Thus, the image pickup plane of the CCD bare chip 12 is aligned to the height of the upper surface 1B of the substrate 1.

Next, as shown in FIG. 35D, the blank portions 11A of the lens portion 10 are fitted to the corners of the concave portion 1A of the substrate 1. As shown in FIG. 35E, the filler 20 is filled between the outer periphery of each leg portion 11 and the upper surface of the substrate 1 so that the leg portions 11 and the substrate 1 are bonded.

In this embodiment, since the CCD bare chip 12 has been die-bonded in the concave portion 1A, the height of the image pickup plane of the CCD bare chip 12 can be accurately aligned. However, the mounting accuracy on the horizontal plane (XY plane) slightly deteriorates. Nevertheless, since the leg portions 11 of the lens portions 10 can be spaced apart from the image pickup plane of the CCD bare chip 12, the lens portion 10 can be easily mounted without interference of bonding wires of the CCD bare chip 12. In addition, improper light reflection on the leg portions 11 can be reduced.

Figure 36:
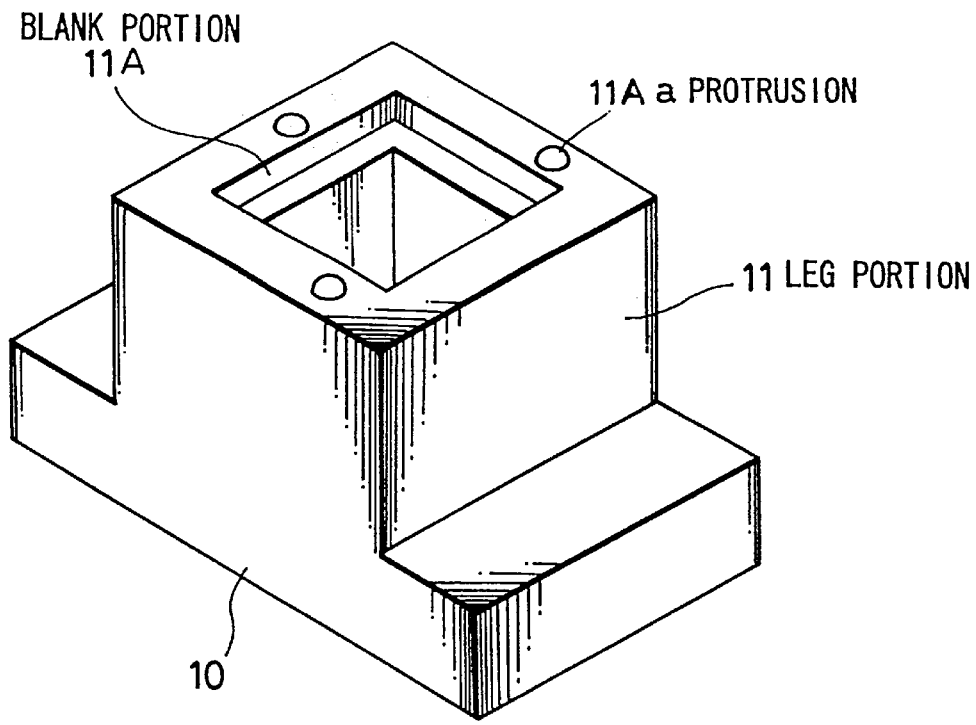
FIG. 36 is a schematic diagram showing an example of the structure of the lens portion shown in FIG. 34.
Figure 37:
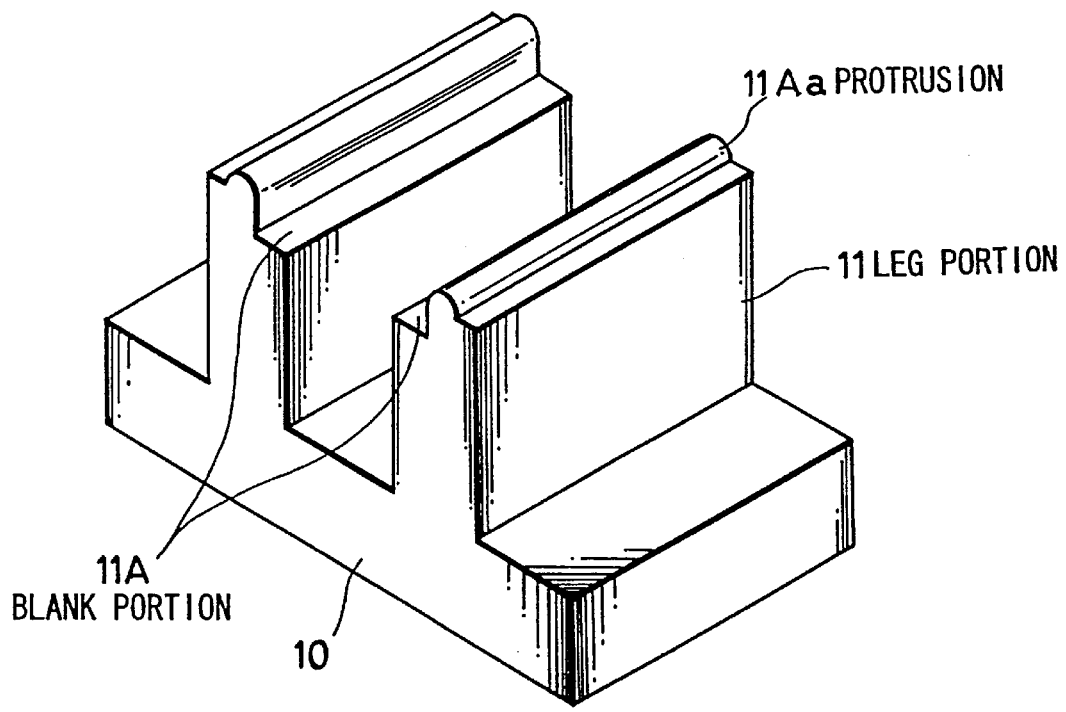
FIG. 37 is a schematic diagram showing another example of the structure of the lens portion shown in FIG. 34.

As an alternative structure, as shown in FIG. 36, the lens portion 10 may have a leg portion formed in a box shape so as to prevent dust or the like from entering the inside of the lens portion 10. At this point, as shown in FIG. 36, the bottom surface of the leg portion 11 may have protrusions 11Aa. As another alternative structure, as shown in FIG. 37, the lens portion 10 may has two opposite leg portions. In this case, the bottom surface of each leg portion 11 may have a cylindrical protrusion 11Aa.

Figure 38:
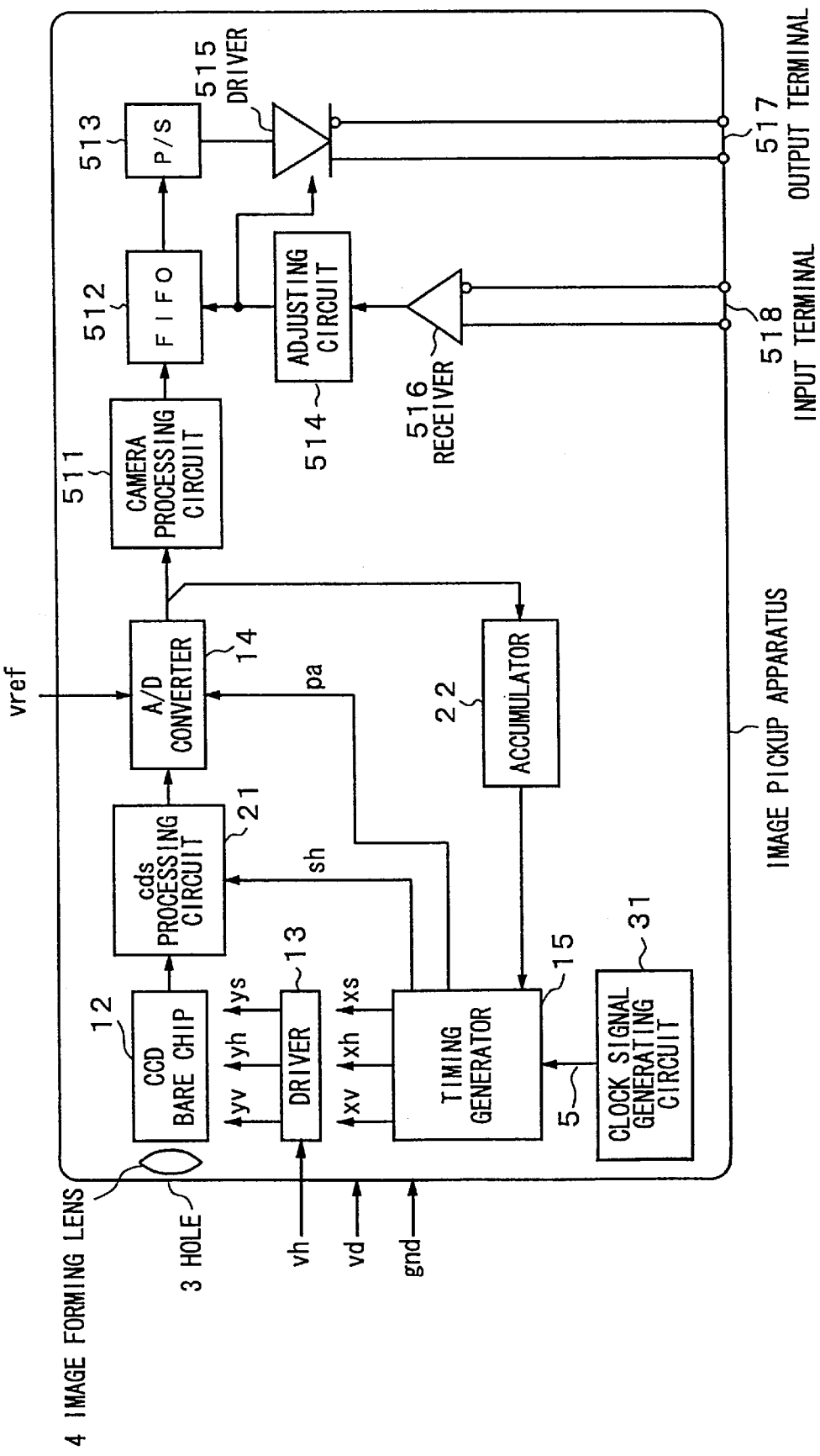
FIG. 38 is a block diagram showing another example of the structure of the image pickup apparatus.

FIG. 38 shows another example of the structure of the image pickup apparatus shown in FIG. 25. In this embodiment, the clock signal generating circuit 31 shown in FIG. 25 is housed in the image pickup apparatus. In addition, a camera processing circuit 511 is disposed instead of the memory 16. The output signal of the A/D converter 14 is supplied to the camera processing circuit 511. The camera processing circuit 511 generates a luminance signal and color difference signals or RGB signals. The camera processing circuit 511 may have an encoder that converts an image signal into for example NTSC format video data. The output signal of the camera processing circuit 511 is supplied to a FIFO memory 512. The FIFO memory 512 temporarily stores the signal supplied from the camera processing circuit 511 and outputs it at a predetermining timing. Data read from the FIFO memory 512 is supplied to a parallel/serial (P/S) converter 513. The parallel/serial converter 513 converts parallel data into serial data and outputs the serial data as normal phase data and reverse phase data from an output terminal 517 through a driver 515. On the other hand, normal phase data and reverse phase data supplied from an input terminal 518 are supplied to a receiver 516. The receiver 516 removes same phase components from the input signal and supplies the resultant signal to a coordinating circuit 514. The coordinating circuit 514 controls the FIFO memory 512 corresponding to input control data so that data supplied from the camera processing circuit 511 is written to the FIFO memory 512 and data written to the FIFO memory 512 is read therefrom at a predetermined timing. In addition, the coordinating circuit 514 controls the driver 515 so that the driver 515 outuputs data supplied from the parallel/serial converter 513.

The driver 515 and the receiver 516 are based on serial bus standard defined in IEEE 1394. Alternatively, the driver 515 may be based on USD.

Since serial data is output or input, the size of the image pickup apparatus does not increase in comparison with the structure of which parallel data is output or input.

The operations of the A/D converter 14 and portions that precede are the same as those of the embodiment shown in FIG. 25. For preventing redundancy, their description is omitted.

[Second Embodiment]

Figure 39:
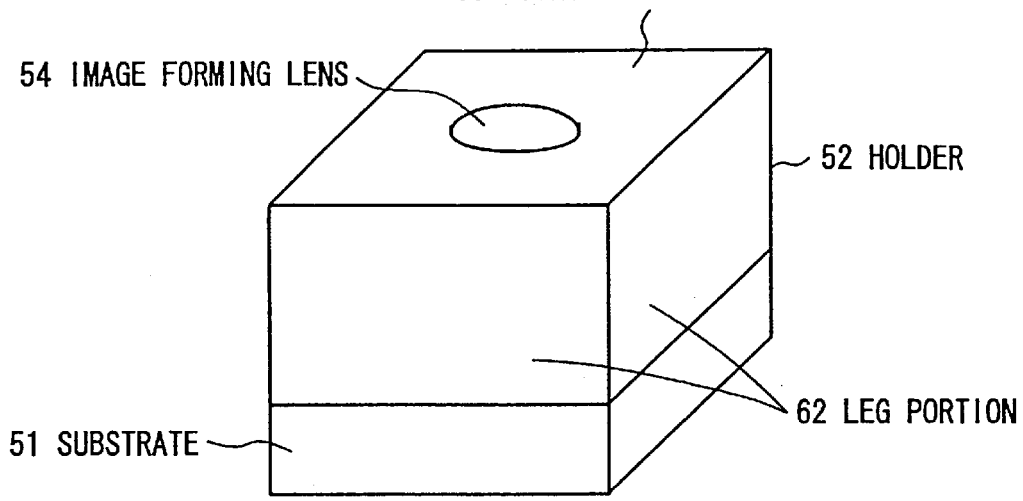
FIG. 39 is a perspective view showing the structure of the image pickup apparatus according to another embodiment.

FIG. 39 is a perspective view showing the structure of an image pickup apparatus according to a second embodiment of the present invention. In this image pickup apparatus, as with the first embodiment thereof, a holder (package) 52 is mounted (fitted) to a substrate 51. Thus, the substrate 51 and the holder 52 are integrally formed. However, in the second embodiment, one image forming lens 54 that forms an image is disposed at the top of the holder 52 so as to decrease the size, weight, and cost of the apparatus in comparison with the image pickup apparatus according to the first embodiment (thus, the holder 52 is equivalent to the lens portion 10 in the first embodiment). In addition, only a CCD bare chip 12 (see FIGS. 40 to 42) that converts light imaged by the image forming lens 54 into an electric signal and outputs an image signal as the electric signal is disposed on the substrate 51. The holder 52 is composed of a transparent material (for example, transparent plastic (such as PMMA)). A light insulating film 61 that prevents unnecessary peripheral rays from entering the CCD bare chip 12 is formed (coated) on the outer portion of the holder 52 other than the image forming lens 54. The CCD bare chip 12 in the second embodiment is the same as that in the first embodiment.

Figure 40:
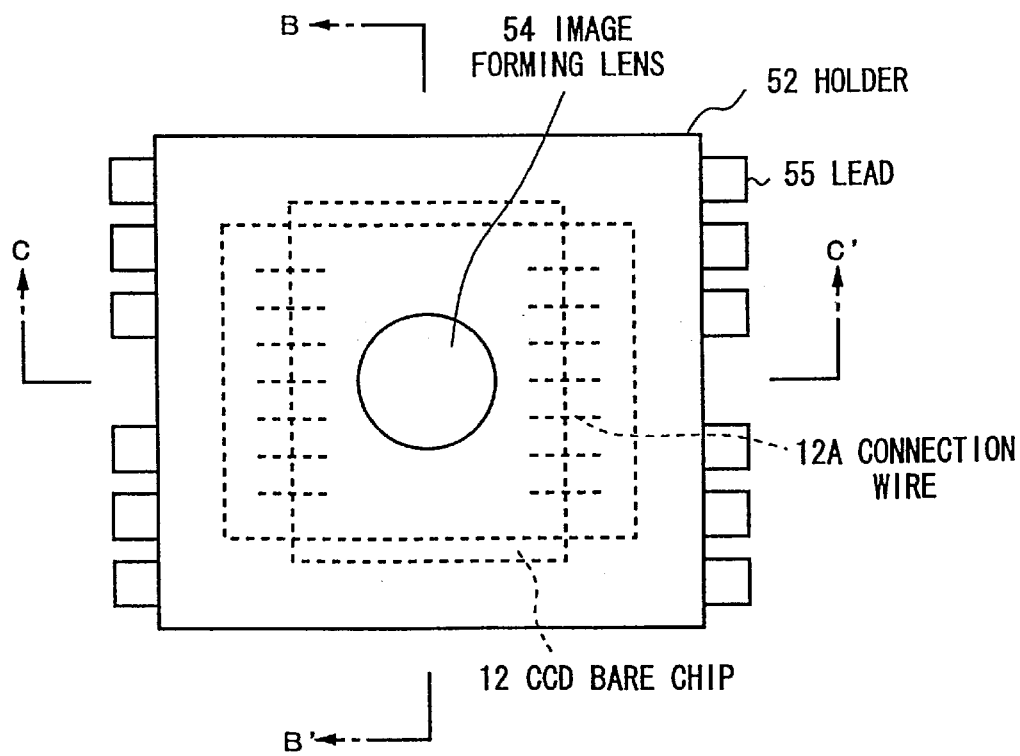
FIG. 40 is a plan view showing the image pickup apparatus shown in FIG. 39.
Figure 41:
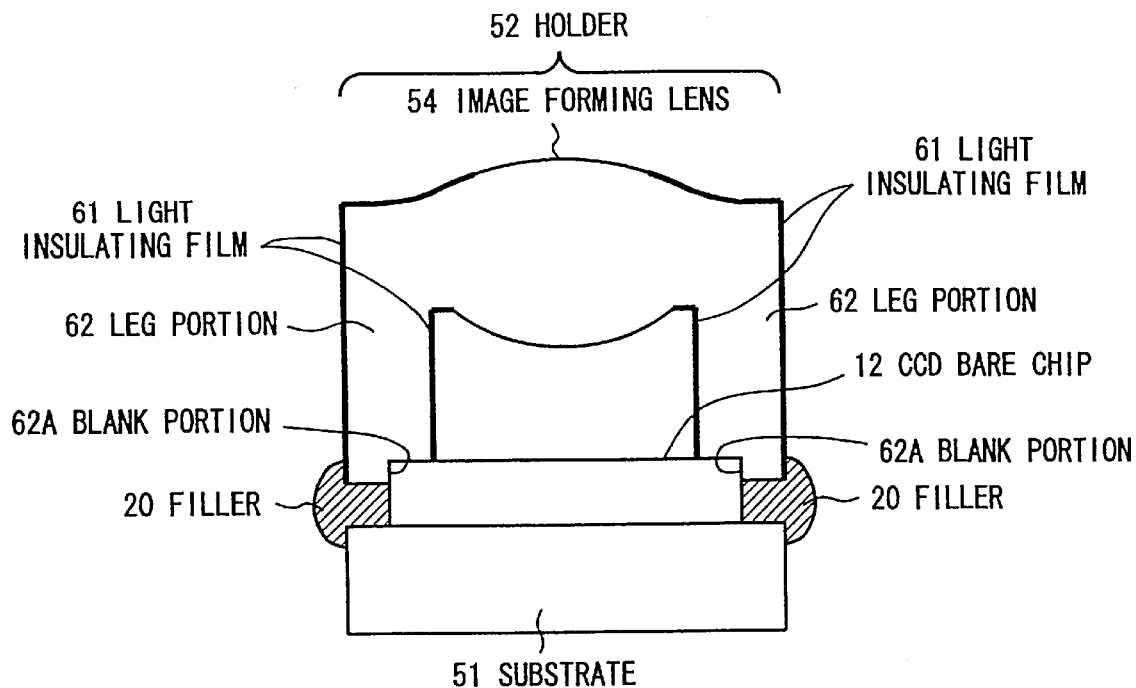
FIG. 41 is a sectional view taken along line B–B' of the image pickup apparatus shown in FIG. 40.
Figure 42:
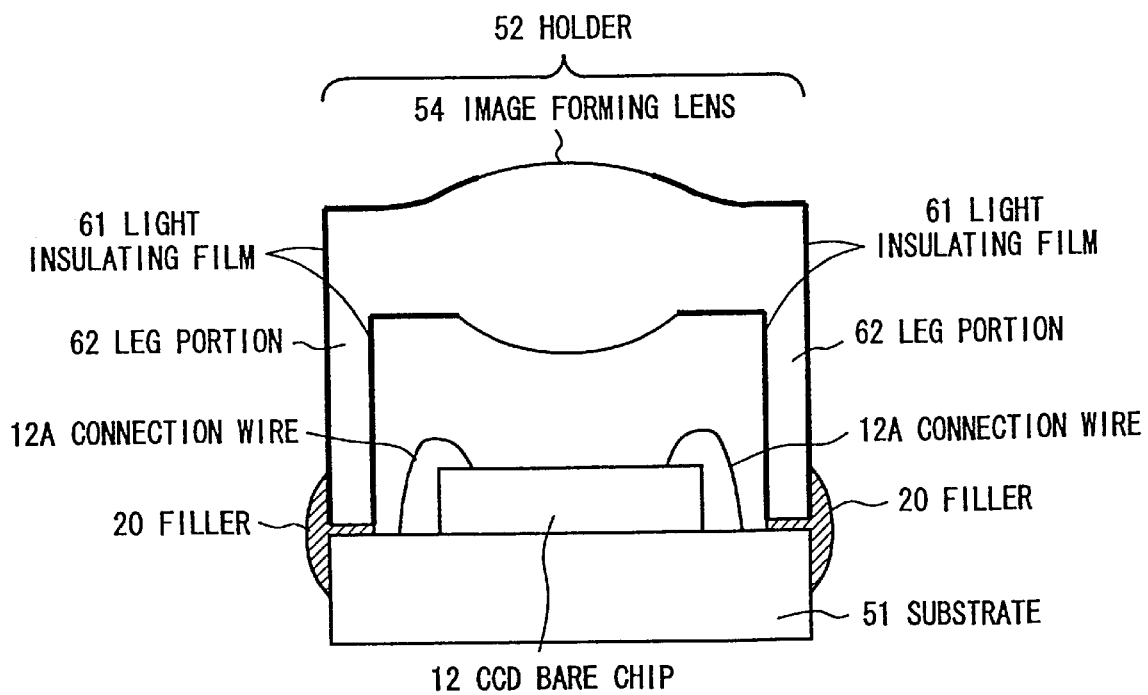
FIG. 42 is a sectional view taken along line C–C' of the image pickup apparatus shown in FIG. 40.

FIG. 40 is a plan view showing the image pickup apparatus shown in FIG. 39. FIGS. 41 and 42 are sectional views taken along line B–B' and line C–C' of FIG. 39, respectively. As described above, only the CCD bare chip 12 is disposed on the substrate 51. When the holder 52 is disposed to the substrate 51, the CCD bare chip 12 is placed so that it faces the image forming lens 54 structured as part of the holder 52.

As with the substrate 1, leads 55 that output and input signals to/from the outside of the apparatus are disposed on the side surfaces of the substrate 51. For simplicity, in FIGS. 39, 41, and 42, the leads 5 are omitted.

Connection wires extend from the CCD bare chip 12 disposed on the substrate 51 so as to exchange signals. The connection wires 12A are connected to predetermined leads 55.

As described above, the holder 52 is composed of a transparent material. The holder 52 is formed in a box shape whose horizontal section is rectangular (the bottom of the holder 52 is open). An image forming lens 54 as a single element lens is disposed at the center on the bottom surface of the holder 52 (at the top of the image pickup apparatus). The outer surface and the inner surface of the holder 52 except for the portion of the image forming lens 54 are coated with a light insulating paint. Alternatively, a light insulating means is taken. Thus, a light insulating film 61 is formed.

As shown in FIG. 40, the length of the sides with the connection wires 12A of the CCD bare chip 12 (the sides in the vertical direction in FIG. 40) is longer than the length of the sides without the connection wires 12A (the sides in the horizontal direction in FIG. 40). Thus, the distance between opposite leg portions in the horizontal direction shown in FIG. 40 is short as shown in FIG. 41. In contrast, the length between opposite leg portions in the vertical direction shown in FIG. 40 is long as shown in FIG. 42. The opposite leg portions 62 are internally blanked out. Thus, blank portions 62A are formed. The blank portions 62A accurately fit the two vertical sides of the CCD bare chip 12.

In this embodiment, the holder 52 is composed by molding for example transparent plastics (thus, as with the image forming lens 4, the image forming lens 54 is a plastic mold single element lens). Consequently, the relative accuracy of the size of each portion of the holder 52 against the principal point of the image forming lens 54 is sufficiently high.

Since the blank portions 62A of the two opposite leg portion 62 fit the two vertical sides of the CCD bare chip 12 shown in FIG. 40, the leg portions 62 directly contact the CCD bare chip 12. The length of the opposite leg portions 62 (the length in the vertical direction shown in FIG. 41) is slightly smaller than the length of the other opposite leg portions 62 (the length in the vertical direction shown in FIG. 42). Thus, while the lower edges of the opposite leg portions 62 (see FIG. 41) are slightly spaced apart from the substrate 51, the blank portions 62 (the length in the vertical direction shown in FIG. 42). Thus, while the lower edges of the opposite leg portions 62 (see FIG. 41) are slightly spaced apart from the substrate 51, the blank portions 62A directly contact the light receiving plane and the side surfaces of the CCD bare chip 12 with some pressure (thus, the leg portions 62 shown in FIG. 41 stand on the CCD bare chip 12). After the holder 52 is fitted to the substrate 51, with a predetermined pressure, the filler 20 is filled in spaces between the substrate 51 and the holder 52. Thus, a pressure takes place between the leg portions 62 and the substrate 51.

The length of the other opposite leg portions 62 shown in FIG. 42 is slightly larger than that of the opposite leg portions 62 shown in FIG. 41 so that when the blank portions 62A touch the light receiving plane of the CCD bare chip 12, the lower portion thereof does not contact the substrate 51. Thus, the substrate 51 and the holder 52 are bonded so that the opposite leg portions 62 shown in FIG. 41 accurately contact the CCD bare chip 12.

The optical characteristics of the image forming lens 54 and the size (length) of the leg portions 62 (shown in FIG. 41) that contact the CCD bare chip 12 are the same as those shown in FIGS. 14 and 15.

Thus, in the second embodiment, since the substrate 51 that has the CCD bare chip 12 and the holder 61 that has the image forming lens 54 and the light insulating film 61 with the diaphragm effect are integrally formed, the image pickup apparatus can be easily mounted and handled. Consequently, the fabrication cost of the apparatus can be decreased.

In addition, the relative accuracy of the size of each portion of the holder 52 is sufficiently high against the principal point of the image forming lens 54. On the other hand, since the opposite leg portions 62 shown in FIG. 41 directly contact the light receiving plane of the CCD bare chip 12, as with the image forming lens 4 in the first embodiment, the image forming lens 54 can be accurately disposed without necessity of a special adjustment operation. Thus, the size and weight of the image pickup apparatus can be decreased.

In addition, the holder 52 has the image forming lens 54 as a part thereof and the substrate 51 has only the CCD bare chip 12, the size, weight, and cost of the image pickup apparatus according to the second embdoiment can be more decreased than those of the apparatus according to the first embodiment.

Moreover, as shown in FIG. 42, since the length of the opposite leg portions 62 of the holder 52 is larger than the length in the horizontal direction of the CCD bare chip 12 shown in FIG. 40, the connection wires 12A can be easily routed.

Next, the fabrication method of the image pickup apparatus shown in FIGS. 39 to 42 will be described. The CCD bare chip 12 is mounted on the substrate 51. In addition, the leads are disposed. When necessary, the connection wires 12A of the CCD bare chip 12 are connected to the leads 55. The holder 52 having the image forming lens 54 and the leg portions 62 with the blank portions 62A is molded with a transparent material. Thereafter, the light insulating film 61 is formed. While the opposite leg portions 62 are placed on the CCD bare chip 1, the filler 20 is filled thereto as shown in FIGS. 41 and 42 so that the substrate 51 and the holder 52 are integrally formed.

As with the first embodiment, when the substrate 51 and the holder 52 are integrally formed, since no special adjustment is required, the image pickup apparatus can be easily fabricated at low cost.

Figure 43:
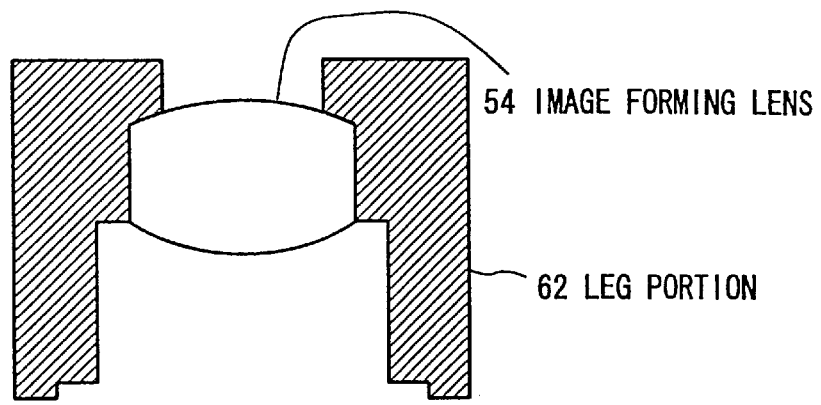
FIG. 43 is a schematic diagram showing another forming example of the holder.

In this case, with a transparent material and a light insulating material, the holder 52 (image forming lens 54) can be molded. Thus, as shown in FIG. 43, the image forming lens 54 can be composed of the transparent material. The leg portions 62 can be composed of the light insulating material.

Figure 44:
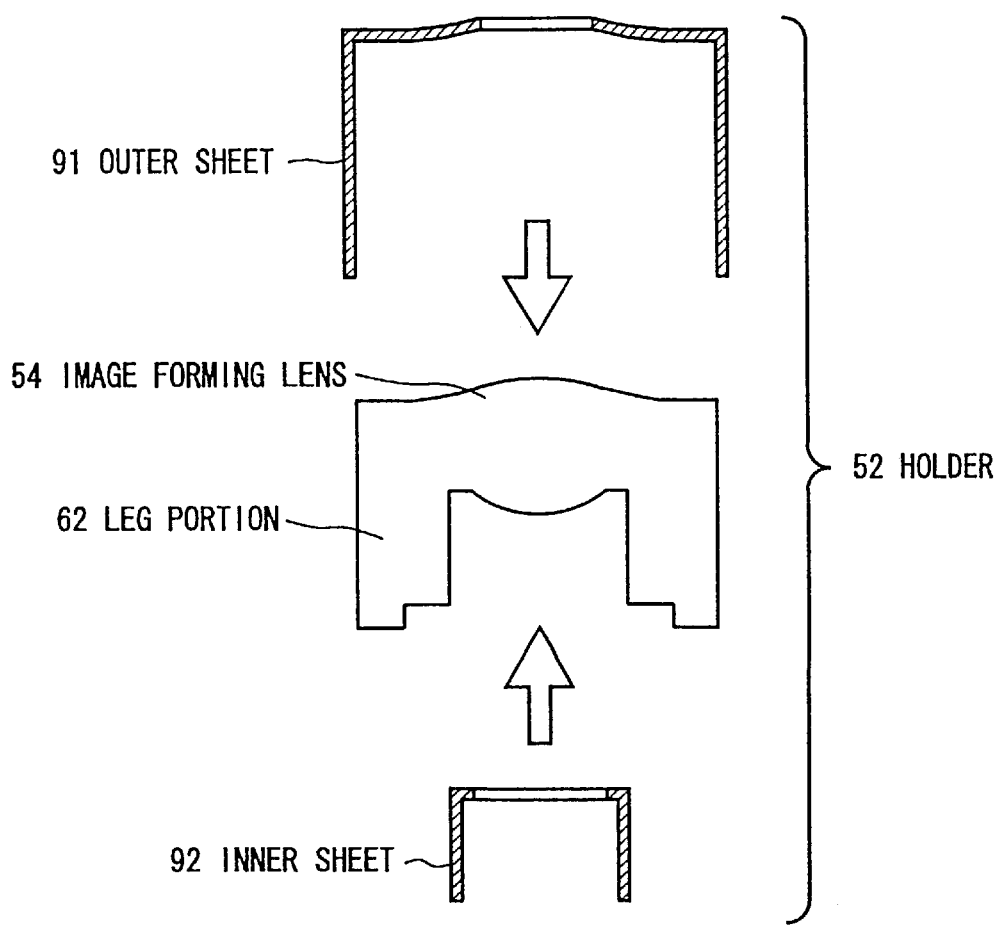
FIG. 44 is a schematic diagram showing a further other forming example of the holder.

Alternatively, as shown in FIG. 44, with the transparent material, the image forming lens 54 including the leg portions 62 may be formed. In addition, an outer sheet 91 and an inner sheet 92 may be coated outside and inside the resultant structure. Thus, the holder 52 may be formed. In this case, the outer sheet 91 and the inner sheet 92 are composed of the light insulating material corresponding to the shapes of the outer periphery and the inner periphery of the holder 52. As another alternative method, instead of the outer sheet 91 and the inner sheet 92, the outer surface and the inner surface of the holder 54 may be painted in black.

Figure 45:
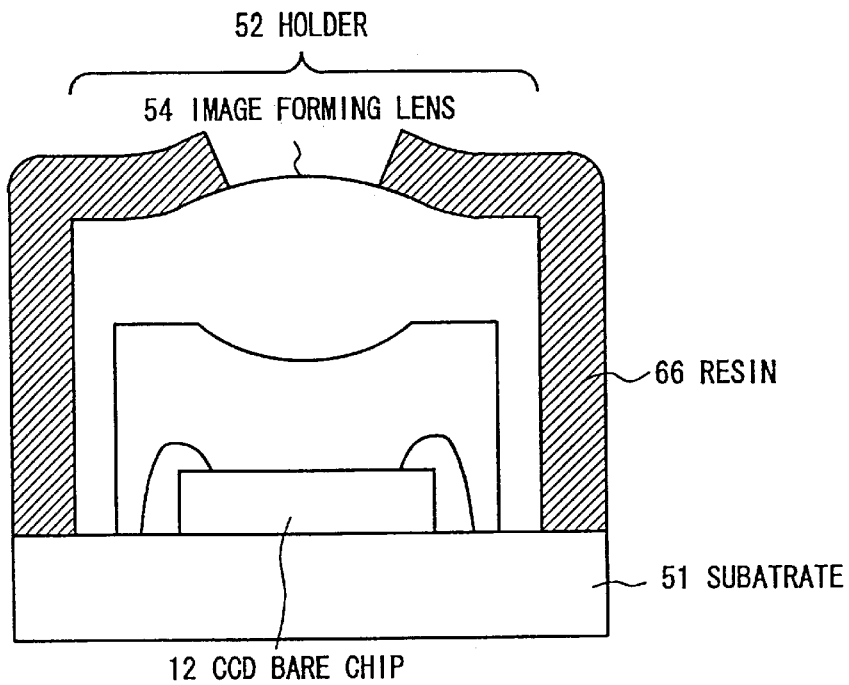
FIG. 45 is a schematic diagram showing another forming example of the holder.

As another alternative method, as shown in FIG. 45, the CCD bare chip 12 is disposed on the substrate 51. In addition, the image forming lens 54 is disposed on the substrate 51. In this state, the outer periphery of the substrate 51 and the image forming lens 54 is molded with a black resin 66.

In the image pickup apparatus, the signal that is supplied from the driver 13 shown in FIG. 25 is input from the outside of the apparatus through a lead 55. Thus, when necessary, an image signal obtained through a lead 55 is processed outside the apparatus.

In the second embodiment, as the photoelectric converting device that converts light emitted from the image forming lens 54 into an electric signal, the CCD bare chip 12 is used. However, as the photoelectric converting device, as was described in the first embodiment, for example a destructive reading type image pickup device and another type device may be used.

Figure 46:
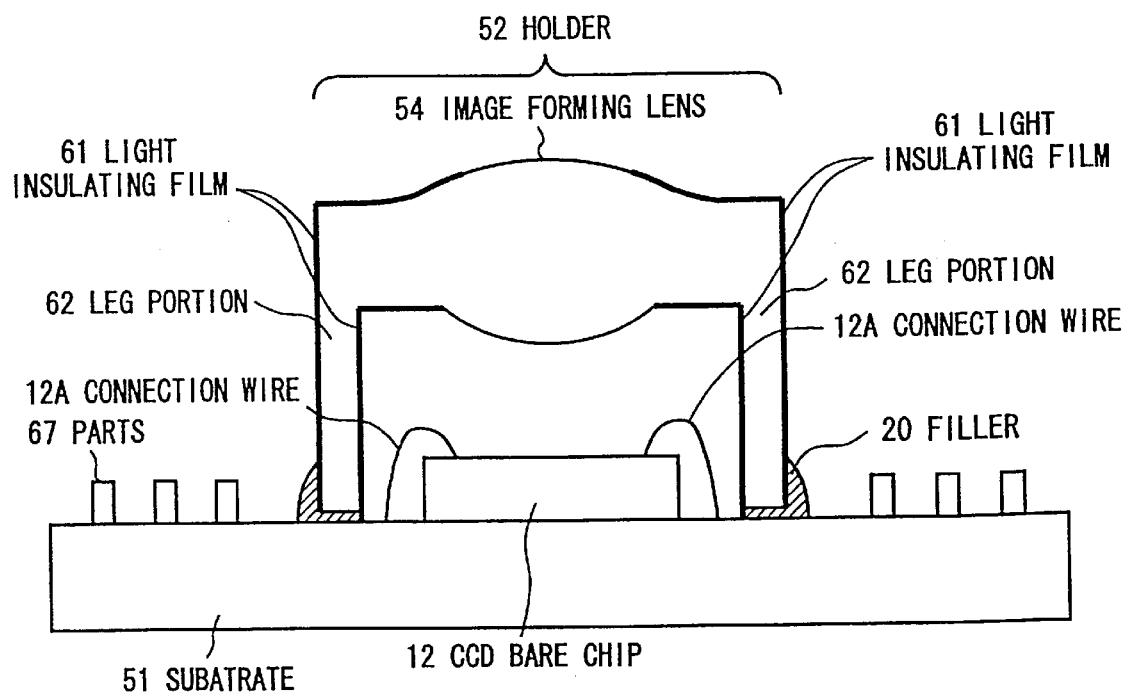
FIG. 46 is a schematic diagram showing a modification of the embodiment shown in FIG. 42.

In addition, as shown in FIG. 46, the size of the substrate 51 according to the embodiment shown in FIG. 42 can be increased as shown in FIG. 46 so that various parts 67 can be disposed on the substrate 51.

Figure 47:
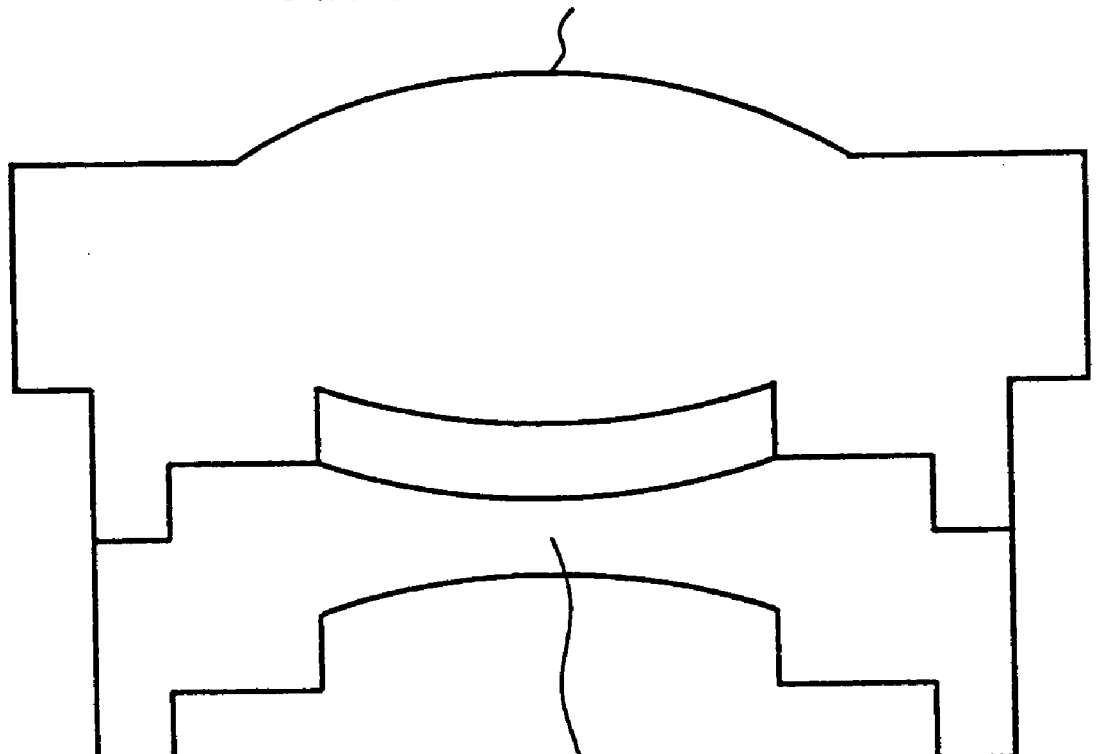
FIG. 47 is a schematic diagram showing another example of the structure of the image forming lens.

Moreover, as the image forming lens, as shown in FIG. 47, an image forming lens 54A (convex lens) and an image forming lens 54B (concave lens) may be used. Of course, three or more image forming lens may be used.

[Third Embodiment]

Figure 48:
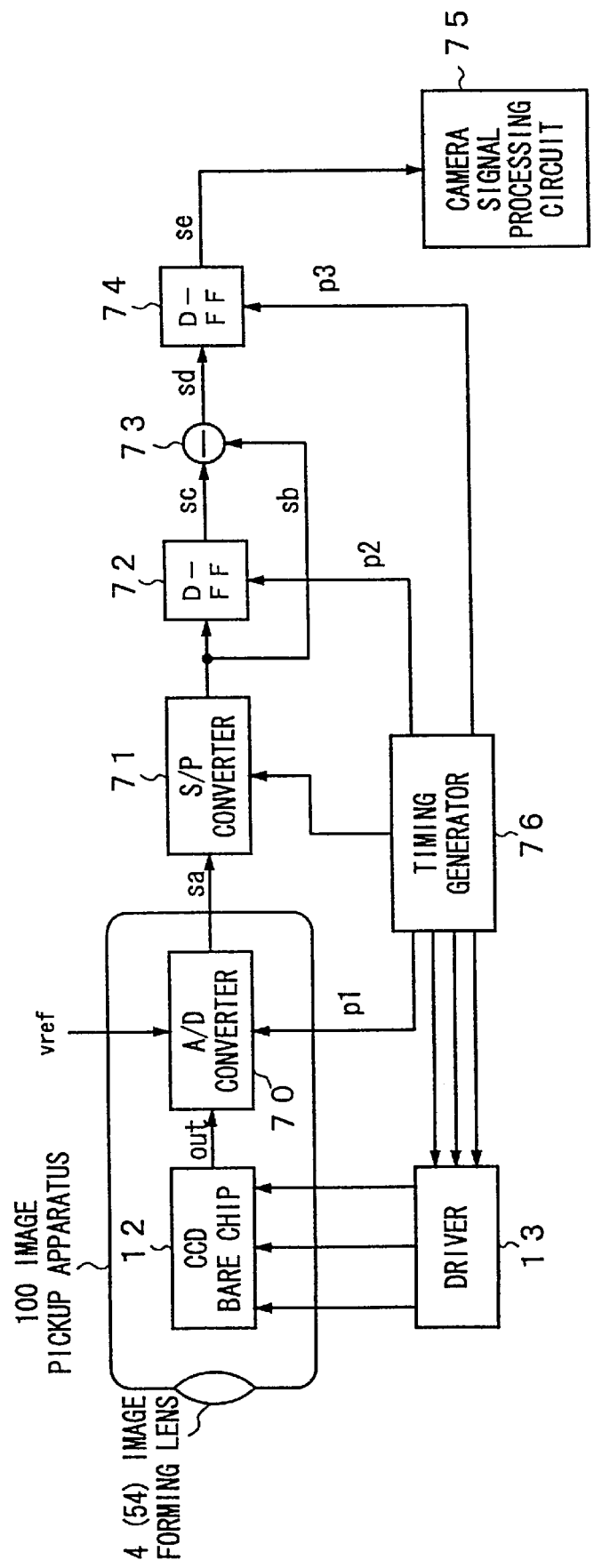
FIG. 48 is a block diagram showing an example of the structure of a video camera according to the present invention.

FIG. 48 is a schematic diagram showing an example of the structure of a video camera having an image pickup apparatus 100 corresponding to the present invention. In FIG. 48, portions similar to those in FIG. 25 are denoted by similar reference numerals. The structure of the image pickup apparatus 100 according to the third embodiment is the same as those according to the first and second embodiments. However, a CCD bare chip 12 and an A/D converter 70 are disposed on a substrate 1 (or 51). The structure of the image pickup apparatus 100 according to the third embodiment is the same as the structure of that according to the first embodiment.

The A/D converter 70 is a serial output type A/D converter that converts an analog image signal supplied from the CCD bare chip 12 into a digital image signal corresponding to a sampling clock signal p1 with the half period of the output period of the analog image signal.

The A/D converter 70 determines the number of bits assigned to a sample value corresponding to a reference voltage vref supplied from the outside of the apparatus.

The A/D converter 70 may be a parallel output type A/D converter that outputs sampled image data as parallel data (in this case, an S/P converter 71 that will be described later can be omitted). However, when the parallel output type A/D converter is used as the A/D converter 70, leads 7 corresponding to the number of bits of image data that is output as parallel data should be provided. On the other hand, when the A/D converter 70 is the serial output type A/D converter, the number of leads 5 necessary for outputting image data can be reduced to one. Thus, when the serial output type A/D converter is used as the A/D converter 70, the size of the image pickup apparatus 100 can be decreased.

An S/P (Serial/Parallel) converter 71 converts serial image data supplied from the image pickup apparatus 100 (A/D converter 70) into parallel image data and outputs the resultant data to a D-FF (delay type flip-flop) 72 and a subtracting circuit 73. The D-FF 72 delays image data supplied from the S/P converter 71 corresponding to a clock signal p2 with the same period as the sampling clock signal p1 and outputs the resultant signal to the subtracting circuit 73. The subtracting circuit 73 calculates the difference between the image data supplied from the S/P converter 71 and the output data of the D-FF 72 and supplies the difference data to a D-FF 74. The D-FF 74 latches every second difference value supplied from the subtracting circuit 73 corresponding to a clock signal p3 with a period twice larger than the clock signal p2 (thus, the period of the clock p3 is the same as the output period of pixels) and supplies the resultant difference data to a camera signal processing circuit 75.

The camera signal processing circuit 75 performs a predetermined signal process for the output signal of the D-FF 74.

A timing generator 76 generates various timing signals corresponding to a clock signal supplied from a clock signal generating circuit (not shown). In other words, the timing generator 76 generates a timing signal for driving the CCD bare chip 12 as with the timing generator 15 shown in FIG. 25 and supplies the timing signal to a driver 13. In addition, the timing generator 76 generates the clock signals with the above-described periods and supplies these signals to the A/D converter 70, the D-FF 72, and the D-FF 73, respectively. Moreover, the timing generator 76 generates the clock signal for the S/P converter 71 and supplies the clock signal thereto. The various timing signals supplied from the timing generator 76 mutually synchronize (namely, the timing signals synchronizes with the clock signal supplied from the clock signal generating circuit).

Next, with reference to a timing chart shown in FIG. 49, the operation of the apparatus according to the third embodiment will be described. Light emitted from an object is entered into an image forming lens 4. The resultant light is imaged on a light receiving plane of a CCD bare chip 12 by the image forming lens 4. The CCD bare chip 12 converts the light into an electric signal and supplies an image signal out as the electric signal to an A/D converter 70 corresponding to a timing signal supplied from a driver 13. FIG. 49A shows the image signal out supplied from the CCD bare chip 12.

The A/D converter 70 converts the image signal out supplied from the CCD bare chip 12 into a digital signal corresponding to a leading edge of a sampling clock signal p1 (see FIG. 49B) with the half period of the image signal out. The resultant digital data sa (see FIG. 49C) is supplied as serial data to the S/P converter 71. The S/P converter 71 converts the serial image data sa supplied from the A/D converter 70 into parallel image data sb (see FIG. 49E) and supplies the parallel image data sb to the D-FF 72 and the subtracting circuit 73.

The S/P converter 71 takes the time period for one clock pulse to perform the converting process. Thus, the image data sb (see FIG. 49E) delays for one clock pulse against the image data sa (see FIG. 49C).

The D-FF 72 latches the image data supplied from the S/P converter 71 corresponding to for example a leading edge of the clock signal p2 (see FIG. 49D) with the same period as the sampling clock signal p1 supplied from the timing generator 76 and thereby delays the image data sb for one clock pulse. The resultant data is output as the image data as shown in FIG. 49F to the subtracting circuit 73.

The clock signal p2 with the same period as the sampling clock signal p1 has the half period of the image signal out supplied from the CCD bare chip 12. Thus, the phase of the image data sc that has a delay of one period of the clock signal p2 has a delay of the period of the half of a pixel pitch of the CCD bare chip 12. Hereinafter, the image data sc is referred to as half pixel delay data sc.

The subtracting circuit 73 subtracts the half pixel delay data sc, which is supplied from the D-FF 72, from the pixel data sb, which is supplied from the S/P converter 71, and supplies the subtracted value (difference value) sd (see FIG. 49G) to the D-FF 74. The D-FF 74 receives the subtracted value sd supplied from the subtracting circuit 73 through the timing generator 76. The subtracted value sd is latched corresponding to for example a leading edge of the clock signal p3 (see FIG. 49H) with the period twice larger than the period of the clock signal p2. Thus, the image data se shown in FIG. 49I is supplied to the camera signal processing circuit 75. In other words, the D-FF 74 latches every second subtracted value sd supplied from the subtracting circuit 73 and supplies the resultant subtracted value sd to the camera signal processing circuit 75.

Figure 50:
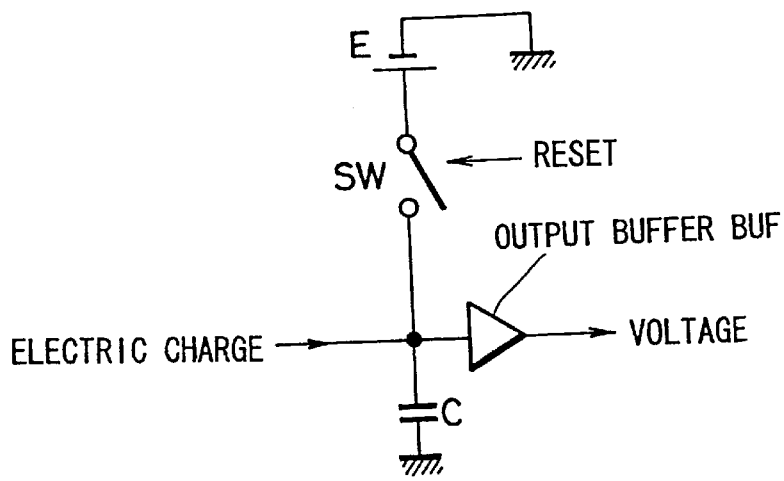
FIG. 50 is a schematic diagram showing an example of the inner structure of the CCD bare chip 12.

FIG. 50 shows an example of the internal structure of the CCD bare chip 12 (namely, an example of the structure of an FDA (Floating Diffusion Amplifier). Electric charge generated on the light receiving plane of the CCD bare chip 12 is charged to a condenser C. Thus, a voltage change corresponding to the electric charge stored in the condenser C is supplied as an image signal from an output buffer BUF. When a switch SW is turned on, a positive voltage E is applied to the condenser C. Thus, the condenser C is discharged (charged to the reference voltage). When the switch SW is turned off, the condenser can charge electric charge corresponding to the next pixel.

The CCD bare chip 12 repeats the above-described process and thereby supplies an image signal. However, when the switch SW is turned on/off, thermal noise takes place. Thus, a voltage corresponding to the thermal noise is stored in the condenser C. So-called 1/f noise (fluctuation noise) takes place in the output buffer BUF. Thus, when the switch SW is turned on and then off (this switch operation is referred to as reset operation), the output level of the output buffer BUF after the reset operation (this level is hereinafter referred to as pre-charge level) does not become the predetermined reference level (for example, black level), but an abnormal level that is affected by the thermal noise and 1/f noise (these noise types are referred to as a noise component).

To solve such a problem, before the A/D converting process is performed for the output signal of the CCD bare chip 12, the above-described correlative double sampling process is performed for the output signal of the CCD bare chip 12 so as to obtain an image signal of which a noise component is suppressed.

However, when the size of the image pickup apparatus 100 that has the CCD bare chip 12 should be sufficiently decreased and digital image data output should be obtained, if the image pickup apparatus 100 has the cds processing circuit 21 that performs the correlative double sampling process for the output signal of the CCD bare chip 12, the size of the image pickup apparatus cannot be satisfactorily decreased.

To solve such a problem, in the video camera shown in FIG. 48, after the output signal of the CCD bare chip 12 is converted into digital image data by the A/D converter 70, the noise component is decreased in the following manner.

The image signal out that is supplied from the CCD bare chip 12 is composed of a pre-charge portion (represented by a dotted line in FIG. 49A) that becomes the pre-charge level and a signal portion (represented by a solid line in FIG. 49A) that becomes a signal level corresponding to electric charge charged to the condenser C. Due to the theory of noise component, the noise component contained in the signal portion and the noise component contained in the pre-charge portion are correlative. In other words, the signal level of the noise component contained in a signal portion is almost equal to the pre-charge level of the signal portion just preceding the noise component. Thus, when the pre-charge level is subtracted from the signal level of the signal portion, a real signal component of the signal portion can be obtained.

The D-FF 72, the subtracting circuit 73, and the D-FF 74 perform processes corresponding to the above-described theory for the image data sa supplied from the A/D converter 70 and thereby obtain image data from which the noise component is decreased.

In other words, the A/D converter 70 converts the image signal out supplied from the CCD bare chip 12 into a digital signal corresponding to the sampling clock signal p1 (see FIG. 49B) with the half period of the output signal out, the resultant signal becomes digital image data sa of which the signal level (vi) and the pre-charge level (fi) alternately take place as shown in FIG. 49C. In FIG. 49C (FIG. 49E, and FIG. 49F), the signal level and the pre-charge level are denoted with suffixes v and f, respectively. In addition, each pair of signal level and pre-charge level (a particular signal level and a pre-charge level just preceding the particular signal level) are assigned the same numeral.

The image data sb or half pixel delay data sc that are supplied to the subtracting circuit 73 are data of which the image data sa as parallel data is delayed for one clock period or two clock period as shown in FIGS. 49E or 49F, respectively. The subtracting circuit 73 subtracts the half pixel delay data sb from the image data sb. Thus, image data of which noise component has been decreased is obtained from the pair of signal level and pre-charge level. The resultant image is hereinafter referred to as true image data. In other words, as shown in FIG. 49G, every second data of the subtracted value sd becomes true image data as denoted with prefix v'. In FIG. 49G, v'#i (where #i is an integer) represents the calculated result of v#i–f#i, whereas x represents invalid data.

Thus, when the D-FF 74 latches every second subtracted value sd corresponding to the clock signal p3 shown in FIG. 49H, only true data se (shown in FIG. 49I) is supplied to the camera signal processing circuit 75.

In the subtracting process of the subtracting circuit 73, the number of effective bits is decreased. However, when the reference voltage vref supplied to the A/D converter 70 is properly set, the decrease of the number of bits can be almost ignored.

Figure 49:
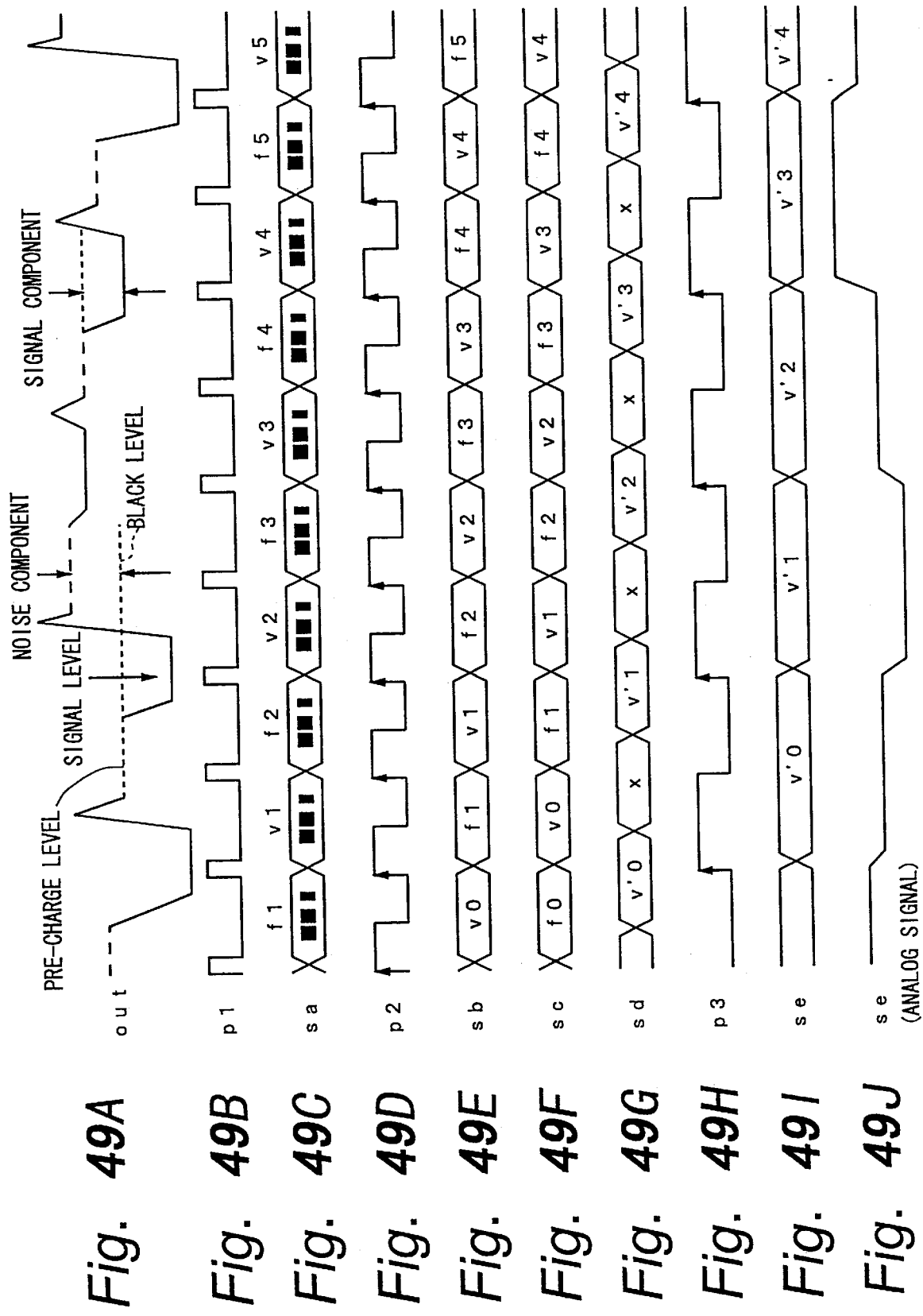
FIG. 49, comprising

The camera signal processing circuit 75 converts the image data se into an analog signal as shown in FIG. 49 and records the analog signal to a video tape or the like.

As described above, since the image pickup apparatus 100 outputs digital image data, an apparatus that has the image pickup apparatus 100 can be easily structured.

In addition, since the A/D converter 70 converts the image signal out supplied from the CCD bare chip 12 into a digital signal corresponding to the sam☐ling clock signal p1 with the half period of the image signal out, a noise component contained in the image signal can be easily decreased. Thus, it is not necessary to dispose in the image pickup apparatus a circuit that decreases such a noise component. Consequently, a small image pickup apparatus that outputs digital image data can be accomplished.

[Fourth Embodiment]

Figure 51:
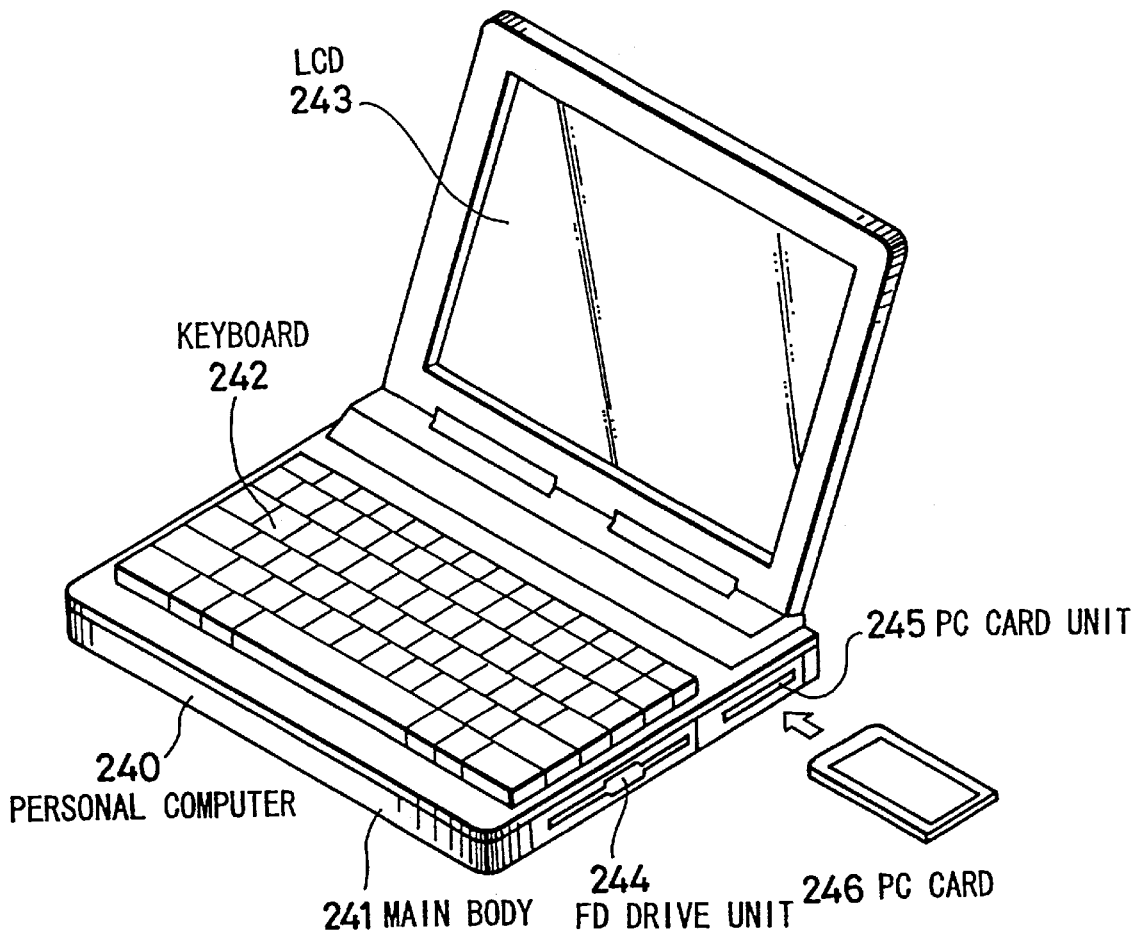
FIG. 51 is a schematic diagram for explaining the use of a PC card.

It can be considered that the above-described image pickup apparatus is mounted on a personal computer. FIG. 51 shows an appearance of such a personal computer. A keyboard 242 is disposed on the upper surface of a main body 241 of a note book type personal computer 240. An FD unit 244 and a PC card unit 245 are disposed on one side surface of the main body 241. When necessary, a PC card 246 is mounted to the PC card unit 245. When the PC card 246 is not used, it can be removed from the PC card unit 245. In addition, an LCD 243 is rotatably supported by the main body 241. The LCD 243 displays image information such as predetermined letters and graphics.

Figure 52:
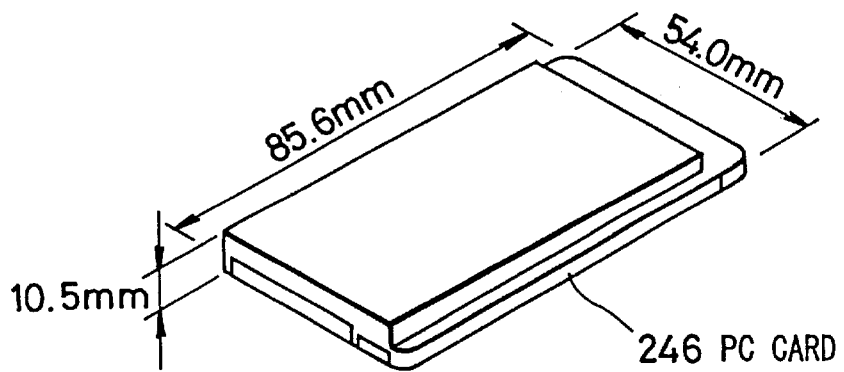
FIG. 52 is a schematic diagram showing the structure of the PC card.

FIG. 52 shows an appearance of the PC card 246. In this embodiment, the length, width, and height (thickness) of the PC card 246 are 85,6 mm, 54.0 mm, and 10.5 mm, respectively. This shape has been defined as a PCMCIA (Personal Computer Memory Card International Association) standard type III card.

Figure 53:
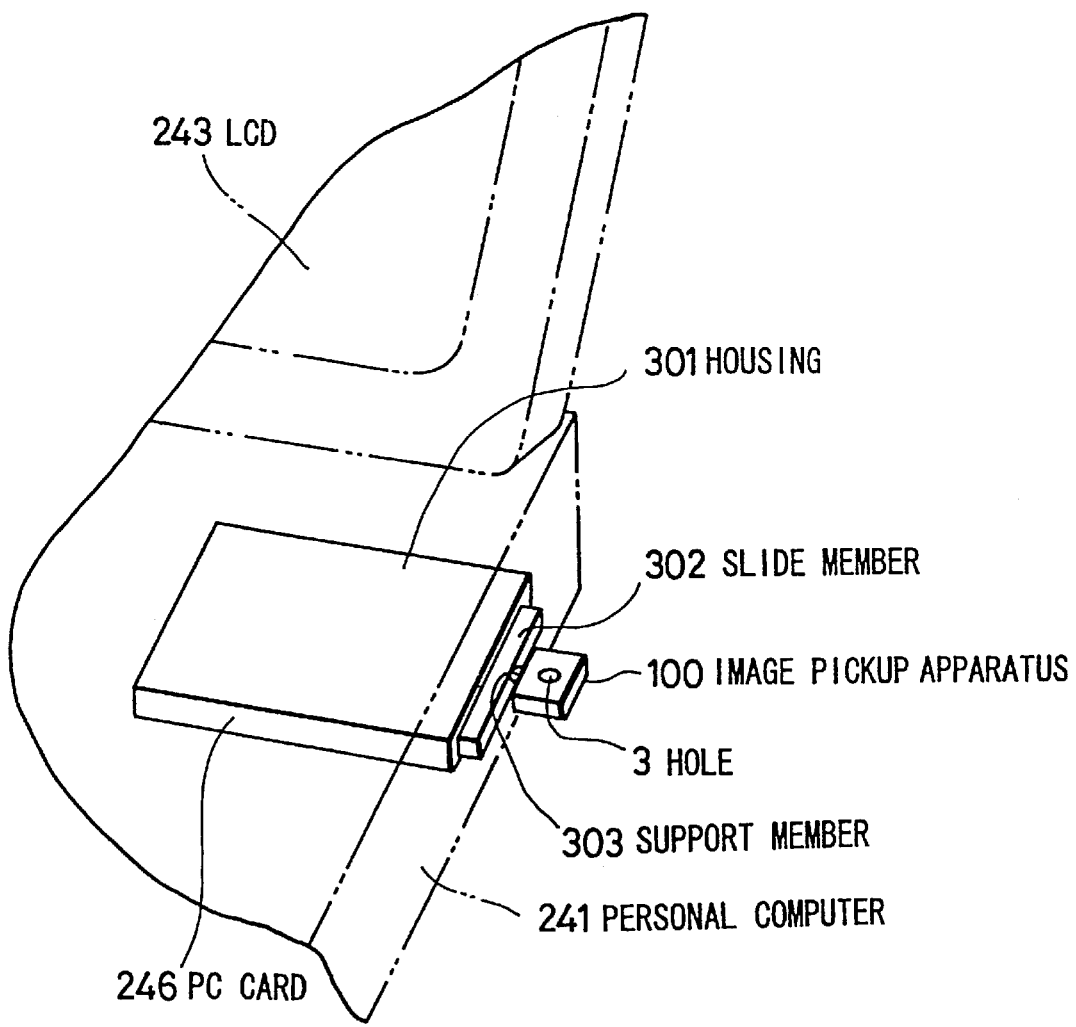
FIG. 53 is a schematic diagram showing the state of which the PC card is mounted on a personal computer.

As shown in FIG. 53, the PC card 246 has a housing 301. A slide member 302 is slidably held by the housing 301. An image pickup apparatus 100 is rotatably held by the slide member 302 through a support member 303. When the slide member 302 is inserted into the housing 301, the image pickup apparatus 100 is also fully housed in the housing 301.

Figure 54:
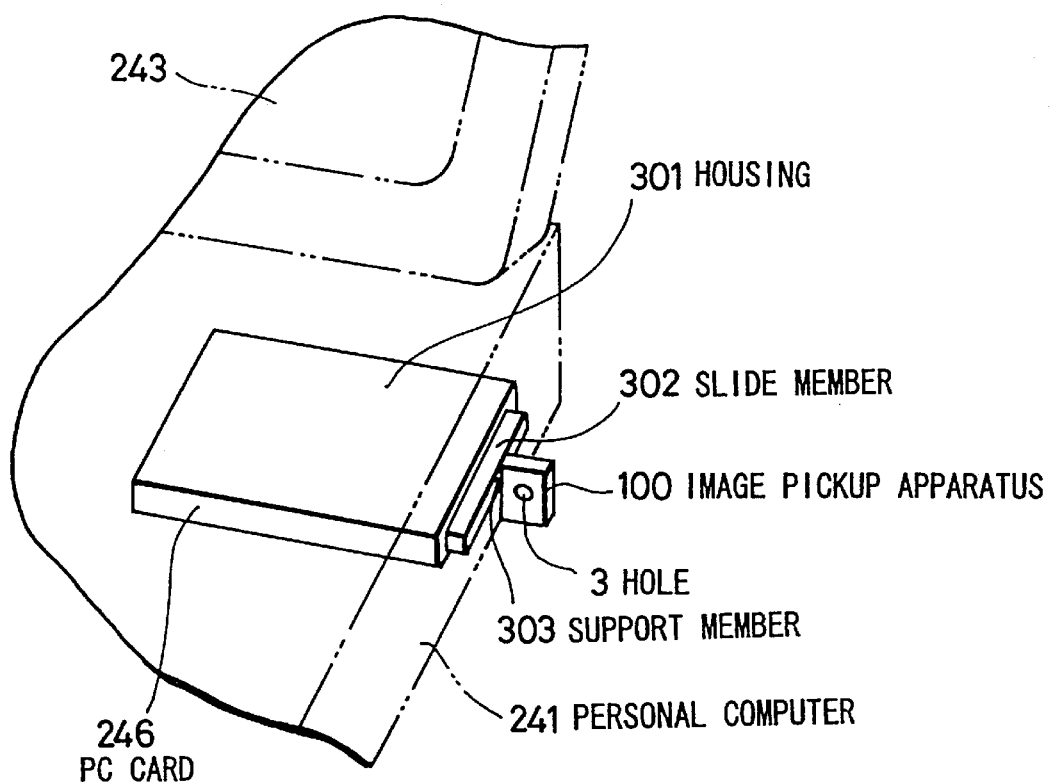
FIG. 54 is a schematic diagram for explaining the state of which the image pickup apparatus is used in the personal computer.

When the personal computer 240 is connected to a communication line such as a telephone line and the personal computer 240 is used as a TV telephone set or a TV conference system, as shown in FIG. 53, the PC card 246 is mounted to the PC card unit 245. Thereafter, the slide member 302 is outwardly slid from the housing 301 until the image pickup apparatus 100 is exposed from the personal computer 240. Next, as shown in FIG. 54, the image pickup apparatus 100 is rotated about the support member 303 by around 60 to 90 degrees so that a hole 3 (an image forming lens 4) of the image pickup apparatus 100 faces the user (object).

Figure 55:
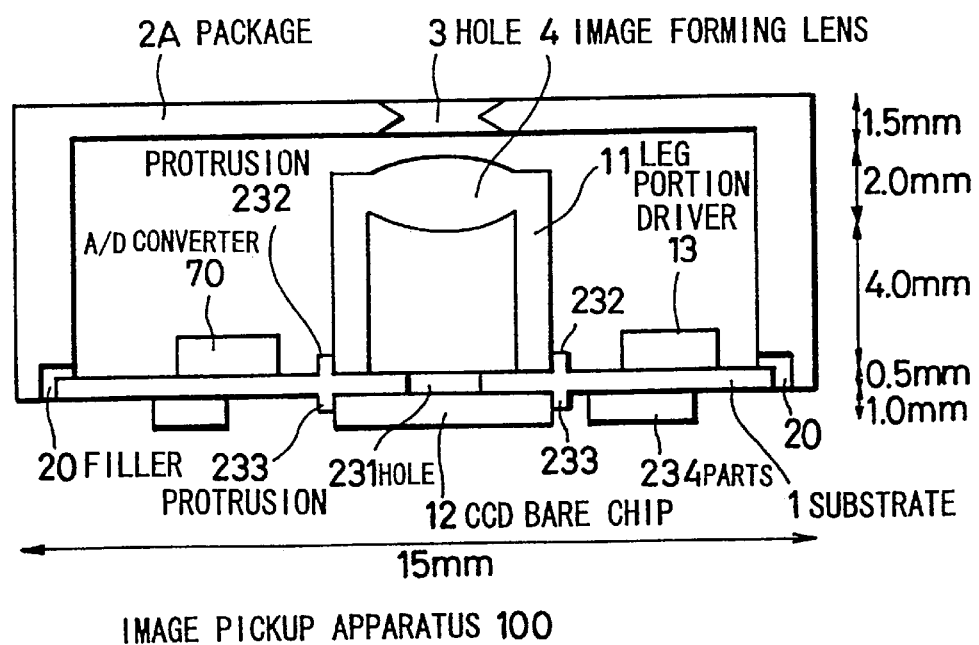
FIG. 55 is a schematic diagram showing an example of the inner structure of the image pickup apparatus shown in FIG. 53.

FIG. 55 shows an inner structure of the image pickup apparatus 100 of which the PC card 246 is housed in the housing 301 (namely, a fourth embodiment of the present invention).

The structure of the fourth embodiment is basically the same as the structure of the first embodiment shown in FIG. 6. However, in the fourth embodiment, a CCD bare chip 12 is disposed on the rear side (the opposite side of an image forming lens 4) by flip-chip mounting method so that the light receiving plane (image pickup plane) (the upper surface in FIG. 55) faces the image forming lens 4 through a hole 231 formed on the substrate 1. Protrusions 233 are formed on the substrate 1 so as to restrict the mounting position of the CCD bare chip 12.

The image forming lens 4 is disposed on the upper surface of the substrate 1 (the opposite surface of the mounting surface of the CCD bare chip 12). Protrusions 232 are formed on the substrate 1 so as to restrict the mounting position of the image forming lens 4. The CCD bare chip 12 is mounted to a predetermined position corresponding to the protrusions 233 as guides. In addition, the image forming lens 4 is mounted to a predetermined position corresponding to the protrusions 232 as guides. Thus, the image forming lens 4 and the CCD bare chip 12 are disposed at predetermined opposite positions through the hole 231 of the substrate 1.

In addition, a driver 13 and an A/D converter 14 are disposed on the upper surface of the substrate 1. Other parts 234 are disposed on the lower surface of the substrate 1.

A hole 3 that functions as a diaphragm is formed at a predetermined position of a package 2A. The package 2A is bonded to the substrate 1 with a filer 20. Light is entered into the image forming lens 4 through the hole 3. The light is condensed by the image forming lens 4 and entered into the light receiving plane (the image pickup plane) of the CCD bare chip 12.

In this embodiment, a predetermined space is formed between the package 2A and the image forming lens 4. Thus, even if an external force is applied to the package 2A, the space prevents the external forth from directly transmitting the image forming lens 4.

In this embodiment, the apparatus can be structured so that the distance from the upper edge of the package 2A to the upper edge of the image forming lens 4 is 1.5 mm, the thickness of the image forming lens 4 is 2.0 mm, the distance from the lower edge of the image forming lens 4 to the upper surface of the substrate 1 is 4.0 mm, the thickness of the substrate 1 is 0.5 mm, and the distance from the lower surface of the substrate 1 to the lower edge of the CCD bare chip 12, parts 234, and so forth disposed on the lower surface of the substrate 1 is 1.0 mm. In particular, when the CCD bare chip 12 is disposed on the main body through the substrate 1 and the image forming lens 4, the substrate 1 can be disposed within the focal length of the image forming lens 4. Thus, the thickness of the image pickup apparatus according to the fourth embodiment can be smaller than that according to the embodiment shown in FIG. 6. Thus, the total thickness of the apparatus according to the fourth embodiment becomes 9.0 mm. The horizontal length and the vertical length of the image pickup apparatus 100 can be 15 mm each. Thus, as shown in FIGS. 53 and 54, the image pickup apparatus 100 can be housed in the housing 301 of the PC card 246 whose thickness is 10.5 mm.

Figure 56:
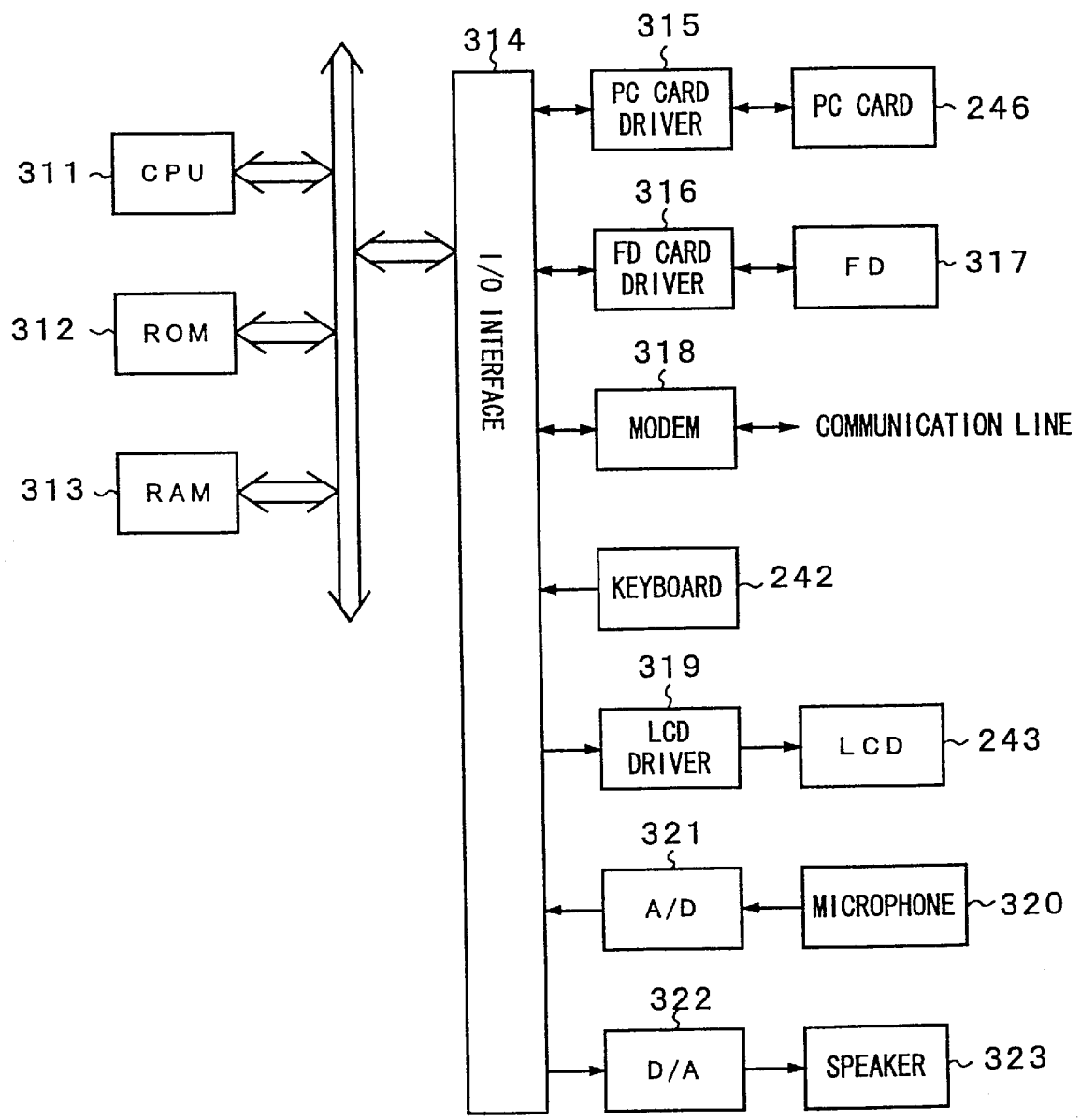
FIG. 56 is a block diagram showing an inner structure of the personal computer shown in FIG. 51.

FIG. 56 shows an inner electric structure of the personal computer 240. A CPU 311 executes various processes corresponding to a program stored in a ROM 312. When necessary, a RAM 313 stores programs and data with which the CPU 311 executes the various processes.

A keyboard 242, a PC card driver 315, an FD driver 316, and a modem 318 are connected to an I/O interface 314. The I/O interface 314 is connected to the CPU 311 through a bus. When the PC card 246 is mounted, the PC card driver 315 exchanges various data with the PC card 246. When a floppy disk (FD) 317 is inserted into a floppy disk unit, the FD driver 316 records and reproduces data to/from the floppy disk 317. The modem 318 is connected to a communication line such as a telephone line. The modem 318 receives data from the communication line, demodulates the data, and outputs the demodulated data to the CPU 311. In addition, the modem 318 modulates data supplied from the CPU 311 and outputs the modulated data to the communication line.

In addition, the I/O interface 314 is connected to an LCD driver 319 that drives an LCD 243. A sound signal received from a microphone 320 is converted from an analog signal into a digital signal by an A/D converter 321 and then supplied to the I/O interface 314. The sound data supplied from the I/O interface 314 is converted from a digital signal into an analog signal by a D/A converter 322 and then output from a speaker 323.

Next, the operation of the apparatus will be described. For example, when the user communicates with a predetermined party using the personal computer having the apparatus that functions as a TV telephone set, the user inserts the PC card 246 into the PC card unit 245, pulls out the image pickup apparatus 100 from the PC card 246, rotates the image pickup apparatus 100 for a predetermined angle, and orients the image pickup apparatus 100 so that it faces the user as shown in FIG. 54.

Next, the user operates the keyboard 242 so as to input the telephone number of the party. When the CPU 311 receives the telephone number, it controls the modem 318 through the I/O interface 314 so as to cause the modem 318 to call the telephone number.

The modem 318 calls the party corresponding to a command received from the CPU 311. When the party answers to the calling operation of the modem 318, it informs the CPU 311 that the party has answered to the calling operation.

At this point, the CPU 311 controls the PC card 246 through the PC card driver 315 so as to capture an image signal.

In the image pickup apparatus 100, after the image of the user is converted into an electric signal by the CCD bare chip 12, the electric signal is converted from an analog signal into a digital signal by the A/D converter 70 and then output to the PC card driver 315. The PC card driver 315 supplies image data that has been converted into PCMCIA standard format data to the CPU 311 through the I/O interface 314. The CPU 311 supplies the image data to the modem 318 through the I/O interface and sends the image data to the party through the communication line.

On the other hand, when image data is received from the party who has an apparatus similar to that of the user through the communication line, the modem 318 receives the image data, demodulates it, and outputs it to the CPU 311. When the CPU 311 receives the image data, the CPU 311 supplies the image data to the LCD driver 319. The LCD driver 319 causes the image data to be displayed on the LCD 243. Thus, the image of the party is displayed on the LCD 243.

A sound signal of which the user talks to the parity is collected by the microphone 320 and sent to the A/D converter 321. The A/D converter 321 converts the sound signal from an analog signal into a digital signal. The modem 318 sends the sound data to the party through the communication line under the control of the CPU 311.

On the other hand, sound data received from the party is demodulated by the modem 318. The demodulated sound data is converted from a digital signal into an analog signal by the D/A converter 322 and output from the speaker 323.

In such a manner, when the user just mounts the PC card 246 having the image pickup function to the personal computer 240, he or she can easily use them as a TV telephone set.

In the above-described embodiment, the image forming lens is composed of one lens element. However, the image forming lens may be composed of a plurality number of lens elements as shown in FIG. 47.

An image pickup apparatus according to claim 1 and a fabrication method for an image pickup apparatus according to claim 15 comprise an outer holder having at least one image forming lens for condensing light and having a diaphragm function for shielding peripheral rays of light and outer light and a substrate having a photoelectric converting device for converting the condensed light into an electric signal and for outputting an image signal, wherein the holder and the substrate are integrally formed. Thus, the size, thickness, and weight of the image pickup apparatus can be decreased. Consequently, the apparatus can be easily mounted and handled. In addition, a low pixel quantity type photoelectric converting device can be used.

In an image pickup apparatus, since the pitches of effective pixels of the photoelectric converting device are set to a value larger than 1/(200 F) of the effective image pickup region, the cost and thickness thereof can be decreased.

Since an image pickup apparatus comprises an image forming lens for condensing light and a photoelectric converting device for converting the condensed light of the image forming lens into an electric signal and outputting an image signal, wherein part of the image forming lens directly contacts the photoelectric converting device, the same effect as claim 1 can be accomplished. In addition, no optical adjustment between the image forming lens and the photoelectric converting device is required.

In an image pickup apparatus, the photoelectric converting device and the A/D converter are housed in a package. Thus, the same effect as claim 1 can be accomplished. In addition, a small image pickup apparatus that outputs digital image data can be accomplished.

In a signal processing apparatus and a signal processing method, when digital image data is converted from an analog image signal that is output from a charge coupled device and the analog image data is converted into the digital image signal corresponding to a clock signal with the half period of the analog image signal, the image data is delayed for one clock period. The difference between the image data and image data being delayed is calculated. Every second data of the difference is output from the calculation means. Thus, a noise component contained in the image signal that is output from the charge coupled device can be decreased.

In an image pickup adaptor apparatus, since an image pickup unit of which a holder and a substrate are integrally formed is housed in a housing, the size, thickness, weight, and cost of the apparatus can be decreased.

In an information processing apparatus and an information processing method, since an image signal is captured from an image pickup unit of a image pickup adapter unit and processed, the image signal can be transmitted at any location.

What is claimed is:

1. An image pickup apparatus, comprising:
   an outer holder having at least one image forming lens for condensing light and having a hole acting as a fixed iris that performs a diaphragm function to shield said image forming lens from peripheral rays of light and outer light; and
   a substrate having a photoelectric converting device for converting the condensed light into an electric signal and for outputting an image signal,
   wherein said holder and said substrate are formed as a integral unit,
   wherein an image formed plane of the photoelectric converting device is disposed in the middle of a curved image plane of the image forming lens, the image forming lens having a predetermined defocus amount at the intersection of the curved image plane and the image formed plane.

2. The apparatus as set forth in claim 1, wherein the image forming lens is disposed as part of said holder.

3. The apparatus as set forth in claim 2, wherein said holder is composed of a transparent material for the image forming lens and a light insulating material for a housing with the diaphragm effect for shielding the peripheral rays of light, the transparent material and the light insulating material being molded.

4. The apparatus as set forth in claim 1, wherein said holder and said image forming lens are spaced apart by a predetermined length.

5. The apparatus as set forth in claim 1, wherein said holder is composed by forming a light insulating film for shielding the peripheral rays of light over a transparent material for the image forming lens.

6. The apparatus as set forth in claim 1, wherein said holder is composed by forming a sheet for shielding the peripheral rays of light over a transparent material for the image forming lens.

7. The apparatus as set forth in claim 6, wherein said sheet includes an outer sheet element and an inner sheet element.

8. The apparatus as set forth in claim 1, wherein the image forming lens has a predetermined spherical aberration so that the half value width of the emitted light of the image forming lens against a point light source over the photoelectric converting device is larger than the pitches of pixels of the photoelectric converting device, and wherein the photoelectric converting device is disposed at a position spaced apart from the in-focus position of the image forming lens by a predetermined length.

9. The apparatus as set forth in claim 1, wherein the image forming lens has a discontinuous plane on the center line thereof.

10. The apparatus as set forth in claim 9, wherein the image forming lens comprises an upper portion and a lower portion delineated by the center line, said upper portion being rotated horizontally from said lower portion to form said discontinuous plane.

11. The apparatus as set forth in claim 1, wherein the photoelectric converting device is a bare chip device.

12. The apparatus as set forth in claim 1, wherein the photoelectric converting device is disposed on said substrate on the side opposite to the side having the image forming lens.

13. The apparatus as set forth in claim 1, wherein the focal length of the image forming lens is 5 mm or less, wherein the diagonal length of the photoelectric converting device is 4 mm or less, and wherein the thickness from an edge on a light incident side of light of the image forming lens to an edge on the opposite side thereof is 9 mm or less.

14. The apparatus as set forth in claim 1, wherein said holder and the image forming lens are composed of synthetic resin, wherein said holder has leg portions for defining the distance between the image forming lens and the photoelectric converting device, and wherein the difference of the change of the focal length of the image forming lens against a temperature change at a normal temperature and the change of the length of the leg portions is within the depth of focal point of the image forming lens.

15. The apparatus as set forth in claim 1, wherein the image forming lens is composed of one lens element, the focal length f thereof being set so that the following relation is satisfied $$A \times Lhc < f < B \times Lhc$$

where Lh is the length of the longer side of the image pickup plane of the photoelectric converting device, and A, B, and C are predetermined constants.

16. The apparatus as set forth in claim 1, wherein said holder and said image forming lens are both formed on said substrate.

17. The apparatus as set forth in claim 1, wherein said image forming lens comprises a plurality of lens elements stacked on top of each other.

18. The apparatus as set forth in claim 1, wherein said image forming lens comprises a singular lens element.

19. An image pickup apparatus, comprising:
an outer holder having at least one image forming lens for condensing light and having a diaphragm function for shielding peripheral rays of light and outer light; and
a substrate having a photoelectric converting device for converting the condensed light into an electric signal and for outputting an image signal,
wherein said holder and said substrate are integrally formed and the image forming lens has a predetermined spherical aberration so that the half value width of the emitted light of the image forming lens against a point light source over the photoelectric converting device is larger than the pitches of pixels of the photoelectric converting device, and
wherein the photoelectric converting device is disposed at a position spaced apart from the in-focus position of the image forming lens by a predetermined length.

20. An image pickup apparatus, comprising:
an outer holder having at least one image forming lens for condensing light and having a diaphragm function for shielding peripheral rays of light and outer light; and
a substrate having a photoelectric converting device for converting the condensed light into an electric signal and for outputting an image signal,
wherein said holder and said substrate are integrally formed and an image formed plane of the photoelectric converting device is disposed in the middle of a curved image plane of the image forming lens, the image forming lens having a predetermined defocus amount at the intersection of the curved image plane and the image formed plane.

21. An image pickup apparatus, comprising:
an outer holder having at least one image forming lens for condensing light and having a diaphragm function for shielding peripheral rays of light and outer light; and
a substrate having a photoelectric converting device for converting the condensed light into an electric signal and for outputting an image signal,
wherein said holder and said substrate are integrally formed and the image forming lens has a discontinuous plane on the center line thereof.

22. An image pickup apparatus, comprising:
an outer holder having at least one image forming lens for condensing light and having a diaphragm function for shielding peripheral rays of light and outer light; and a substrate having a photoelectric converting device for converting the condensed light into an electric signal and for outputting an image signal, wherein said holder and said substrate are integrally formed and the image forming lens is composed of one lens element, the focal length f thereof being set so that the following relation is satisfied $$A \times Lhc < f < B \times Lhc$$

where Lh is the length of the longer side of the image pickup plane of the photoelectric converting device, and A, B, and C are predetermined constants.

23. An image pickup apparatus, comprising:

an outer holder having at least one image forming lens for condensing light and having a hole acting as a fixed iris that performs a diaphragm function to shield said image forming lens from peripheral rays of light and outer light; and a substrate having a photoelectric converting device for converting the condensed light into an electric signal and for outputting an image signal, wherein said holder and said substrate are formed as a integral unit, wherein the image forming lens has a predetermined spherical aberration so that the half value width of the emitted light of the image forming lens against a point light source over the photoelectric converting device is larger than the pitches of pixels of the photoelectric converting device, and wherein the photoelectric converting device is disposed at a position spaced apart from the in-focus position of the image forming lens by a predetermined length.

24. An image pickup apparatus, comprising:

an outer holder having at least one image forming lens for condensing light and having a hole acting as a fixed iris that performs a diaphragm function to shield said image forming lens from peripheral rays of light and outer light; and a substrate having a photoelectric converting device for converting the condensed light into an electric signal and for outputting an image signal, wherein said holder and said substrate are formed as a integral unit, wherein the image forming lens has a discontinuous plane on the center line thereof.

25. An image pickup apparatus as described in claim 24, further comprising:

the image forming lens comprises an upper portion and a lower portion delineated by the center line, said upper portion being rotated horizontally from said lower portion to form said discontinuous plane.

26. An image pickup apparatus, comprising:

an outer holder having at least one image forming lens for condensing light and having a hole acting as a fixed iris that performs a diaphragm function to shield said image forming lens from peripheral rays of light and outer light; and a substrate having a photoelectric converting device for converting the condensed light into an electric signal and for outputting an image signal, wherein said holder and said substrate are formed as a integral unit, wherein the image forming lens is composed of one lens element, the focal length f thereof being set so that the following relation is satisfied $$A \times Lhc < f < B \times Lhc$$

where Lh is the length of the longer side of the image pickup plane of the photoelectric converting device, and A, B, and C are predetermined constants.

* * * * *